(12) United States Patent
Lin

(10) Patent No.: US 9,786,623 B2
(45) Date of Patent: Oct. 10, 2017

(54) SEMICONDUCTOR DEVICE AND METHOD OF FORMING POP SEMICONDUCTOR DEVICE WITH RDL OVER TOP PACKAGE

(71) Applicant: STATS ChipPAC, Ltd., Singapore (SG)

(72) Inventor: Yaojian Lin, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 14/660,840

(22) Filed: Mar. 17, 2015

(65) Prior Publication Data

US 2016/0276307 A1    Sep. 22, 2016

(51) Int. Cl.
*H01L 25/065* (2006.01)
*H01L 25/00* (2006.01)
(Continued)

(52) U.S. Cl.
CPC ............ *H01L 24/17* (2013.01); *H01L 21/561* (2013.01); *H01L 21/568* (2013.01); *H01L 23/13* (2013.01); *H01L 23/3135* (2013.01); *H01L 23/36* (2013.01); *H01L 23/3737* (2013.01); *H01L 23/49822* (2013.01); *H01L 23/49827* (2013.01); *H01L 23/5389* (2013.01); *H01L 23/552* (2013.01); *H01L 23/562* (2013.01); *H01L 24/96* (2013.01); *H01L 24/97* (2013.01); *H01L 25/105* (2013.01); *H01L 25/16* (2013.01); *H01L 25/50* (2013.01); *H01L 22/14* (2013.01); *H01L 23/49816* (2013.01); *H01L 25/0657* (2013.01); *H01L 2224/0401* (2013.01); *H01L 2224/04042* (2013.01); *H01L 2224/04105* (2013.01);
(Continued)

(58) Field of Classification Search
CPC ......... H01L 23/00; H01L 23/16; H01L 23/31; H01L 23/367; H01L 23/522; H01L 25/00; H01L 25/065
See application file for complete search history.

(56) References Cited

U.S. PATENT DOCUMENTS 5,773,884 A    6/1998 Andros et al.
6,569,712 B2    5/2003 Ho et al.
(Continued)

*Primary Examiner* — Peniel M Gumedzoe
(74) *Attorney, Agent, or Firm* — Robert D. Atkins; Patent Law Group: Atkins and Associates, P.C.

(57) ABSTRACT

A PoP semiconductor device has a top semiconductor package disposed over a bottom semiconductor package. The top semiconductor package has a substrate and a first semiconductor die disposed over the substrate. First and second encapsulants are deposited over the first semiconductor die and substrate. A first build-up interconnect structure is formed over the substrate after depositing the second encapsulant. The top package is disposed over the bottom package. The bottom package has a second semiconductor die and modular interconnect units disposed around the second semiconductor die. A second build-up interconnect structure is formed over the second semiconductor die and modular interconnect unit. The modular interconnect units include a plurality of conductive vias and a plurality of contact pads electrically connected to the conductive vias. The I/O pattern of the build-up interconnect structure on the top semiconductor package is designed to coincide with the I/O pattern of the modular interconnect units.

25 Claims, 42 Drawing Sheets

(51) Int. Cl.
*H01L 25/16* (2006.01)
*H01L 21/56* (2006.01)
*H01L 21/66* (2006.01)
*H01L 21/768* (2006.01)
*H01L 23/31* (2006.01)
*H01L 23/367* (2006.01)
*H01L 23/00* (2006.01)
*H01L 23/522* (2006.01)
*H01L 23/552* (2006.01)
*H01L 25/10* (2006.01)
*H01L 23/36* (2006.01)
*H01L 23/538* (2006.01)
*H01L 23/13* (2006.01)
*H01L 23/373* (2006.01)
*H01L 23/498* (2006.01)

(52) U.S. Cl.
CPC ............ *H01L 2224/12105* (2013.01); *H01L 2224/13022* (2013.01); *H01L 2224/16227* (2013.01); *H01L 2224/16235* (2013.01); *H01L 2224/17515* (2013.01); *H01L 2224/32145* (2013.01); *H01L 2224/48091* (2013.01); *H01L 2224/48227* (2013.01); *H01L 2224/73253* (2013.01); *H01L 2224/73265* (2013.01); *H01L 2224/94* (2013.01); *H01L 2224/97* (2013.01); *H01L 2225/0651* (2013.01); *H01L 2225/06517* (2013.01); *H01L 2225/06558* (2013.01); *H01L 2225/1035* (2013.01); *H01L 2225/1041* (2013.01); *H01L 2225/1058* (2013.01); *H01L 2924/00014* (2013.01); *H01L 2924/141* (2013.01); *H01L 2924/143* (2013.01); *H01L 2924/1421* (2013.01); *H01L 2924/1433* (2013.01); *H01L 2924/1461* (2013.01); *H01L 2924/14335* (2013.01); *H01L 2924/15192* (2013.01); *H01L 2924/15311* (2013.01); *H01L 2924/181* (2013.01); *H01L 2924/19105* (2013.01); *H01L 2924/3511* (2013.01)

(56) References Cited

U.S. PATENT DOCUMENTS

| | | | |
|---|---|---|---|
| 6,680,529 B2 | 1/2004 | Chen et al. | |
| 6,818,978 B1 | 11/2004 | Fan | |
| 7,235,431 B2 | 6/2007 | Wood et al. | |
| 7,239,014 B2 | 7/2007 | Ogawa et al. | |
| 7,545,047 B2 | 6/2009 | Bauer et al. | |
| 7,648,911 B2 | 1/2010 | Pagaila et al. | |
| 7,659,145 B2 | 2/2010 | Do et al. | |
| 7,838,337 B2 | 11/2010 | Marimuthu et al. | |
| 7,859,085 B2 | 12/2010 | Pagaila et al. | |
| 7,948,095 B2 | 5/2011 | Ng et al. | |
| 8,105,875 B1 | 1/2012 | Hu et al. | |
| 8,138,609 B2 | 3/2012 | Horiuchi et al. | |
| 8,237,278 B2 | 8/2012 | Gluschenkov et al. | |
| 8,263,439 B2 | 9/2012 | Marimuthu et al. | |
| 8,421,202 B2 | 4/2013 | Shim et al. | |
| 8,592,992 B2 | 11/2013 | Lin et al. | |
| 8,659,162 B2 | 2/2014 | Suthiwongsunthorn et al. | |
| 2004/0070083 A1* | 4/2004 | Su | H01L 25/0657 257/778 |
| 2006/0194373 A1 | 8/2006 | Fee et al. | |
| 2006/0261472 A1* | 11/2006 | Kimura | H01L 24/97 257/724 |
| 2007/0190690 A1 | 8/2007 | Chow et al. | |
| 2009/0127686 A1 | 5/2009 | Yang et al. | |
| 2009/0146315 A1 | 6/2009 | Shim et al. | |
| 2009/0166825 A1* | 7/2009 | Camacho | H01L 23/3128 257/676 |
| 2009/0206461 A1* | 8/2009 | Yoon | H01L 21/565 257/686 |
| 2010/0006330 A1 | 1/2010 | Fu et al. | |
| 2010/0109169 A1 | 5/2010 | Kolan et al. | |
| 2010/0133704 A1 | 6/2010 | Marimuthu et al. | |
| 2010/0221873 A1 | 9/2010 | Marimuthu et al. | |
| 2010/0244219 A1* | 9/2010 | Pagaila | H01L 21/568 257/686 |
| 2011/0012266 A1 | 1/2011 | Horiuchi et al. | |
| 2011/0068459 A1 | 3/2011 | Pagaila et al. | |
| 2011/0068481 A1* | 3/2011 | Park | H01L 23/3128 257/777 |
| 2011/0101512 A1* | 5/2011 | Choi | H01L 23/49816 257/686 |
| 2011/0217812 A1 | 9/2011 | Hedler et al. | |
| 2011/0278707 A1 | 11/2011 | Chi et al. | |
| 2011/0278736 A1 | 11/2011 | Lin et al. | |
| 2012/0074585 A1 | 3/2012 | Koo et al. | |
| 2012/0074587 A1 | 3/2012 | Koo et al. | |
| 2012/0139090 A1* | 6/2012 | Kim | H01L 25/16 257/659 |
| 2013/0062760 A1 | 3/2013 | Hung et al. | |
| 2013/0075936 A1 | 3/2013 | Lin et al. | |
| 2013/0154108 A1 | 6/2013 | Lin et al. | |
| 2013/0228917 A1 | 9/2013 | Yoon et al. | |
| 2013/0249106 A1 | 9/2013 | Lin et al. | |
| 2014/0048906 A1 | 2/2014 | Shim et al. | |
| 2015/0001708 A1 | 1/2015 | Lin | |

* cited by examiner

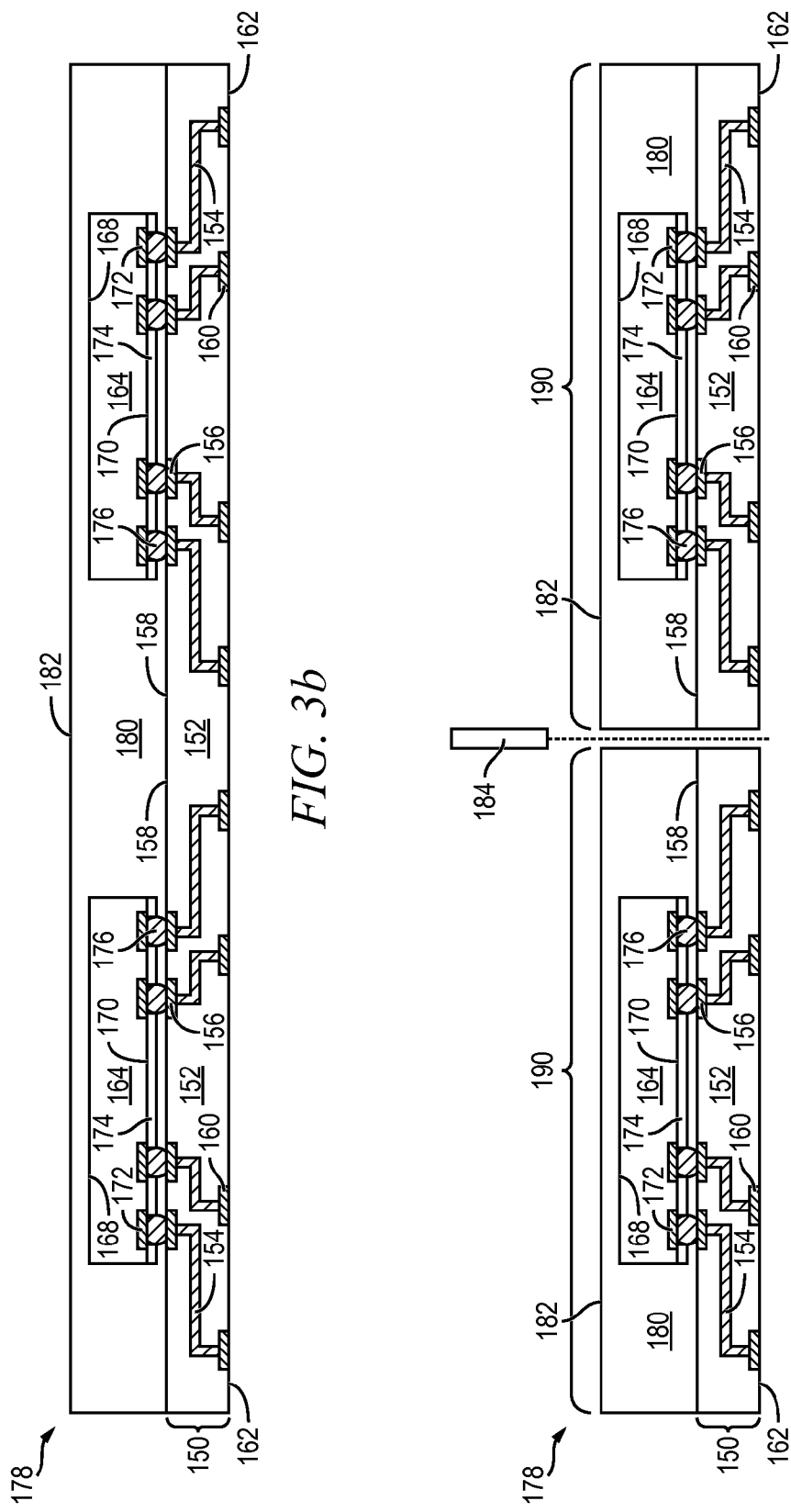

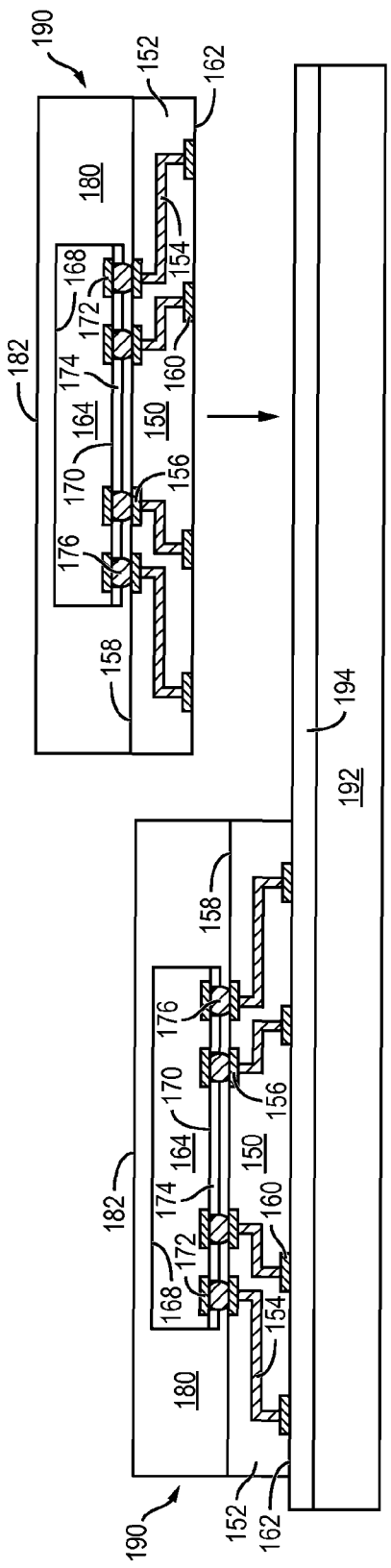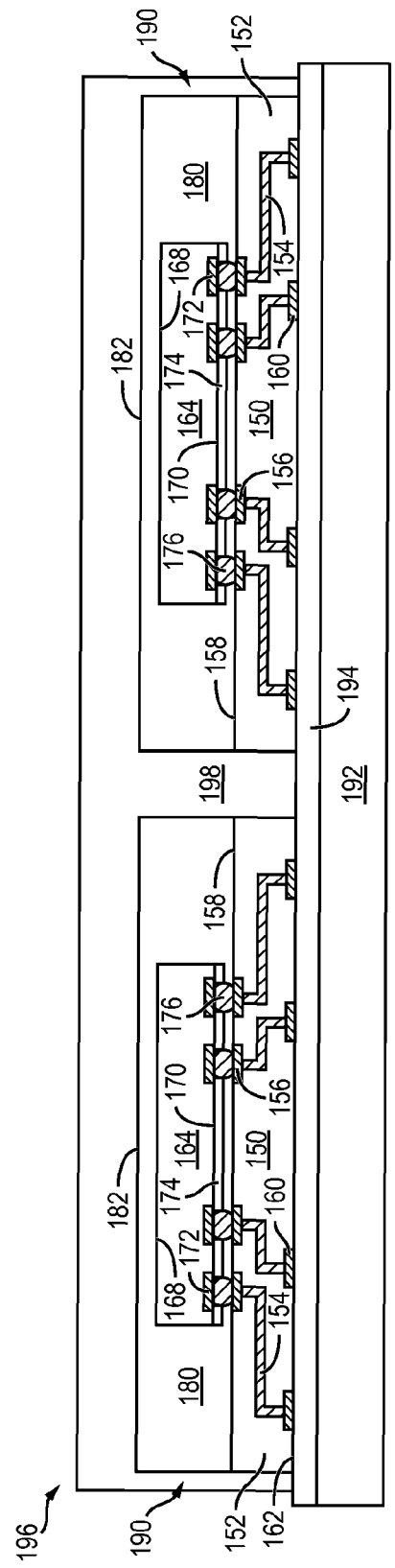

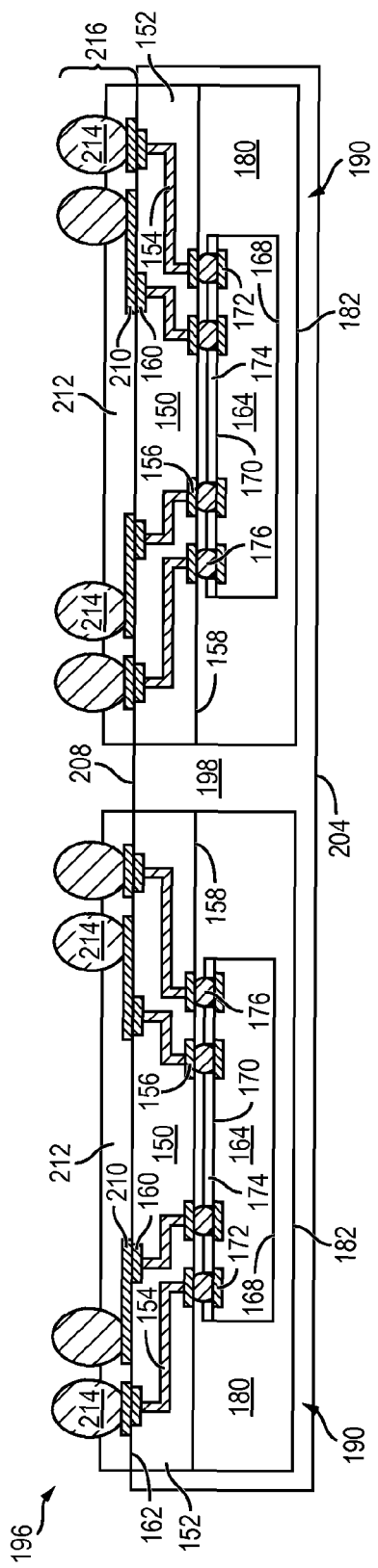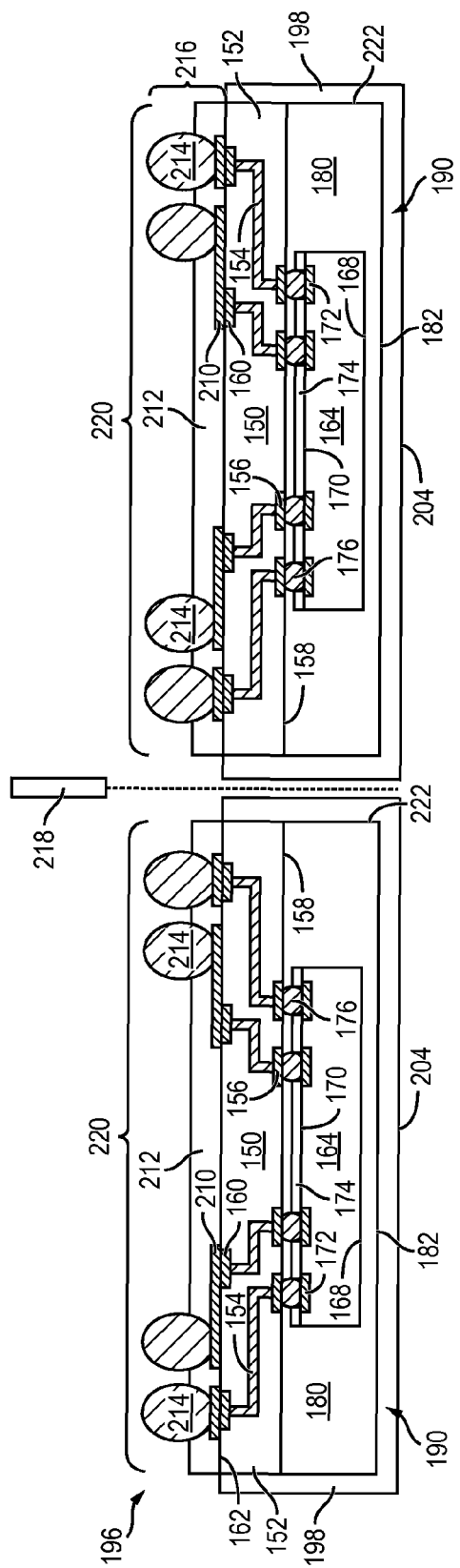

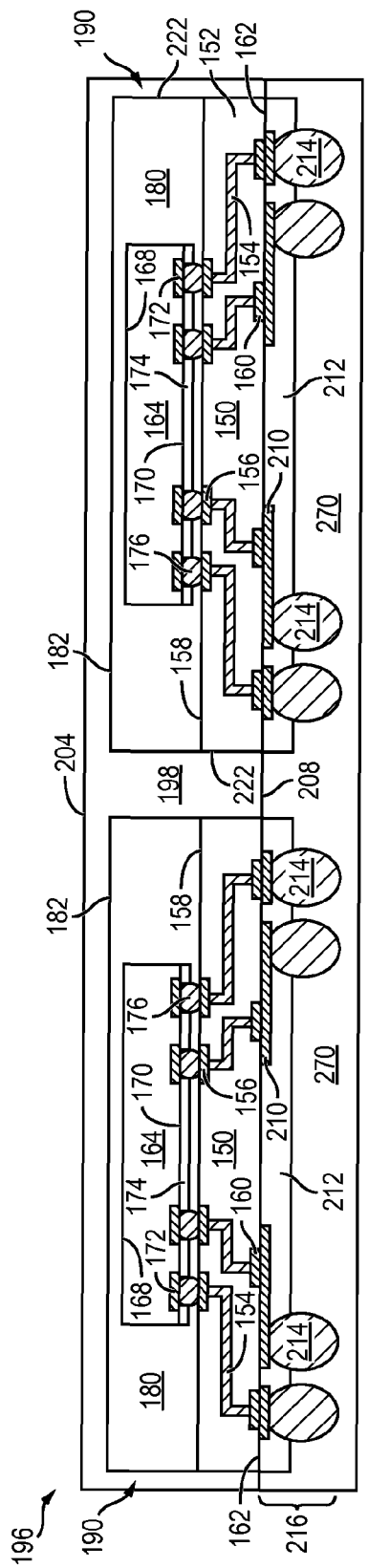
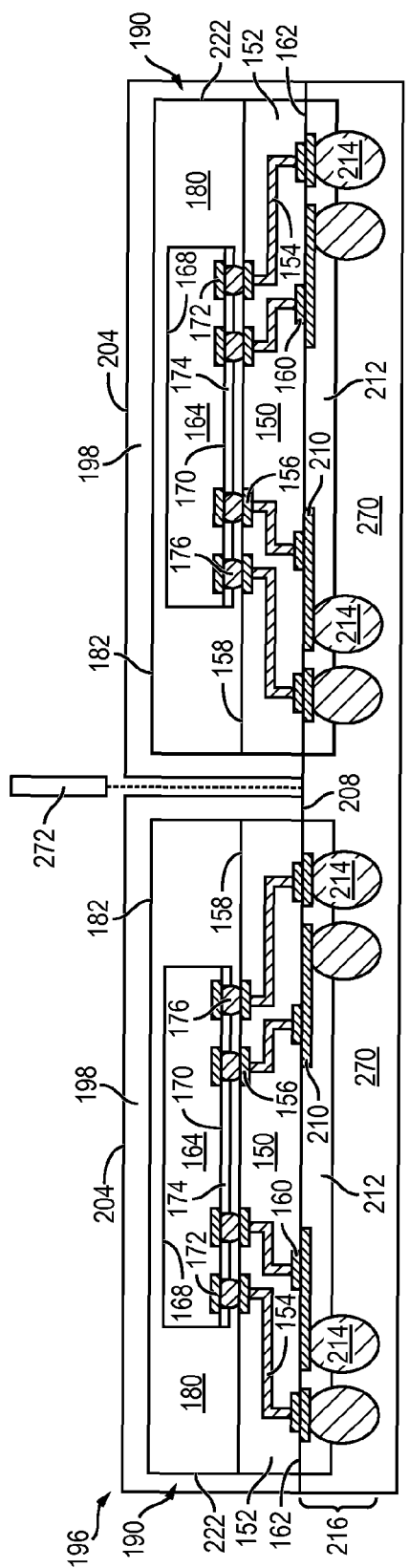
FIG. 6a
FIG. 6b

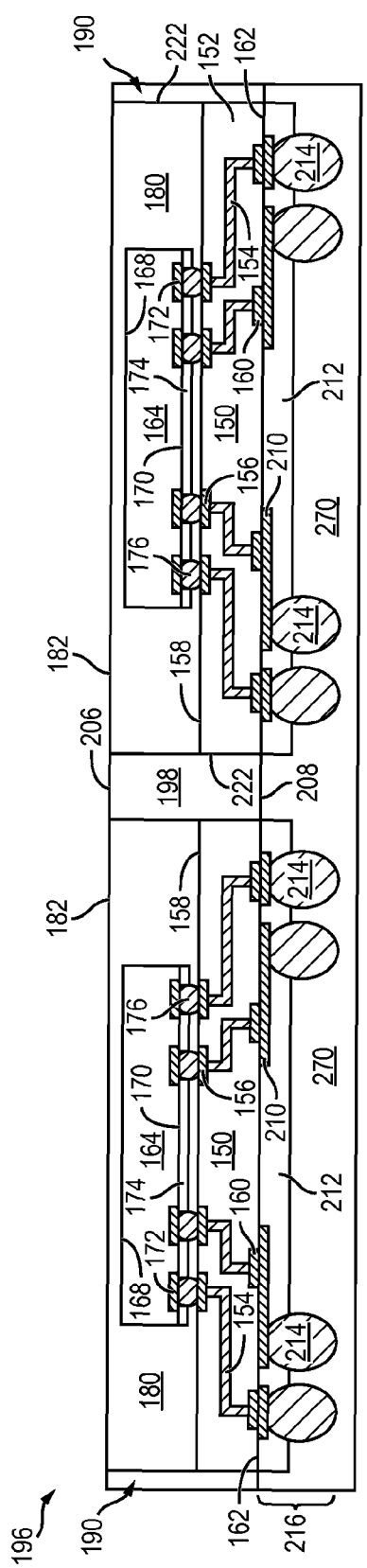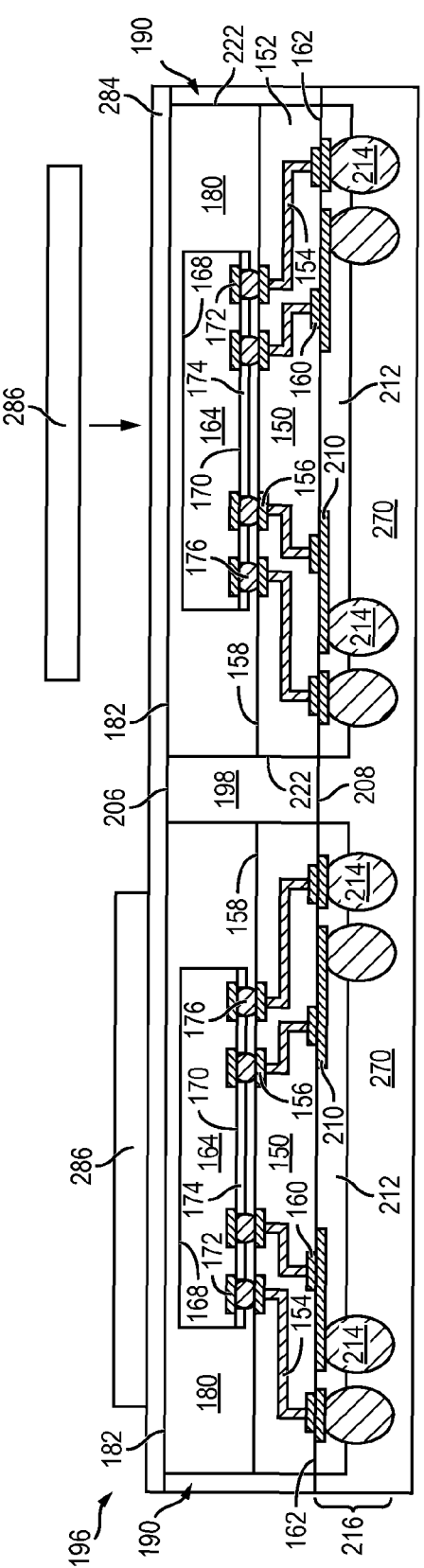
FIG. 8a
FIG. 8b

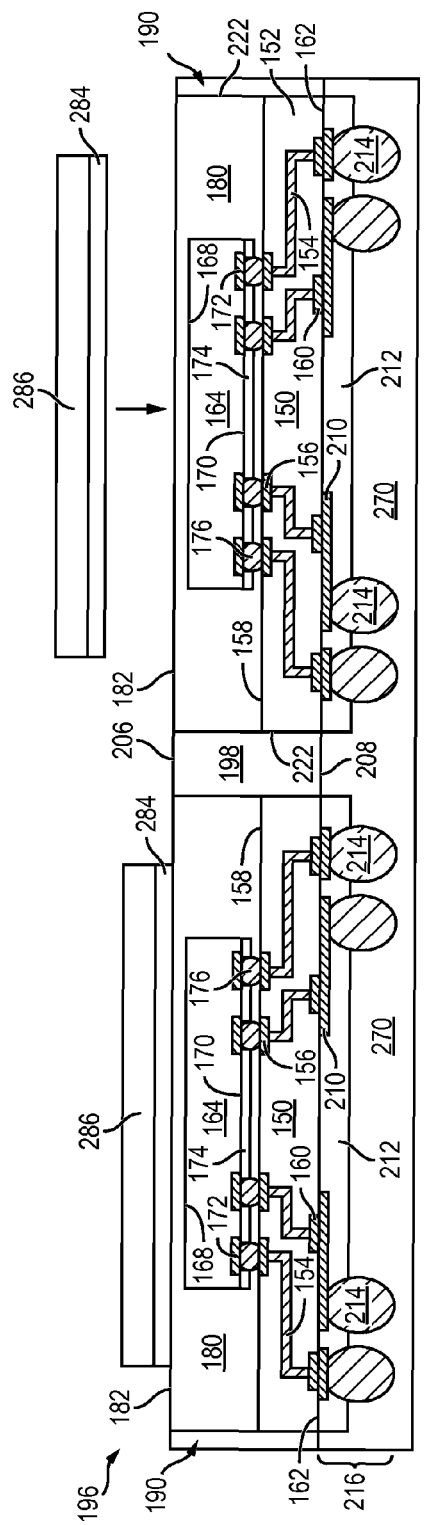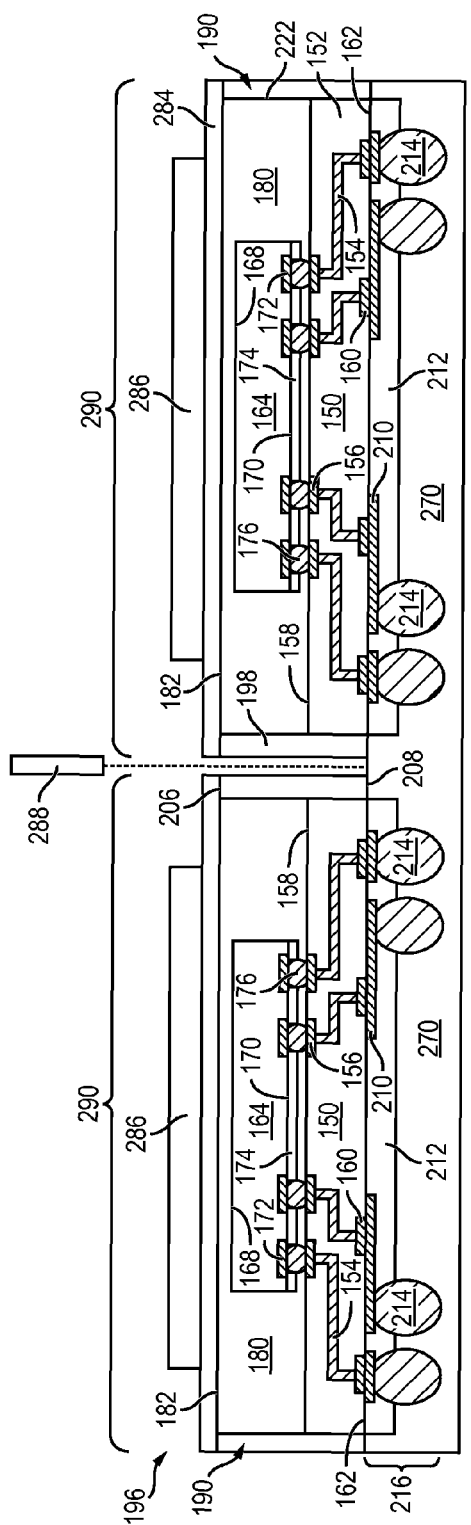
FIG. 8c
FIG. 8d

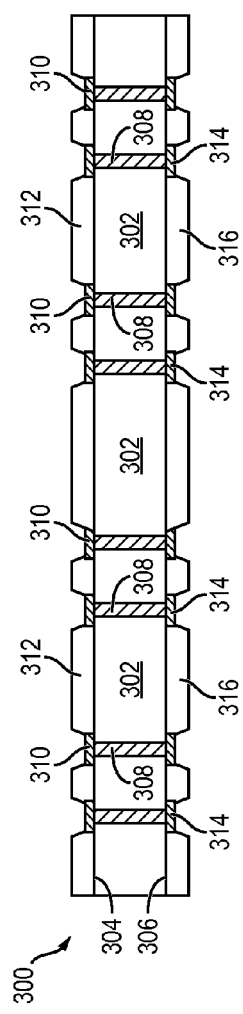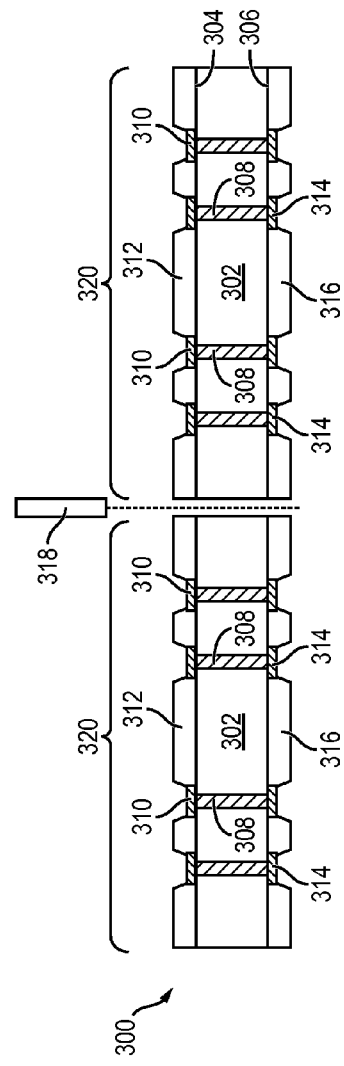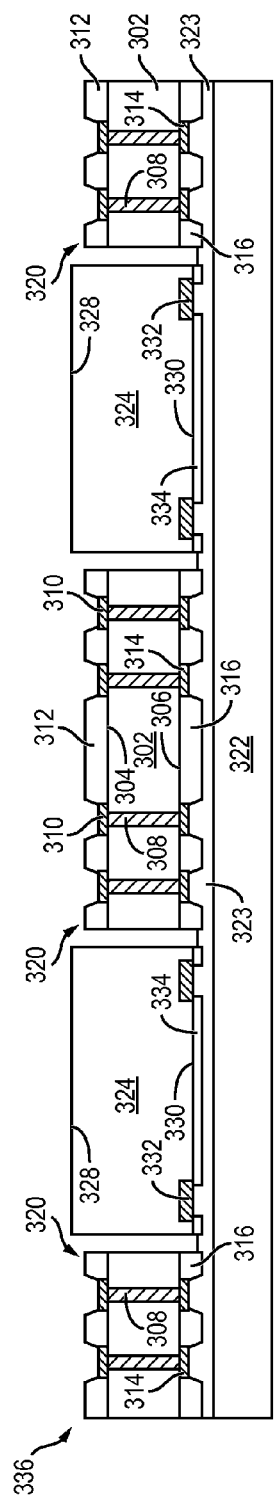

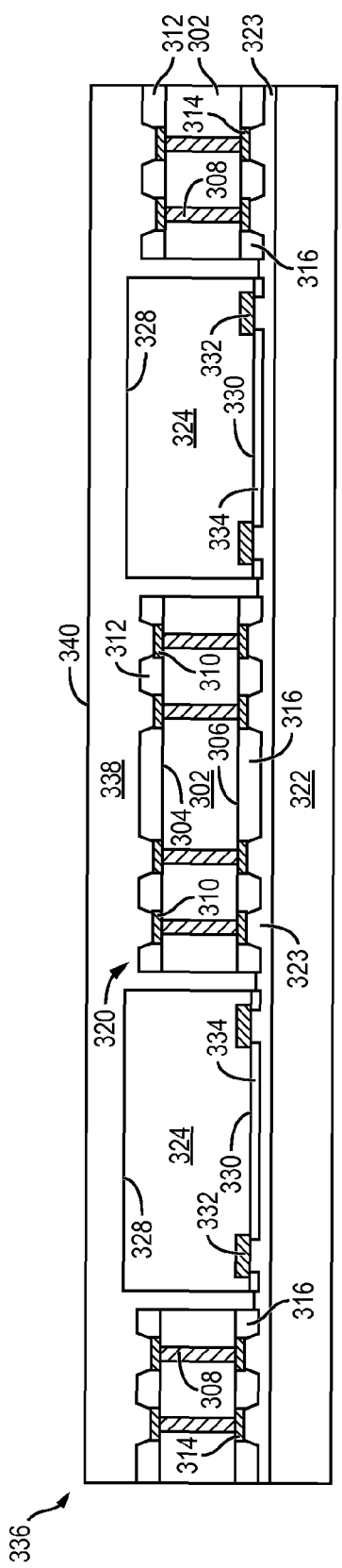
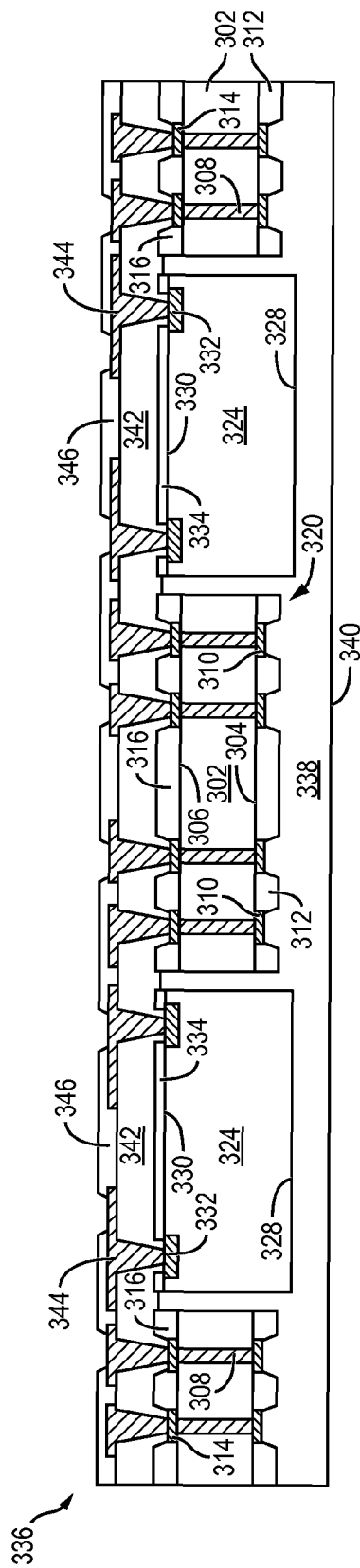
FIG. 11c
FIG. 11d

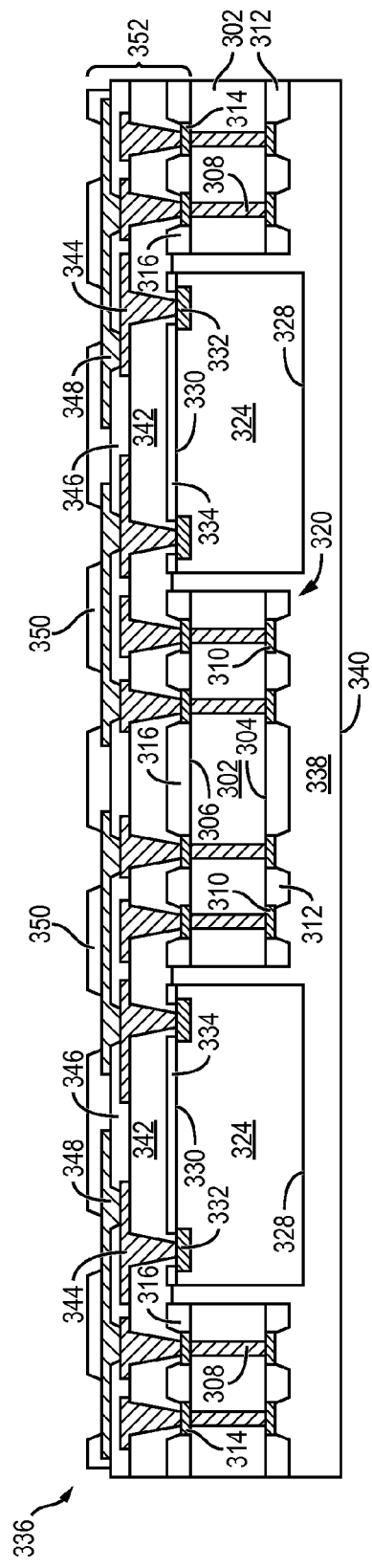
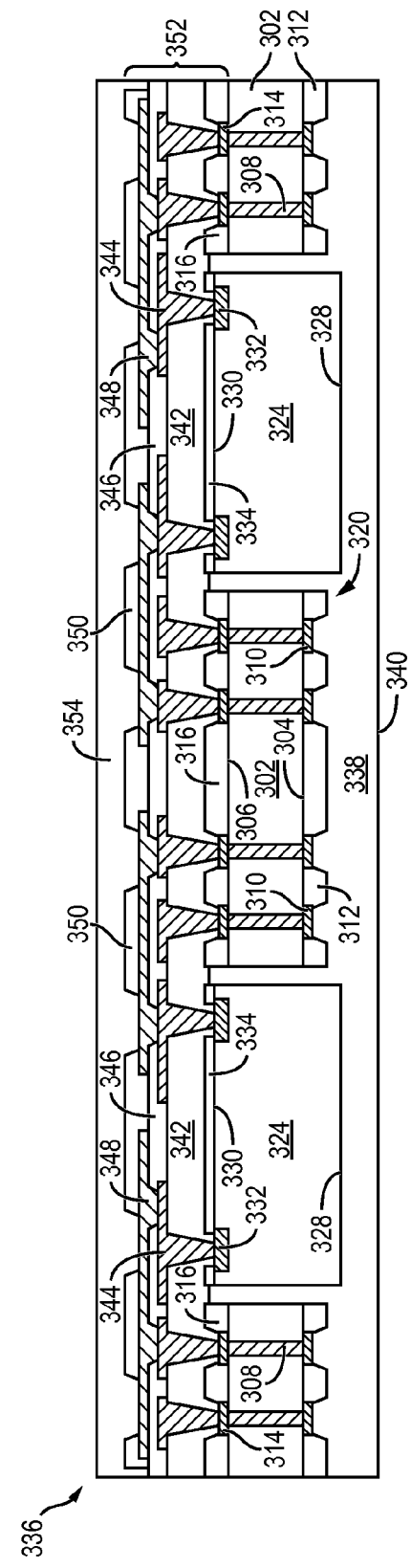

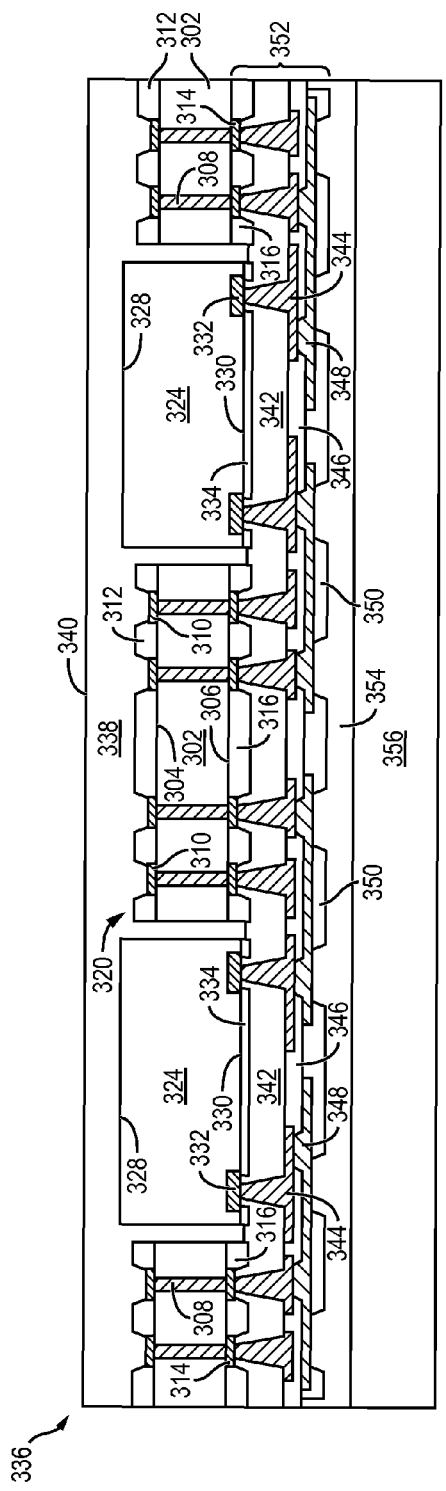
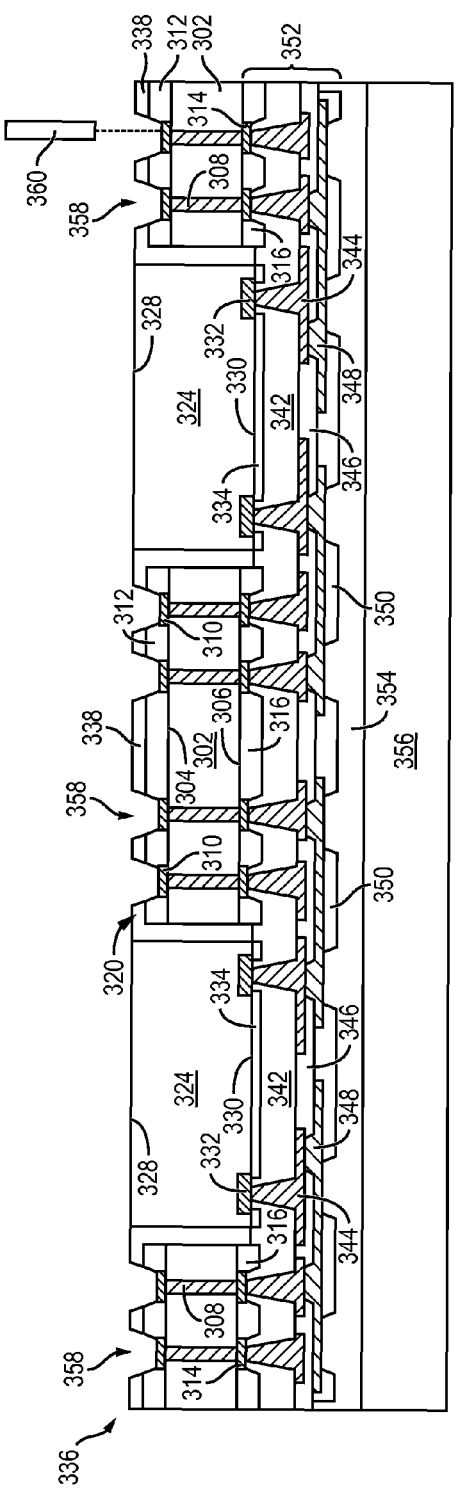
FIG. 11g
FIG. 11h

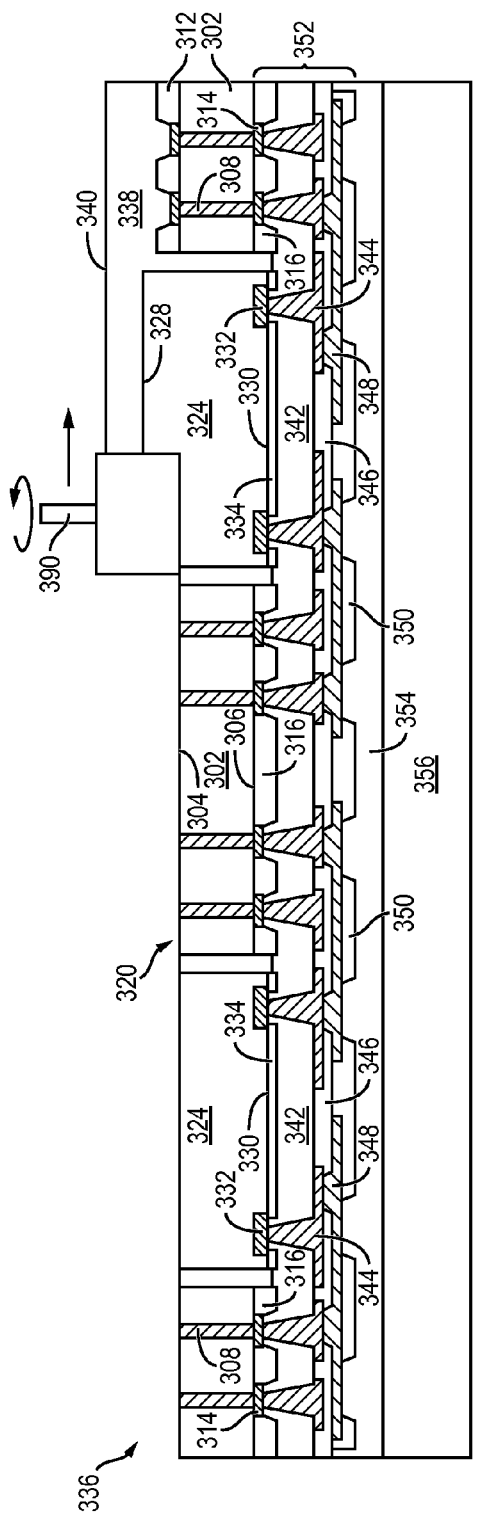
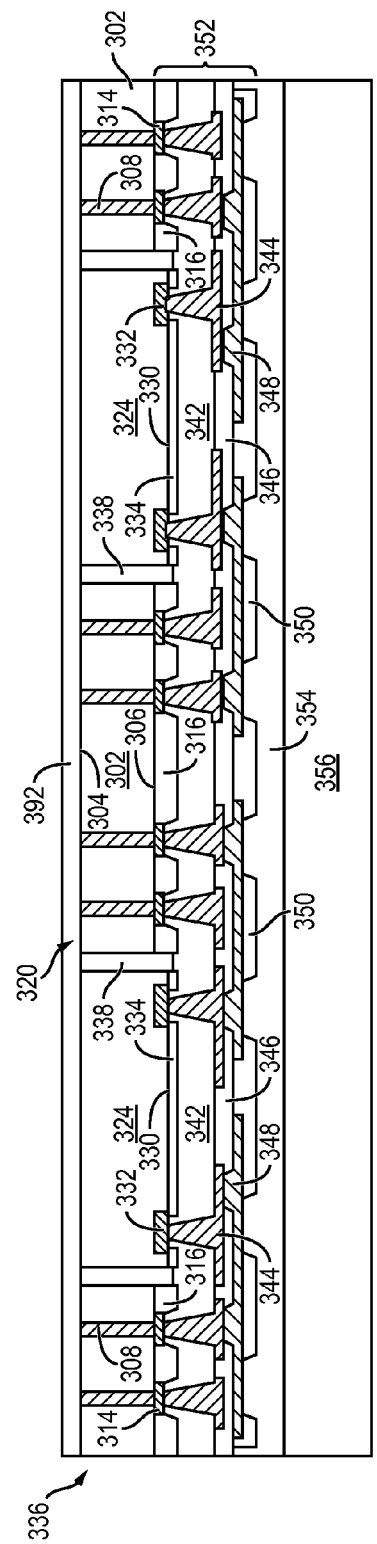
FIG. 14a
FIG. 14b

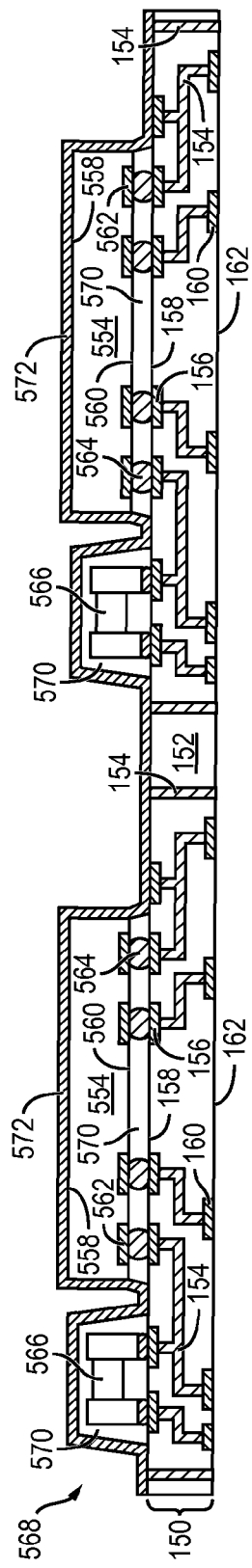
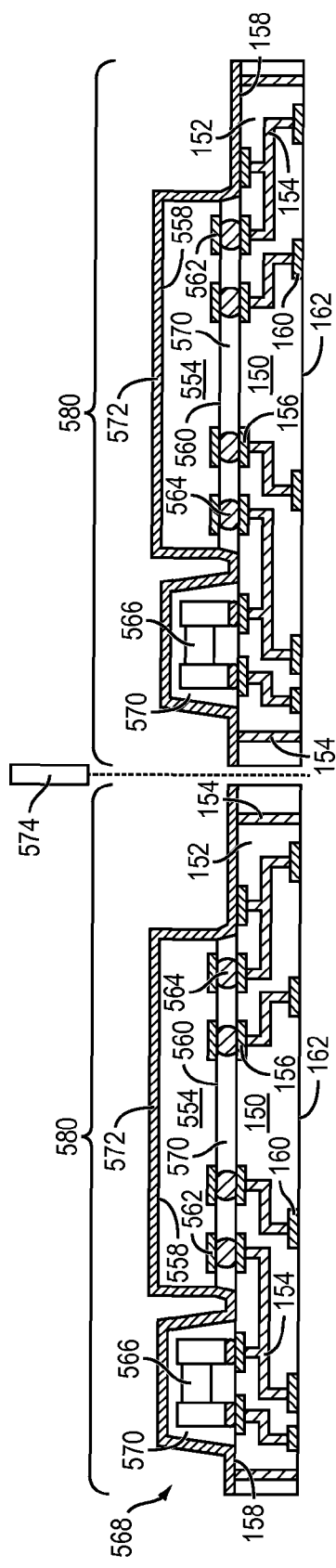
FIG. 20a
FIG. 20b

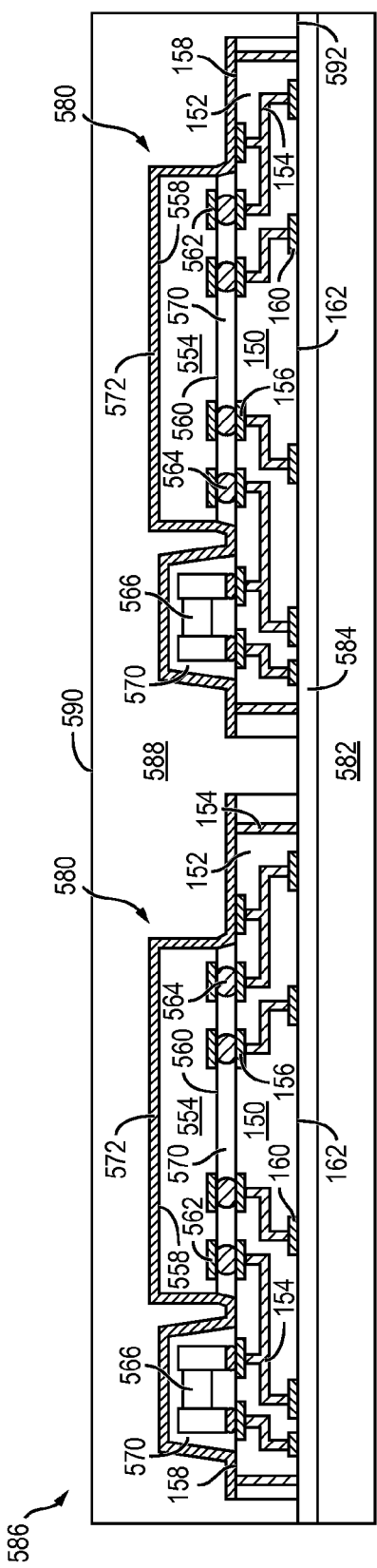
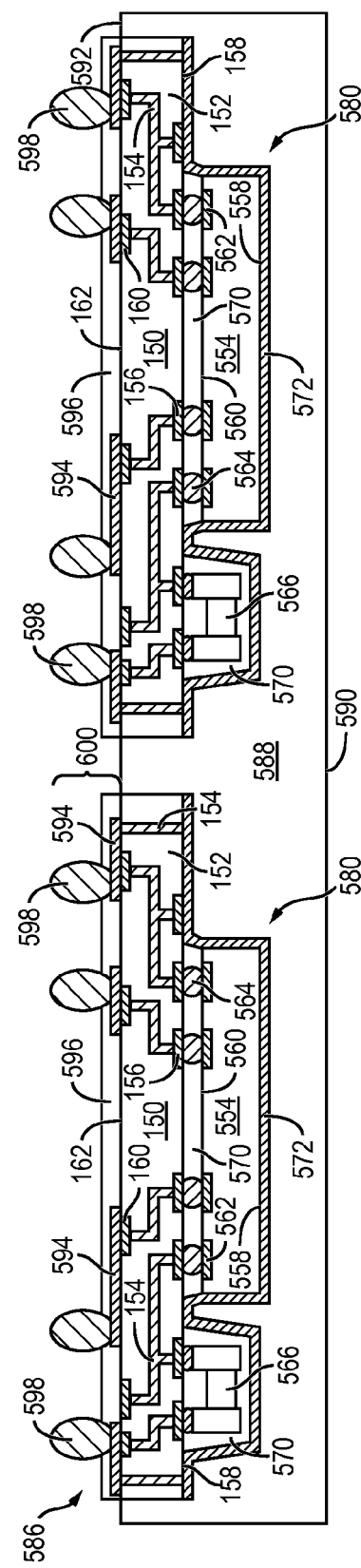
FIG. 20c
FIG. 20d

9,786,623 B2

SEMICONDUCTOR DEVICE AND METHOD OF FORMING POP SEMICONDUCTOR DEVICE WITH RDL OVER TOP PACKAGE

FIELD OF THE INVENTION

The present invention relates in general to semiconductor devices and, more particularly, to a semiconductor device and method of forming a package-on-package (PoP) semiconductor device having a redistribution layer (RDL) formed over the top semiconductor package.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, and various signal processing circuits.

Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows the material's electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support, electrical interconnect, and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

The manufacturing of smaller semiconductor devices relies on implementing improvements to horizontal and vertical electrical interconnection between multiple semiconductor devices on multiple levels, i.e., three dimensional (3-D) device integration. A reduced package profile is of particular importance for packaging in the cellular or smart phone industry. One approach to achieving the objectives of greater integration and smaller semiconductor devices is to focus on 3-D packaging technologies including PoP semiconductor devices.

To form electrical interconnections between a top semiconductor package and bottom semiconductor package in a PoP device, the input/output (I/O) layout and density on the front side, i.e., bottom, of the top package needs to match the I/O layout and density on the backside, i.e., top, of the bottom package. Matching the I/O densities of the top and bottom packages can be accomplished by forming redistribution layers (RDLs) within a build-up interconnect structure over the backside of the bottom package. However, forming RDLs over both the front side of the bottom package for connection to external devices, e.g., a printed circuit board (PCB), and over the backside of the bottom package for connection to the top package can be a slow and costly approach for making electrical interconnection between the stacked semiconductor packages and can result in higher fabrication costs. The electrical interconnection between the top semiconductor package and bottom semiconductor package can also be accomplished by disposing an interposer between the top and bottom packages. However, disposing an interposer between the top and bottom packages increases a height of the PoP semiconductor device and results in a thicker overall semiconductor package.

SUMMARY OF THE INVENTION

A need exists for a cost effective PoP semiconductor device having a thin profile. Accordingly, in one embodiment, the present invention is a method of making a semiconductor device comprising the steps of providing a substrate, disposing a first semiconductor die over the substrate, forming a first interconnect structure over the substrate opposite the first semiconductor die, and disposing the substrate and first interconnect structure over a first surface of a second semiconductor die.

In another embodiment, the present invention is a method of making a semiconductor device comprising the steps of providing a semiconductor package including a first semiconductor die, forming an interconnect structure over the semiconductor package, and disposing the semiconductor package over a second semiconductor die.

In another embodiment, the present invention is a semiconductor device comprising a semiconductor package including a first semiconductor die. A first interconnect structure is formed over the semiconductor package. A second semiconductor die is disposed over the interconnect structure opposite the first semiconductor die.

In another embodiment, the present invention is a semiconductor device comprising a semiconductor package and an interconnect structure formed over the semiconductor package. A first semiconductor die is disposed over the interconnect structure.

BRIEF DESCRIPTION OF THE DRAWINGS

FIGS. 3a-3i illustrate a method of forming an RDL over a semiconductor package for integration into a PoP semiconductor device;

FIGS. 6a-6c illustrate a method of forming an RDL and shielding layer over a semiconductor package for integration into a PoP semiconductor device;

FIGS. 8a-8d illustrate a method of forming an RDL and heat spreader over a semiconductor package for integration into a PoP semiconductor device;

FIGS. 10a-10b illustrate a method of forming modular interconnect units having vertical interconnect structures for integration into a PoP semiconductor device;

FIGS. 11a-11l illustrate a method of forming a PoP semiconductor device having an RDL formed over the top semiconductor package;

FIGS. 14a-14f illustrate a method of forming a PoP semiconductor device having a warpage balance layer formed over the bottom semiconductor package;

FIGS. 20a-20h illustrate a method of forming a PoP semiconductor device having a shielding layer formed over the semiconductor components within the top semiconductor package.

DETAILED DESCRIPTION OF THE DRAWINGS

Figure 1:
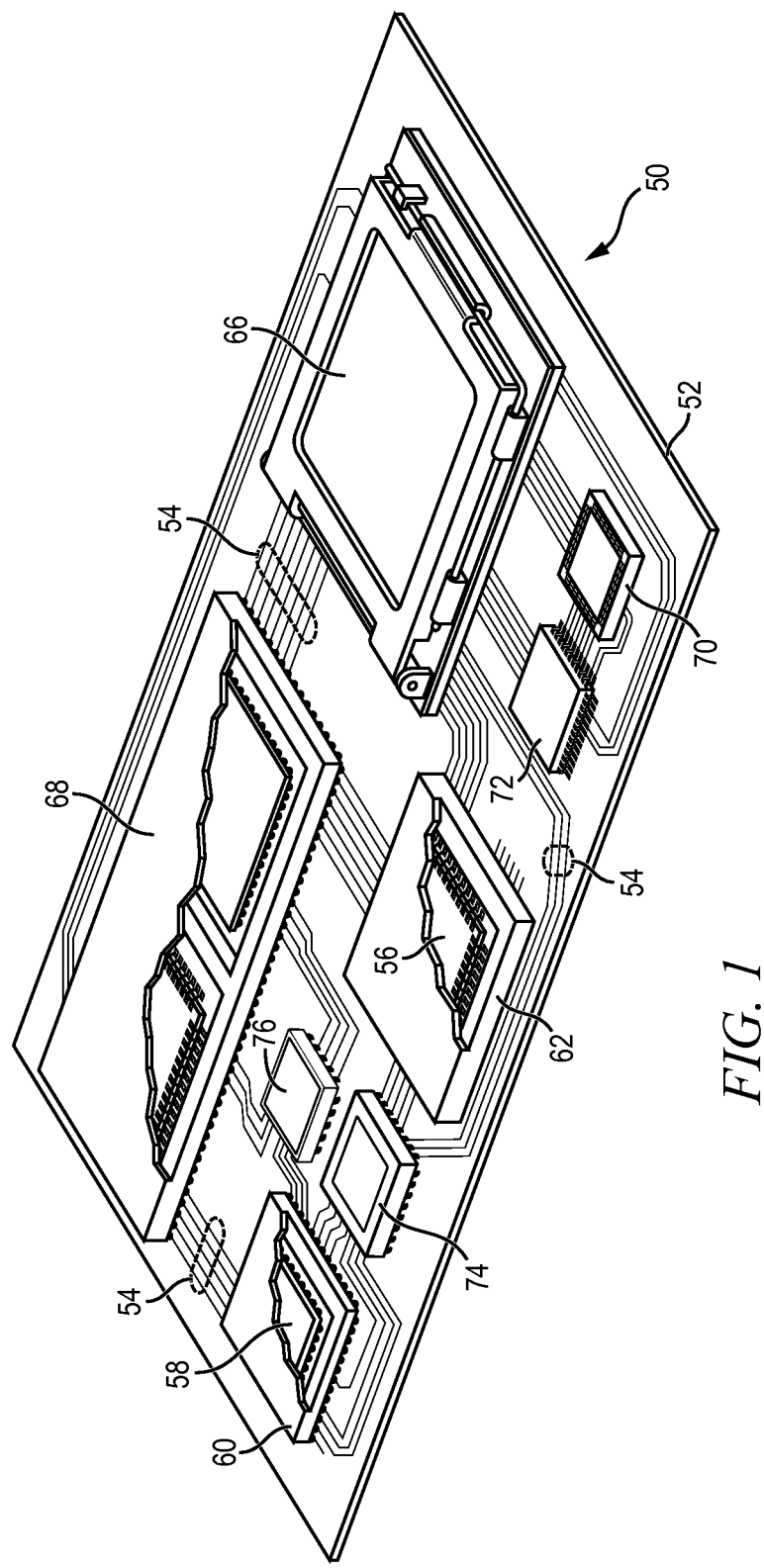
FIG. 1 illustrates a PCB with different types of packages mounted to a surface of the PCB.

The present invention is described in one or more embodiments in the following description with reference to the figures, in which like numerals represent the same or similar elements. While the invention is described in terms of the best mode for achieving objectives of the invention, those skilled in the art will appreciate that the disclosure is intended to cover alternatives, modifications, and equivalents as may be included within the spirit and scope of the invention as defined by the appended claims and claims' equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on a surface of PCB 52. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a tablet, cellular phone, digital camera, or other electronic device. Alternatively, electronic device 50 can be a graphics card, network interface card, or other signal processing card that can be inserted into a computer. The semiconductor package can include microprocessors, memories, application specific integrated circuits (ASIC), microelectromechanical systems (MEMS), logic circuits, analog circuits, radio frequency (RF) circuits, discrete devices, or other semiconductor die or electrical components. Miniaturization and weight reduction are essential for the products to be accepted by the market. The distance between semiconductor devices may be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, land grid array (LGA) 66, multi-chip module (MCM) 68, quad flat non-leaded package (QFN) 70, quad flat package 72, embedded wafer level ball grid array (eWLB) 74, and wafer level chip scale package (WLCSP) 76 are shown mounted on PCB 52. In one embodiment, eWLB 74 is a fan-out wafer level package (Fo-WLP) and WLCSP 76 is a fan-in wafer level package (Fi-WLP). Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
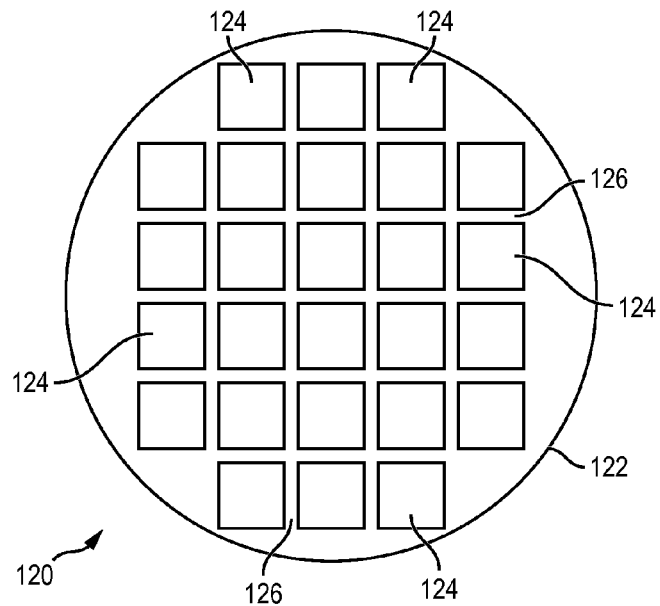
FIGS. 2a-2d illustrate a semiconductor wafer with a plurality of semiconductor die separated by a saw street.

FIG. 2a shows a semiconductor wafer 120 with a base substrate material 122, such as silicon, germanium, aluminum phosphide, aluminum arsenide, gallium arsenide, gallium nitride, indium phosphide, silicon carbide, or other bulk semiconductor material for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124. In one embodiment, semiconductor wafer 120 has a width or diameter of 100-450 millimeters (mm).

Figure 2B:
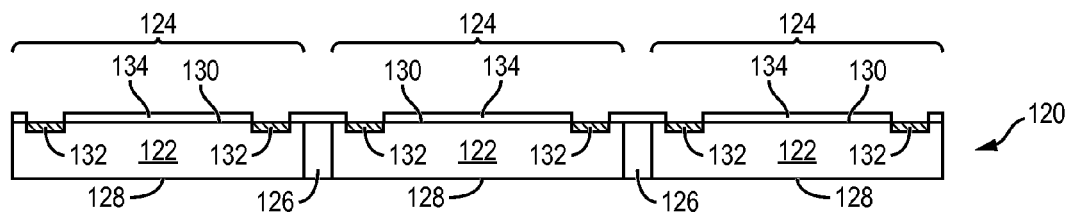

FIG. 2b shows a cross-sectional view of a portion of semiconductor wafer 120. Each semiconductor die 124 has a back or non-active surface 128 and an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, MEMS, memory, or other signal processing circuit. In one embodiment, active region 130 contains a MEMS, such as an accelerometer, gyroscope, strain gauge, microphone, or other sensor responsive to various external stimuli. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 includes one or more layers of aluminum (Al), copper (Cu), tin (Sn), nickel (Ni), gold (Au), silver (Ag), or other suitable electrically conductive material or combination thereof. Conductive layer 132 operates as contact pads electrically connected to the circuits on active surface 130. Conductive layer 132 is formed as contact pads disposed side-by-side a first distance from the edge of semiconductor die 124, as shown in FIG. 2b. Alternatively, conductive layer 132 is formed as contact pads that are offset in multiple rows such that a first row of contact pads is disposed a first distance from the edge of the die, and a second row of contact pads alternating with the first row is disposed a second distance from the edge of the die.

An insulating or passivation layer 134 is formed over active surface 130 and conductive layer 132 using PVD, CVD, printing, lamination, spin coating, spray coating, sintering, or thermal oxidation. The insulating layer 134 contains one or more layers of SiO2, Si3N4, SiON, Ta2O5, Al2O3, polyimide, PBO, epoxy or phenolic base resin, or other material having similar insulating and structural properties. A portion of insulating layer 134 is removed by LDA to expose conductive layer 132. Alternatively, a portion of insulating layer 134 is removed by an etching process through a patterned photoresist layer to expose conductive layer 132.

Semiconductor wafer 120 undergoes electrical testing and inspection as part of a quality control process. Manual visual inspection and automated optical systems are used to perform inspections on semiconductor wafer 120. Software can be used in the automated optical analysis of semiconductor wafer 120. Visual inspection methods may employ equipment such as a scanning electron microscope, high-intensity or ultra-violet light, or metallurgical microscope. Semiconductor wafer 120 is inspected for structural characteristics including warpage, thickness variation, surface particulates, irregularities, cracks, delamination, and discoloration.

Figure 2C:
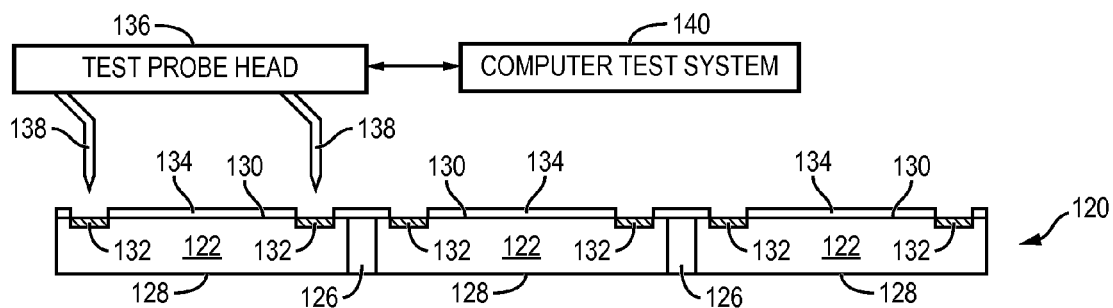

The active and passive components within semiconductor die 124 undergo testing at the wafer level for electrical performance and circuit function. Each semiconductor die 124 is tested for functionality and electrical parameters, as shown in FIG. 2c, using a test probe head 136 including a plurality of probes or test leads 138, or other testing device. Probes 138 are used to make electrical contact with nodes or conductive layer 132 on each semiconductor die 124 and provide electrical stimuli to the contact pads. Semiconductor die 124 responds to the electrical stimuli, which is measured by computer test system 140 and compared to an expected response to test functionality of the semiconductor die. The electrical tests may include circuit functionality, lead integrity, resistivity, continuity, reliability, junction depth, electro-static discharge (ESD), RF performance, drive current, threshold current, leakage current, and operational parameters specific to the component type. The inspection and electrical testing of semiconductor wafer 120 enables semiconductor die 124 that pass to be designated as known good die (KGD) for use in a semiconductor package.

Figure 2D:
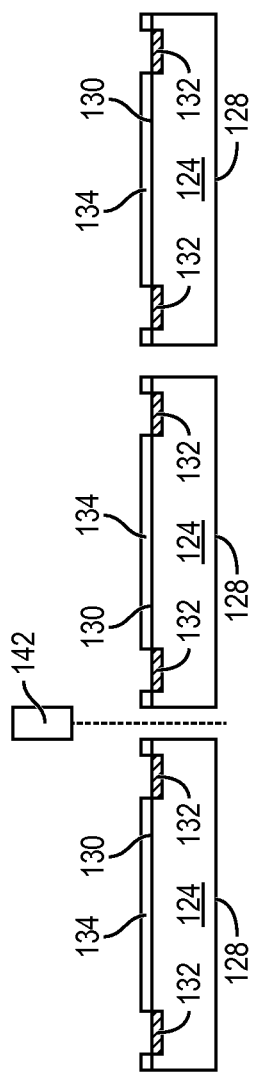

In FIG. 2d, semiconductor wafer 120 is singulated through saw street 126 using a saw blade or laser cutting tool 142 into individual semiconductor die 124. The individual semiconductor die 124 can be inspected and electrically tested for identification of KGD post singulation.

Figure 3A:
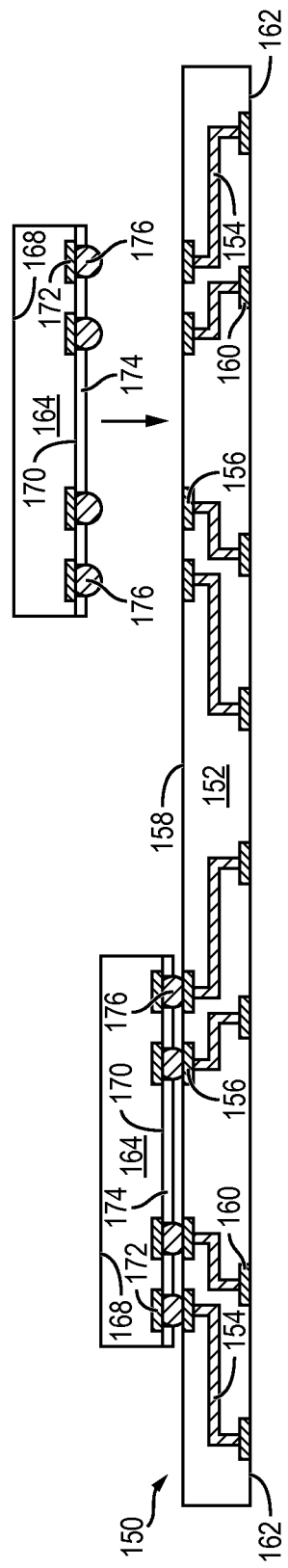

FIGS. 3a-3i illustrate, in relation to FIG. 1, a method of making a semiconductor package having an RDL for integration into a PoP semiconductor device. FIG. 3a shows a cross-sectional view of a portion of a substrate or interposer panel 150 containing insulating material 152 and conductive layers 154. Insulating material 152 can include a multilayer structure comprising an organic substrate core, prepreg, and solder mask material with resin, filler, and/or glass fiber. Conductive layers 154 can include multiple layers of metal, e.g., Cu, sandwiched or disposed between the various layers of insulating material 152. The various metal layers 154 are patterned and electrically connected according to the interconnection design and function of the semiconductor die subsequently mounted to substrate 150 and the final semiconductor package. In one embodiment, substrate 150 contains one or more laminated layers of polytetrafluoroethylene prepreg, FR-4, FR-1, CEM-1, or CEM-3 with a combination of phenolic cotton paper, epoxy, resin, woven glass, matte glass, polyester, and other reinforcement fibers or fabrics. Substrate 150 can be laminate based, thin flexible circuit based, ceramic, copper foil, glass, and may include a semiconductor wafer with an active surface containing one or more transistors, diodes, and other circuit elements to implement analog circuits or digital circuits.

Insulating material 152 is formed using PVD, CVD, printing, lamination, spin coating, spray coating, sintering, or thermal oxidation. Insulating material 152 contains one or more layers of SiO2, Si3N4, SiON, Ta2O5, Al2O3, or other material having similar insulating and structural properties. In one embodiment, one of the layers of insulating material 152 is formed using bismaleimide triazine (BT) resin with glass fiber and silica fillers and another layer of insulating material 152 at surface 158 of substrate 150 is formed using a solder mask material.

Conductive layers 154 of substrate 150 are formed using a patterning and metal deposition process such as sputtering, electrolytic plating, metal foil lamination, chemical etching back, or electroless plating. Conductive layers 154 can be one or more layers of Al, Cu, Sn, Ni, Au, Ag, Ti, TiW, W, or other suitable electrically conductive material. Conductive layers 154 include lateral RDL and vertical conductive vias to provide electrical interconnect through substrate 150. Portions of conductive layers 154 are electrically common or electrically isolated according to the design and function of the semiconductor die to be mounted to substrate 150.

A conductive layer or RDL 156 is formed at surface 158 of substrate 150 using a patterning and metal deposition process such as sputtering, electrolytic plating, metal foil lamination, chemical etching back, or electroless plating. Conductive layer 156 can be one or more layers of Al, Cu, Sn, Ni, Au, Ag, Ti, TiW, W, or other suitable electrically conductive material. Conductive layer 156 operates as contact pads electrically connected to conductive layers 154. Portions of conductive layer 156 are electrically common or electrically isolated according to the design and function of the semiconductor die that will be mounted to substrate 150.

A conductive layer or RDL 160 is formed at surface 162 of substrate 150 using a patterning and metal deposition process such as sputtering, electrolytic plating, metal foil lamination, chemical etching back, or electroless plating. Conductive layer 160 can be one or more layers of Al, Cu, Sn, Ni, Au, Ag, Ti, TiW, W, or other suitable electrically conductive material. Conductive layer 160 operates as contact pads electrically connected to conductive layers 154. Portions of conductive layer 160 are electrically common or electrically isolated according to the design and function of the semiconductor die to be mounted to substrate 150. Conductive layers 154, 156, and 160 provide vertical and horizontal conduction paths through substrate 150. In one embodiment, a portion of at least one of the conductive layers 154, 156, or 160 of substrate 150 is designed to function as a grounding layer or ground plane within substrate 150.

Semiconductor die 164, as singulated from a semiconductor wafer similar to FIG. 2a, are disposed over substrate 150. Semiconductor die 164 are KGD having been tested prior to mounting semiconductor die 164 to substrate 150. Semiconductor die 164 has a back surface 168 and active surface 170 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 170 to implement analog circuits or digital circuits, such as DSP, ASIC, MEMS, memory, or other signal processing circuit. In one embodiment, active surface 170 contains a MEMS, such as an accelerometer, gyroscope, strain gauge, microphone, or other sensor responsive to various external stimuli. Semiconductor die 164 may also contain IPDs, such as inductors, capacitors, and resistors, for RF signal processing.

An electrically conductive layer 172 is formed over active surface 170 using PVD, CVD, electrolytic plating, electroless plating process, or other suitable metal deposition process. Conductive layer 172 can be one or more layers of Al, Cu, Sn, Ni, Au, Ag, Ti, TiW, W, or other suitable electrically conductive material. Conductive layer 172 operates as contact pads electrically connected to the circuits on active surface 170.

An insulating or passivation layer 174 is formed over active surface 170 and conductive layer 172 using PVD, CVD, printing, lamination, spin coating, spray coating, sintering, or thermal oxidation. The insulating layer 174 contains one or more layers of SiO2, Si3N4, SiON, Ta2O5, Al2O3, polyimide, PBO, epoxy or phenolic based resin, or other material having similar insulating and structural properties. A portion of insulating layer 174 is removed by LDA to expose conductive layer 172. Alternatively, a portion of insulating layer 174 is removed by an etching process through a patterned photoresist layer to expose conductive layer 172.

An electrically conductive bump material is deposited over conductive layer 172 using an evaporation, electrolytic plating, electroless plating, ball drop, or screen printing process. In one embodiment, the bump material is deposited with a ball drop stencil, i.e., no mask required. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 172 using a suitable attachment or bonding process. In one embodiment, the bump material is reflowed by heating the material above the material's melting point to form balls or bumps 176. In some applications, bumps 176 are reflowed a second time to improve electrical contact to conductive layer 172. Bumps 176 can also be compression bonded or thermocompression bonded to conductive layer 172. In one embodiment, bumps 176 are formed over an under bump metallization (UBM) layer having a wetting layer, barrier layer, and adhesive layer. Bumps 176 represent one type of interconnect structure that can be formed over conductive layer 172. The interconnect structure can also use bond wires, conductive paste, stud bump, micro bump, or other electrical interconnect. In one embodiment, a composite bump structure including a non-fusible portion, e.g., a plated Cu pillar, and a fusible portion, e.g., a solder cap, is formed over conductive layer 172. In another embodiment, flat eutectic metal bonding pads are formed as interconnect structures over semiconductor die 164.

FIG. 3b shows semiconductor die 164 mounted to substrate 150 as a reconstituted wafer or panel 178. Bumps 176 are reflowed to metallurgically and electrically connect to conductive layer 156. In one embodiment, substrate 150 is an organic BT or FR-4 based multilayer substrate panel.

An encapsulant or molding compound 180 is deposited over semiconductor die 164 and substrate 150 as an insulating material using a paste printing, compressive molding, transfer molding, liquid encapsulant molding, vacuum lamination, spin coating, or other suitable applicator. In particular, encapsulant 180 is disposed over and around semiconductor die 164. Encapsulant 180 includes polymer composite material, such as epoxy resin with filler, epoxy acrylate with filler, or polymer with proper filler. Encapsulant 180 is non-conductive and environmentally protects the semiconductor device from external elements and contaminants. In one embodiment, a subsequent backgrinding step is performed to remove a portion of encapsulant 180 from surface 182 of encapsulant 180 and thin reconstituted wafer 178. Encapsulant 180 can also be deposited such that encapsulant 180 is coplanar with back surface 168 of semiconductor die 164 and does not cover back surface 168.

In FIG. 3c, reconstituted wafer 178 is singulated into individual semiconductor units 190 using a saw blade or laser cutting tool 184. Each semiconductor unit 190 includes at least one semiconductor die 164 disposed over a portion of substrate 150. Semiconductor units 190 undergo electrical testing before or after singulation.

FIG. 3d shows a cross-sectional view of a portion of a carrier or temporary substrate 192 containing sacrificial base material such as silicon, polymer, beryllium oxide, glass, or other suitable low-cost, rigid material for structural support. An interface layer or double-sided tape 194 is formed over carrier 192 as a temporary adhesive bonding film, etch-stop layer, or thermal release layer.

Carrier 192 can be a round or rectangular panel (greater than 300 mm) with capacity for multiple semiconductor die 164 and semiconductor units 190. Carrier 192 may have a larger surface area than the surface area of semiconductor wafer 120 or reconstituted wafer 178. A larger carrier reduces the manufacturing cost of the semiconductor package as more semiconductor die can be processed on the larger carrier thereby reducing the cost per unit. Semiconductor packaging and processing equipment are designed and configured for the size of the wafer or carrier being processed.

To further reduce manufacturing costs, the size of carrier 192 is selected independent of the size of semiconductor unit 190 or the size of wafer 120 and reconstituted wafer 178. That is, carrier 192 has a fixed or standardized size, which can accommodate various size semiconductor die 164 and semiconductor units 190. In one embodiment, carrier 192 is circular with a diameter of 330 mm. In another embodiment, carrier 192 is rectangular with a width of 560 mm and length of 600 mm. Semiconductor units 190 having semiconductor die 164 with dimensions of 10 mm by 10 mm, may be placed on the standardized carrier 192. Alternatively, larger semiconductor units 190 having semiconductor die 164 with dimensions of 20 mm by 20 mm, can also be placed on the same standardized carrier 192. Accordingly, standardized carrier 192 can handle any size semiconductor unit 190, which allows subsequent semiconductor processing equipment to be standardized to a common carrier, i.e., independent of die size or incoming wafer size. Semiconductor packaging equipment can be designed and configured for a standard carrier using a common set of processing tools, equipment, and bill of materials to process any semiconductor die size from any incoming wafer size. The common or standardized carrier 192 lowers manufacturing costs and capital risk by reducing or eliminating the need for specialized semiconductor processing lines based on die size or incoming wafer size. By selecting a predetermined carrier size to use for any size semiconductor die or unit from all semiconductor and reconstituted wafers, a flexible manufacturing line can be implemented.

Semiconductor units 190, from FIG. 3c, are disposed over carrier 192 and interface layer 194 using, for example, a pick and place operation with substrate 150 oriented toward carrier 192. Semiconductor units 190 undergo electrical testing prior to mounting. Thus, only known good semiconductor units 190 are disposed over carrier 192.

FIG. 3e shows semiconductor units 190 mounted to interface layer 194 of carrier 192 as a reconstituted or reconfigured wafer 196. Reconstituted wafer 196 is configured according to the specifications of the resulting semiconductor package. The distance between semiconductor units 190 on carrier 192 is optimized for manufacturing the semiconductor packages at the lowest unit cost. The larger surface area of carrier 192 accommodates more semiconductor units 190 and lowers manufacturing cost as more semiconductor units 190 are processed per reconstituted wafer 196. The number of semiconductor units 190 mounted to carrier 192 can be greater than the number of semiconductor die 164 singulated from semiconductor wafer 120. The number of semiconductor units 190 mounted to carrier 192 can also be greater than the number of semiconductor units 190 singulated from reconstituted wafer 178. Carrier 192 and reconstituted wafer 196 provide the flexibility to manufacture many different types of semiconductor packages using different size semiconductor die 164 from different sized semiconductor wafers.

An encapsulant or molding compound 198 is deposited over semiconductor units 190 and carrier 192 using a paste printing, transfer molding, liquid encapsulant molding, vacuum lamination, spin coating, or other suitable applicator. Encapsulant 198 can be polymer composite material, such as epoxy resin with filler, epoxy acrylate with filler, or polymer with proper filler. Encapsulant 198 is non-conductive and environmentally protects the semiconductor device from external elements and contaminants.

Figure 3F:
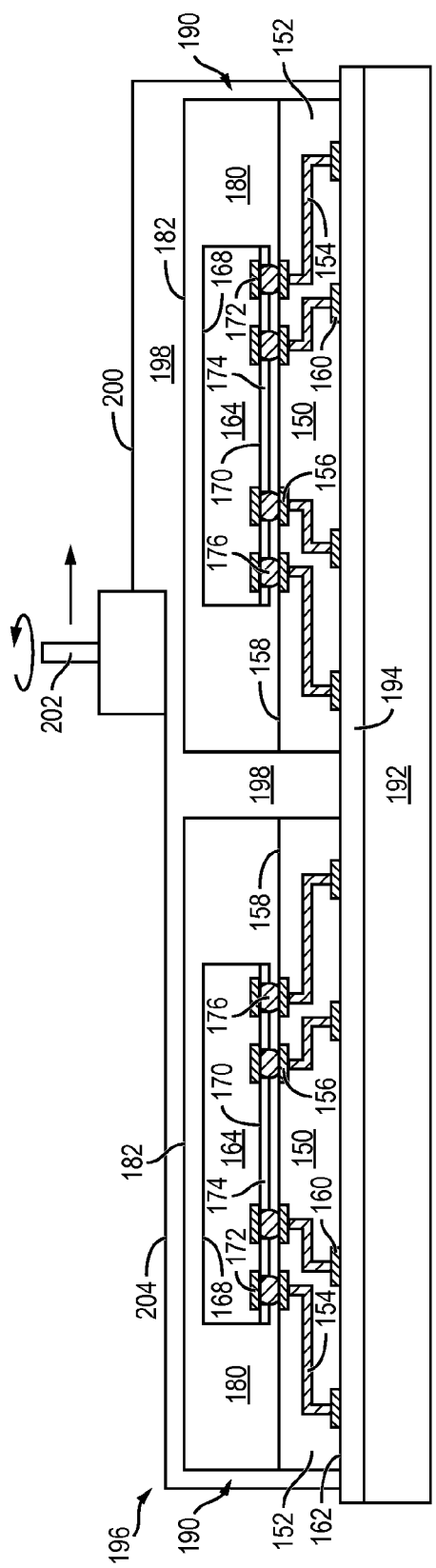

In FIG. 3f, a backside surface 200 of encapsulant 198 undergoes a grinding operation with grinder 202 to planarize and reduce a thickness of encapsulant 198. A chemical etch can also be used to remove and planarize encapsulant 198. After backgrinding a new backside surface 204 of encapsulant 198 is disposed over semiconductor units 190, i.e., a thickness of encapsulant 198 maintains coverage over surface 182 of encapsulant 180. In one embodiment, the thickness of encapsulant 198 remaining over surface 182 ranges from approximately 170-230 µm. In another embodiment, the thickness of encapsulant 198 remaining over surface 182 of encapsulant 180 ranges from approximately 5-150 µm. Alternatively, the backgrinding operation may be carried out later in the manufacturing process, e.g., after the debonding of carrier 192 and interface layer 194, after formation of RDLs over substrate 150, or after bump formation over substrate 150.

Figure 3G:
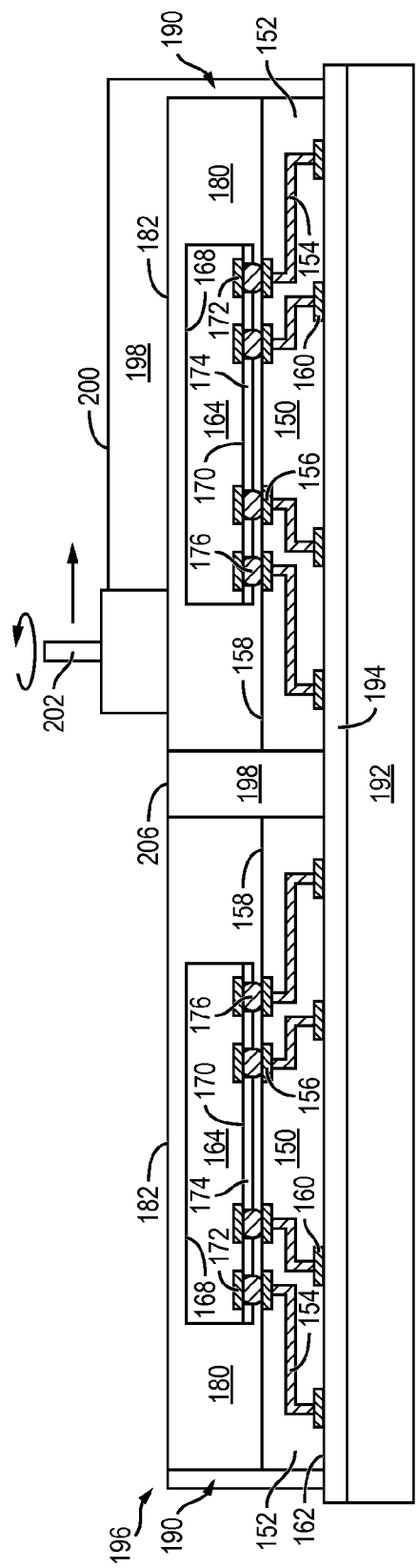

FIG. 3g illustrates an alternative backgrinding step where encapsulant 198 is completely removed from back surface 182 of encapsulant 180. After the grinding operation in FIG. 3g is completed, surface 182 of encapsulant 180 is exposed and new backside surface 206 of encapsulant 198 is coplanar with back surface 182 of encapsulant 180. A thickness of semiconductor die 164 and encapsulant 180 of semiconductor unit 190 can also be reduced by the grinding operation to further thin reconstituted wafer 196.

Continuing from FIG. 3f, carrier 192 and interface layer 194 are removed by chemical etching, mechanical peeling, CMP, mechanical grinding, thermal bake, UV light, laser scanning, or wet stripping to expose surface 162 of substrate 150 and a surface 208 of encapsulant 198, as shown in FIG. 3h. Surface 208 of encapsulant 198 is coplanar with surface 162 of substrate 150.

In FIG. 3h, reconstituted wafer 196 is inverted and an electrically conductive layer or RDL 210 is formed over insulating material 152 and conductive layer 160 of substrate 150 using a patterning and metal deposition process such as printing, PVD, CVD, sputtering, electrolytic plating, and electroless plating. Conductive layer 210 can be one or more layers of Al, Cu, Sn, Ni, Au, Ag, Ti, TiW, W, or other suitable electrically conductive material. A portion of conductive layer 210 extends horizontally along surface 162 of insulating material 152 and parallel to active surface 170 of semiconductor die 164 to laterally redistribute the electrical interconnect to conductive layer 160 of substrate 150. Conductive layer 210 is formed over a footprint of substrate 150 and does not extend outside the footprint of substrate 150. In other words, a peripheral region of substrate 150 adjacent to and around substrate 150 is devoid of conductive layer 210 such that surface 208 of encapsulant 198 remains exposed from conductive layer 210. A portion of conductive layer 210 is electrically connected to conductive layer 160. Other portions of conductive layer 210 are electrically common or electrically isolated depending on the design and function of the final semiconductor package.

An insulating or passivation layer 212 is formed over insulating material 152 and conductive layer 210 using PVD, CVD, printing, spin coating, spray coating, screen printing or lamination. Insulating layer 212 can be one or more layers of SiO2, Si3N4, SiON, Ta2O5, Al2O3, or other material having similar insulating and structural properties. In one embodiment, insulating layer 212 is a photosensitive dielectric polymer low-cured at less than 250° C. A portion of insulating layer 212 is removed by an etching process with a patterned photoresist layer or by LDA to form openings over and exposing conductive layer 210. In one embodiment, insulating layer 212 is formed within the footprint of substrate 150 and does not extend beyond the footprint of substrate 150. In other words, a peripheral region of substrate 150 adjacent to and around substrate 150 is devoid of insulating layer 212 such that surface 208 of encapsulant 198 remains exposed from insulating layer 212. In another embodiment, insulating layer 212 is formed continuously over insulating material 152, conductive layer 210, and surface 208 of encapsulant 198 and then a portion of insulating layer 212 over surface 208 of encapsulant 198 is removed by an etching process with a patterned photoresist layer or by LDA to expose surface 208 of encapsulant 198.

An electrically conductive bump material is deposited over conductive layer 210 using an evaporation, electrolytic plating, electroless plating, ball drop, or screen printing process. In one embodiment, the bump material is deposited with a ball drop stencil, i.e., no mask required. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 210 using a suitable attachment or bonding process. In one embodiment, the bump material is reflowed by heating the material above the material's melting point to form balls or bumps 214. In some applications, bumps 214 are reflowed a second time to improve electrical contact to conductive layer 210. In one embodiment, bumps 214 are formed over a UBM layer having a wetting layer, barrier layer, and adhesive layer. Bumps 214 can also be compression bonded or thermocompression bonded to conductive layer 210. Bumps 214 represent one type of interconnect structure that can be formed over conductive layer 210. The interconnect structure can also use bond wires, conductive paste, stud bump, micro bump, composite bumps, or other electrical interconnect. Laser marking can be performed before or after bump formation, or after removal of carrier 192.

Collectively, conductive layer 210, insulating layer 212, and bumps 214 constitute a build-up interconnect structure 216 formed over semiconductor unit 190. Build-up interconnect structure 216 is disposed over and within a footprint of substrate 150 such that a peripheral region around semiconductor unit 190 is devoid of interconnect structure 216, and surface 208 of encapsulant 198 remains exposed from interconnect structure 216. Build-up interconnect structure 216 may include as few as one RDL or conductive layer, such as conductive layer 210, and one insulating layer, such as insulating layer 212. Additional insulating layers and RDLs can be formed over insulating layer 212 prior to forming bumps 214, to provide additional vertical and horizontal electrical connectivity across the package according to the design and functionality of semiconductor die 164 and the final semiconductor package. In one embodiment, backgrinding of encapsulant 198 is performed after formation of RDL 210. In another embodiment, backgrinding of encapsulant 198 is performed after formation of bumps 214.

In FIG. 3i, reconstituted wafer 196 is singulated into individual semiconductor packages 220 using a saw blade or laser cutting tool 218. Forming build-up interconnect structure 216 over the footprint of semiconductor unit 190 allows reconstituted wafer 196 to be singulated by cutting through only encapsulant 198, thereby eliminating a need to cut through build-up interconnect structure 216 and reducing a risk of damaging the layers of build-up interconnect structure 216 during singulation. Reconstituted wafer 196 is singulated such that a thin layer of encapsulant 198 remains over the side surfaces or sidewalls 222 of semiconductor unit 190. Alternatively, reconstituted wafer 196 is singulated to completely remove encapsulant 198 from side surfaces 222.

Figure 4A:
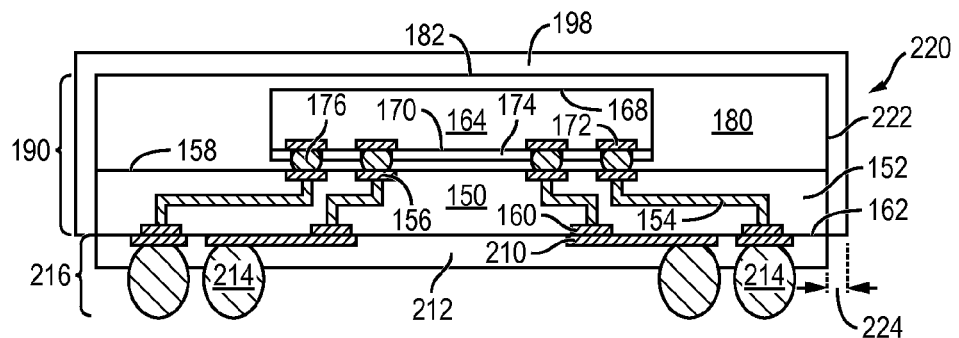
FIGS. 4a-4d illustrate semiconductor packages having an RDL for integration into a PoP semiconductor device.

FIG. 4a shows semiconductor package 220 after singulation. Semiconductor die 164 is electrically connected through bumps 176 and conductive layers 156, 154, 160, and 210 to bumps 214 for external interconnect. Interconnect structure 216 does not extend beyond a footprint of semiconductor unit 190 and thus forms a fan-in package. Encapsulant 198 remains over back surface 182 of semiconductor unit 190 after the grinding operation shown in FIG. 3f. After singulation of reconstituted wafer 196, encapsulant 198 remains over side surfaces 222 of semiconductor unit 190. Thus, encapsulant 198 is disposed over five sides of semiconductor unit 190, i.e., over four side surfaces 222 and over back surface 182. Encapsulant 198 provides mechanical protection and protection from degradation due to exposure to photons from light or other emissions. In one embodiment, a thickness 224 of encapsulant 198 over side surfaces 222 is less than 150 μm. Semiconductor units 190 are tested prior to disposal over carrier 192 to ensure that only know good semiconductor units 190 are incorporated into semiconductor package 220.

Figure 4B:
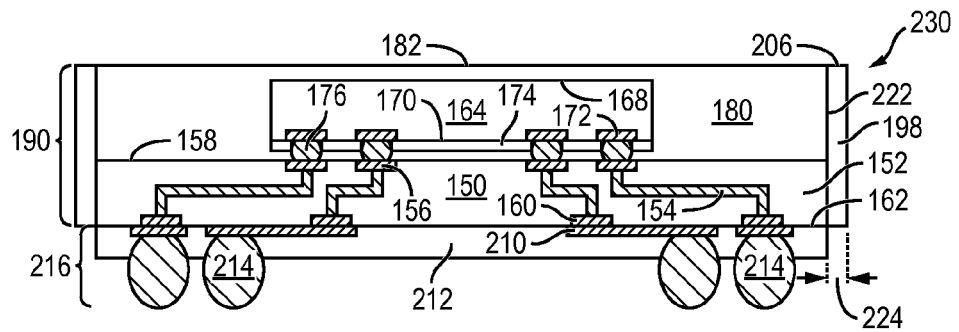

FIG. 4b shows an alternative semiconductor package 230 with side surface encapsulant 198 and exposed back surface 182. Semiconductor die 164 is electrically connected through bumps 176 and conductive layers 156, 154, 160, and 210 to bumps 214 for external interconnect. Interconnect structure 216 does not extend beyond a footprint of semiconductor unit 190 and thus forms a fan-in package. Encapsulant 198 is completely removed from back surface 182 of semiconductor unit 190 during the grinding operation shown in FIG. 3g. After the singulation operation shown in FIG. 3i, encapsulant 198 remains over side surfaces 222 of semiconductor unit 190 for mechanical protection and protection from degradation due to exposure to photons from light or other emissions. Thus, encapsulant 198 is disposed over four sides of semiconductor unit 190, i.e., over four side surfaces 222. In one embodiment, a thickness 224 of encapsulant 198 over side surfaces 222 is less than 150 μm. Semiconductor units 190 are tested prior to disposal over carrier 192 to ensure that only know good semiconductor units 190 are incorporated into semiconductor package 230.

Figure 4C:
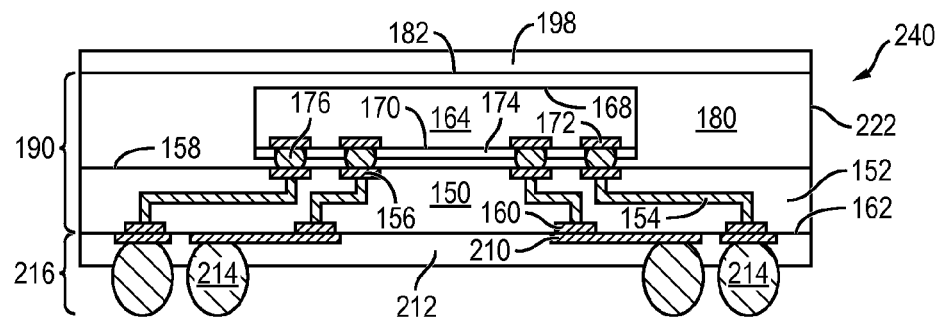

FIG. 4c shows another semiconductor package 240 with backside encapsulant 198 and exposed side surfaces 222. Semiconductor die 164 is electrically connected through bumps 176 and conductive layers 156, 154, 160, and 210 to bumps 214 for external interconnect. Interconnect structure 216 does not extend beyond a footprint of semiconductor unit 190 and thus forms a fan-in package. Encapsulant 198 remains over back surface 182 of encapsulant 180 after the grinding operation shown in FIG. 3f. Encapsulant 198 is completely removed from side surfaces 222 of semiconductor unit 190 during singulation to expose side surfaces 222 such that the length and width of package 240 is the same as the length and width of semiconductor unit 190. Encapsulant 198 disposed over back surface 182 of semiconductor unit 190 provides mechanical protection and protection from degradation due to exposure to photons from light or other emissions. Semiconductor units 190 are tested prior to disposal over carrier 192 to ensure that only know good semiconductor units 190 are incorporated into semiconductor package 240.

Figure 4D:
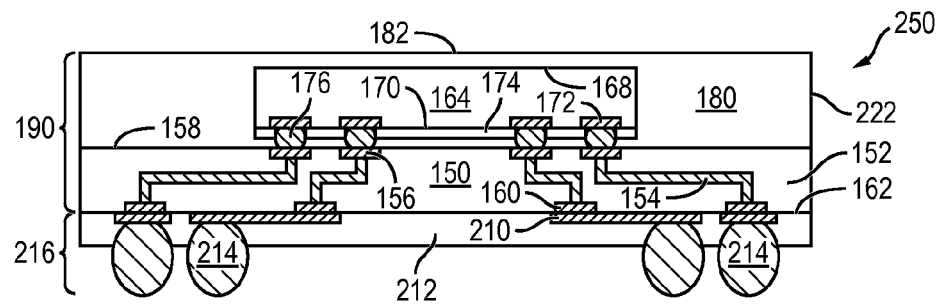

FIG. 4d shows another semiconductor package 250 with exposed back surface 182 and exposed side surfaces 222. Semiconductor die 164 is electrically connected through bumps 176 and conductive layers 156, 154, 160, and 210 to bumps 214 for external interconnect. Interconnect structure 216 does not extend beyond a footprint of semiconductor unit 190 and thus forms a fan-in package. Encapsulant 198 is completely removed from back surface 182 of encapsulant 180 during the grinding operation shown in FIG. 3g. Encapsulant 198 is completely removed from side surfaces 222 of semiconductor unit 190 during singulation to expose side surfaces 222. No encapsulant 198 remains over a surface of semiconductor unit 190 in semiconductor package 250. The length and width of package 250 is the same as the length and width of semiconductor unit 190. Semiconductor units 190 are tested prior to disposal over carrier 192 to ensure that only know good semiconductor units 190 are incorporated into semiconductor package 250.

Figure 5A:
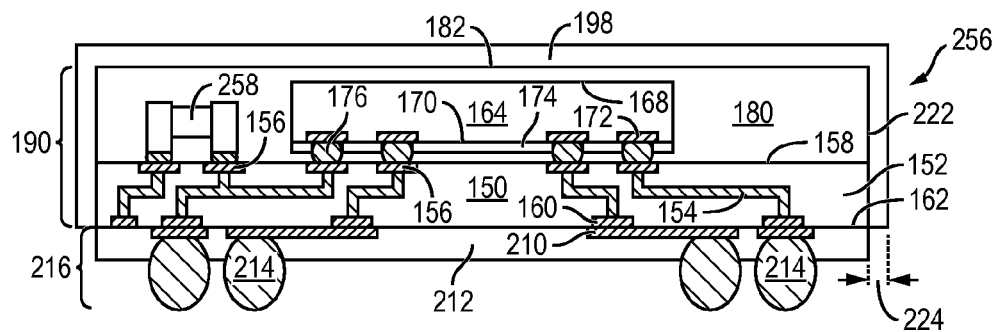
FIGS. 5a-5d illustrate semiconductor packages having an RDL and discrete device for integration into a PoP semiconductor device.

FIG. 5a shows a semiconductor package 256, similar to package 220 in FIG. 4a, with semiconductor unit 190 including a discrete device 258, for example a filter, inductor, resistor, capacitors, small signal transistor, or other discrete semiconductor device. Discrete device 258 is disposed over and electrically connected to conductive layer 156 of substrate 150. Encapsulant 180 is deposited over semiconductor die 164 and discrete device 258. Semiconductor die 164 and discrete device 258 are electrically connected through conductive layers 156, 154, 160, and 210 to bumps 214 for external interconnect. Interconnect structure 216 does not extend beyond a footprint of semiconductor unit 190 and thus forms a fan-in package. Encapsulant 198 remains over back surface 182 of semiconductor unit 190 after the grinding operation shown in FIG. 3f. After singulation of reconstituted wafer 196, encapsulant 198 remains over side surfaces 222 of semiconductor unit 190. Thus, encapsulant 198 is disposed over five sides of semiconductor unit 190, i.e., over four side surfaces 222 and over back surface 182. Encapsulant 198 provides mechanical protection and protection from degradation due to exposure to photons from light or other emissions. In one embodiment, a thickness 224 of encapsulant 198 over side surfaces 222 is less than 150 μm. Semiconductor units 190 with discrete device 258 are tested prior to disposal over carrier 192 to ensure that only know good semiconductor units 190 are incorporated into semiconductor package 256.

Figure 5B:
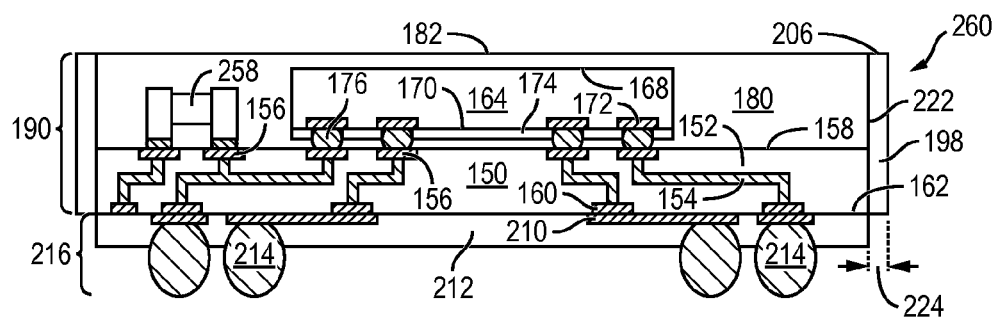

FIG. 5b shows a semiconductor package 260, similar to package 230 in FIG. 4b, with semiconductor unit 190 including discrete device 258. Discrete device 258 is disposed over and electrically connected to conductive layer 156 of substrate 150. Encapsulant 180 is deposited over semiconductor die 164 and discrete device 258. Semiconductor die 164 and discrete device 258 are electrically connected through conductive layers 156, 154, 160, and 210 to bumps 214 for external interconnect. Interconnect structure 216 does not extend beyond a footprint of semiconductor unit 190 and thus forms a fan-in package. Encapsulant 198 is completely removed from back surface 182 of semiconductor unit 190 during the grinding operation shown in FIG. 3g. After the singulation operation shown in FIG. 3i, encapsulant 198 remains over side surfaces 222 of semiconductor unit 190 for mechanical protection and protection from degradation due to exposure to photons from light or other emissions. Thus, encapsulant 198 is disposed over four sides of semiconductor unit 190, i.e., over four side surfaces 222. In one embodiment, a thickness 224 of encapsulant 198 over side surfaces 222 is less than 150 µm. Semiconductor units 190 with discrete device 258 are tested prior to disposal over carrier 192 to ensure that only know good semiconductor units 190 are incorporated into semiconductor package 260.

Figure 5C:
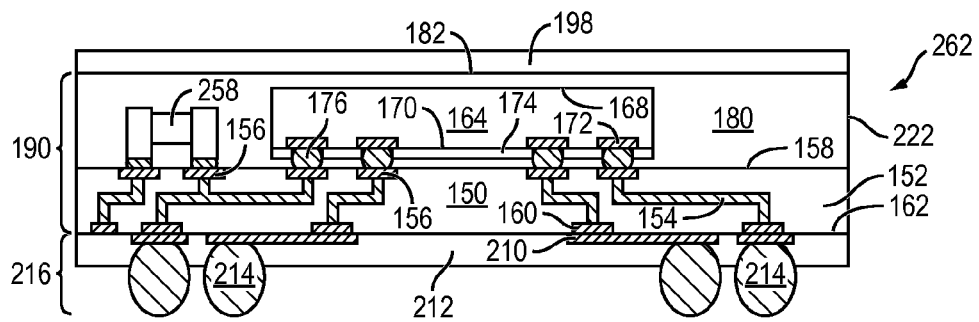

FIG. 5c shows a semiconductor package 262, similar to package 240 in FIG. 4c, with semiconductor unit 190 including discrete device 258. Discrete device 258 is disposed over and electrically connected to conductive layer 156 of substrate 150. Encapsulant 180 is deposited over semiconductor die 164 and discrete device 258. Semiconductor die 164 and discrete device 258 are electrically connected through conductive layers 156, 154, 160, and 210 to bumps 214 for external interconnect. Interconnect structure 216 does not extend beyond a footprint of semiconductor unit 190 and thus forms a fan-in package. Encapsulant 198 remains over back surface 182 of encapsulant 180 after the grinding operation shown in FIG. 3f. Encapsulant 198 is completely removed from side surfaces 222 of semiconductor unit 190 during singulation to expose side surfaces 222 such that the length and width of package 262 is the same as the length and width of semiconductor unit 190. Encapsulant 198 disposed over back surface 182 of semiconductor unit 190 provides mechanical protection and protection from degradation due to exposure to photons from light or other emissions. Semiconductor units 190 with discrete device 258 are tested prior to disposal over carrier 192 to ensure that only know good semiconductor units 190 are incorporated into semiconductor package 262.

Figure 5D:
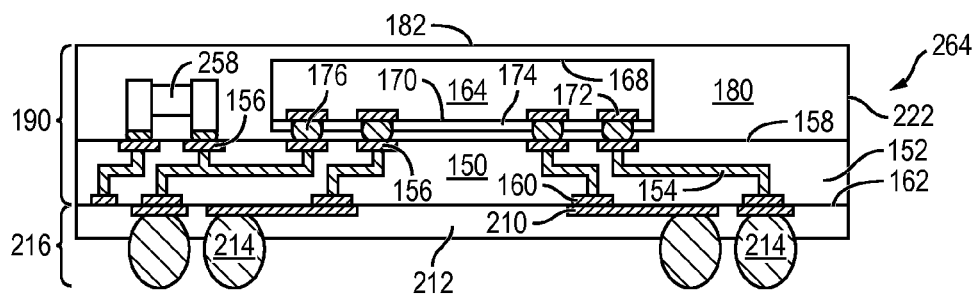

FIG. 5d shows a semiconductor package 264, similar to package 250 in FIG. 4d, with semiconductor unit 190 including discrete device 258. Discrete device 258 is disposed over and electrically connected to conductive layer 156 of substrate 150. Encapsulant 180 is deposited over semiconductor die 164 and discrete device 258. Semiconductor die 164 and discrete device 258 are electrically connected through conductive layers 156, 154, 160, and 210 to bumps 214 for external interconnect. Interconnect structure 216 does not extend beyond a footprint of semiconductor unit 190 and thus forms a fan-in package. Encapsulant 198 is completely removed from back surface 182 of encapsulant 180 during the grinding operation shown in FIG. 3g. Encapsulant 198 is completely removed from side surfaces 222 of semiconductor unit 190 during singulation to expose side surfaces 222. No encapsulant 198 remains over a surface of semiconductor unit 190 in semiconductor package 264. The length and width of package 264 is the same as the length and width of semiconductor unit 190. Semiconductor units 190 with discrete device 258 are tested prior to disposal over carrier 192 to ensure that only know good semiconductor units 190 are incorporated into semiconductor package 264.

Figure 6C:
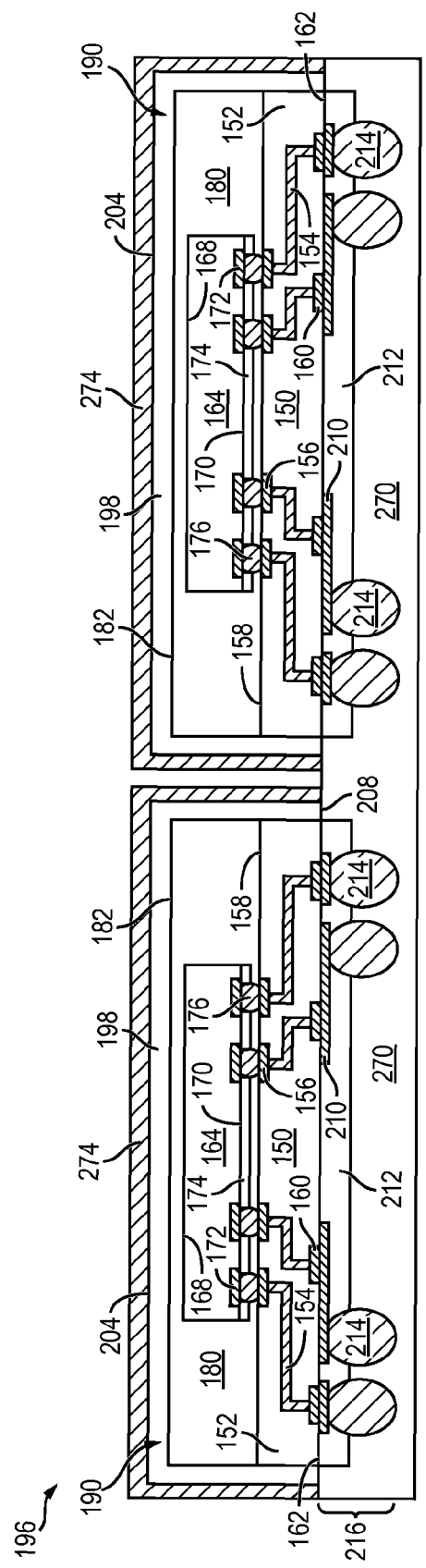

FIGS. 6a-6c illustrate, in relation to FIG. 1, a method of making a semiconductor package having an RDL and a shielding layer for integration into a PoP semiconductor device. Continuing from FIG. 3h, a backgrinding or dicing tape 270 is laminated over reconstituted wafer 196. Tape 270 is formed over and in contact with build-up interconnect structure 216. Tape 270 supports reconstituted wafer 196 during singulation.

In FIG. 6b, reconstituted wafer 196 is singulated by cutting through surface 204 of encapsulant 198 using a saw blade or laser cutting tool 272. Reconstituted wafer 196 is singulated such that a thin layer of encapsulant 198 remains over side surfaces 222 of semiconductor units 190. Conductive layer 210 is patterned such that, after singulation of reconstituted wafer 196, a portion of conductive layer 210 extends to the outer side surface of encapsulant 198 and is exposed for electrical connection to conductive layers formed over encapsulant 198.

Alternatively, reconstituted wafer 196 is singulated to completely remove encapsulant 198 from side surfaces 222. Conductive layer 154, 156, 160, or 210 is patterned such that, after singulation of reconstituted wafer 196, a portion of conductive layer 154, 156, 160, or 210 extends to side surface 222 of semiconductor unit 190 and is exposed for electrical connection to conductive layers formed over semiconductor unit 190. In one embodiment, reconstituted wafer 196 is singulated by forming a plurality of trenches or blind vias through surface 208 of encapsulant 198. The trenches extend only partially through encapsulant 198. After forming the trenches, backgrinding tape 270 is disposed over interconnect structure 216 and a backgrinding operation is performed on wafer 196 to remove a portion of encapsulant 198 and expose the trenches. After backgrinding, the trenches extend completely through encapsulant 198, i.e., from surface 208 to surface 204 of encapsulant 198. The backgrinding exposes the trenches and leaves a plurality of singulated semiconductor packages each surrounded by a trench extending completely through encapsulant 198.

In FIG. 6c, an electrically conductive layer 274 is conformally deposited over encapsulant 198 using a patterning and metal deposition process such as electrolytic plating and electroless plating, sputtering, PVD, CVD, or other suitable metal deposition process. Conductive layer 274 operates as a shielding layer to reduce the effects of electromagnetic interference (EMI) and radio frequency interference (RFI). Shielding layer 274 can be one or more layers of Al, Cu, Sn, Ni, Au, Ag, Ti, TiW, W, or other suitable electrically conductive material. Shielding layer 274 can also be ferrite or carbonyl iron, stainless steel (SS), nickel silver, low-carbon steel, silicon-iron steel, foil, conductive resin, conductive paste, and other metals and composites capable of blocking or absorbing EMI, RFI, and other inter-device interference. In other embodiments, shielding layer 274 includes a non-metal material such as carbon-black or aluminum flake to reduce the effects of EMI and RFI. For non-metal materials, shielding layer 274 can be applied by lamination, spraying, or painting. Shielding layer 274 is grounded or electrically connected to a ground plane of semiconductor unit 190 through at least one of the conductive layers 154, 156, 160, or 210, which is exposed during the singulation of reconstituted wafer 196.

Figure 7A:
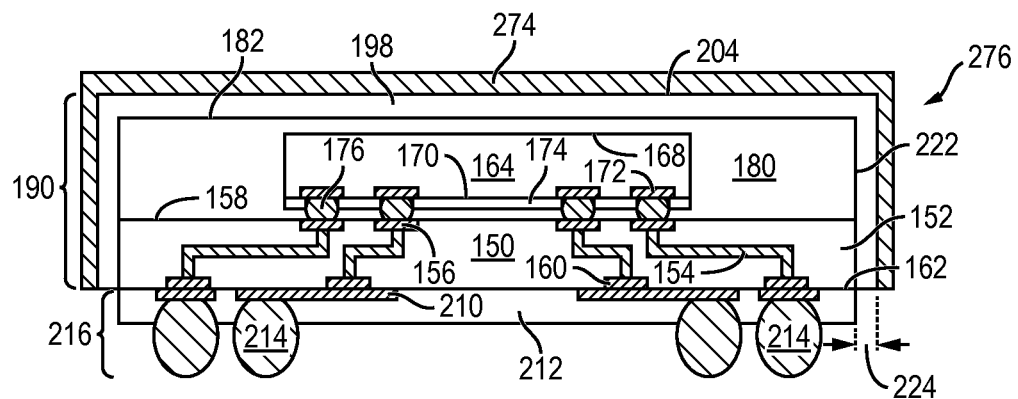
FIGS. 7a-7d illustrate semiconductor packages having an RDL and shielding layer for integration into a PoP semiconductor device.

FIG. 7a shows a semiconductor package 276 after removal from tape 270. Semiconductor die 164 is electrically connected through bumps 176 and conductive layers 156, 154, 160, and 210 to bumps 214 for external interconnect. Encapsulant 198 remains over back surface 182 and side surfaces 222 of semiconductor unit 190. In one embodiment, a thickness 224 of encapsulant 198 over side surfaces 222 is less than 150 µm. Shielding layer 274 is disposed over surface 204 of encapsulant 198 and the portions of encapsulant 198 over side surfaces 222 to reduce the effects of EMI and RFI. Shielding layer 274 is electrically connected to a portion of conductive layer 210 for connection to ground. In one embodiment, a discrete device is disposed over conductive layer 156 of substrate 150, similar to discrete device 258 in FIG. 5a. Semiconductor units 190 are tested prior to disposal over carrier 192 to ensure that only know good semiconductor units 190 are incorporated into semiconductor package 276.

Figure 7B:
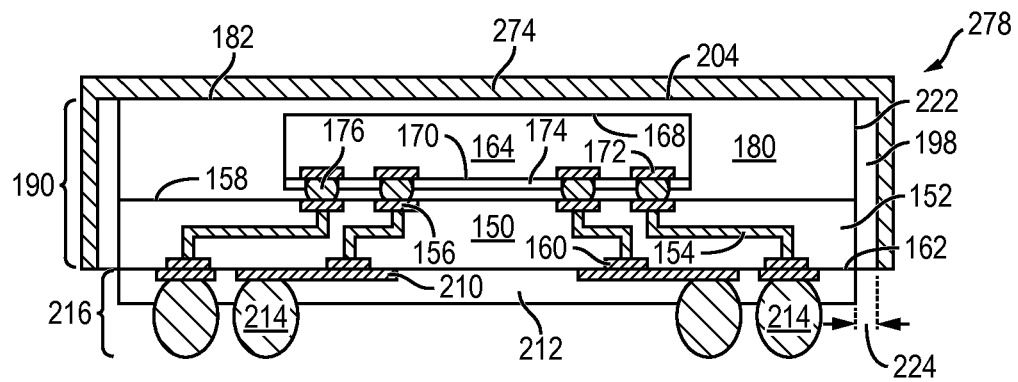

FIG. 7b shows a semiconductor package 278, similar to package 230 in FIG. 4b, with shielding layer 274 formed over semiconductor unit 190. Semiconductor die 164 is electrically connected through bumps 176 and conductive layers 156, 154, 160, and 210 to bumps 214 for external interconnect. Encapsulant 198 is completely removed from back surface 182 of semiconductor unit 190. After the singulation step shown in FIG. 6b, encapsulant 198 remains over side surfaces 222 of semiconductor unit 190. In one embodiment, a thickness of encapsulant 198 over side surfaces 222 is less than 150 μm. Shielding layer 274 is formed over surface 182 of encapsulant 180 and the portions of encapsulant 198 disposed over side surfaces 222 to reduce the effects of EMI and RFI. Shielding layer 274 is electrically connected to a portion of conductive layer 210 for connection to ground. In one embodiment, a discrete device is disposed over conductive layer 156 of substrate 150, similar to discrete device 258 in FIG. 5b. Semiconductor units 190 are tested prior to disposal over carrier 192 to ensure that only know good semiconductor units 190 are incorporated into semiconductor package 278.

Figure 7C:
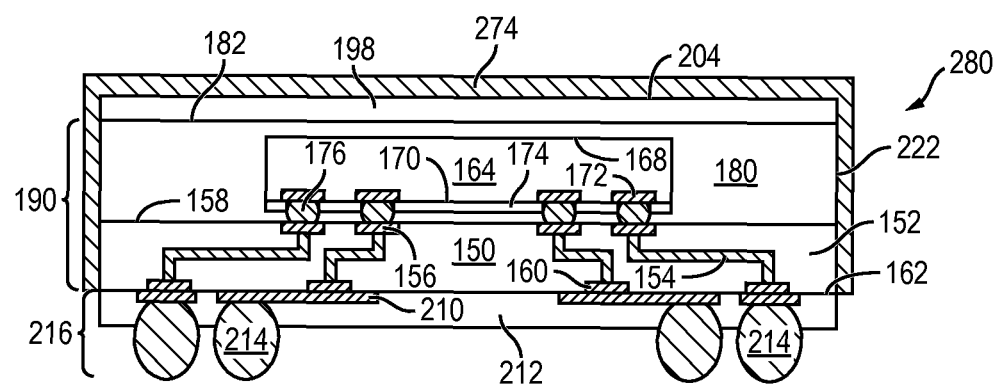

FIG. 7c shows a semiconductor package 280, similar to package 240 in FIG. 4c, with shielding layer 274 formed over semiconductor unit 190. Semiconductor die 164 is electrically connected through bumps 176 and conductive layers 156, 154, 160, and 210 to bumps 214 for external interconnect. Shielding layer 274 is formed over surface 204 of encapsulant 198 and exposed side surfaces 222 to reduce the effects of EMI and RFI. Shielding layer 274 is electrically connected to a portion of conductive layer 154, 156, 160, or 210 at side surface 222 for connection to ground. In one embodiment, a discrete device is disposed over conductive layer 156 of substrate 150, similar to discrete device 258 in FIG. 5c. Semiconductor units 190 are tested prior to disposal over carrier 192 to ensure that only know good semiconductor units 190 are incorporated into semiconductor package 280.

Figure 7D:
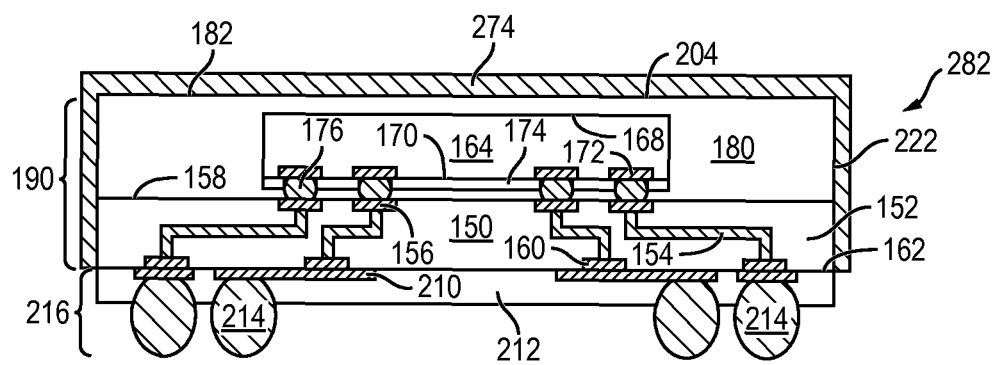

FIG. 7d shows a semiconductor package 282, similar to package 250 in FIG. 4d, with shielding layer 274 formed over semiconductor unit 190. Semiconductor die 164 is electrically connected through bumps 176 and conductive layers 156, 154, 160, and 210 to bumps 214 for external interconnect. Encapsulant 198 is completely removed from back surface 182 of encapsulant 180 during the grinding operation shown in FIG. 3g. Encapsulant 198 is completely removed from side surfaces 222 of semiconductor unit 190 during singulation of reconstituted wafer 196 to expose side surfaces 222. Shielding layer 274 is formed over surface 182 of encapsulant 180 and exposed side surfaces 222 to reduce the effects of EMI and RFI. Shielding layer 274 is electrically connected to a portion of conductive layer 154, 156, 160, or 210 at side surface 222 for connection to ground. In one embodiment, a discrete device is disposed over conductive layer 156 of substrate 150, similar to discrete device 258 in FIG. 5d. Semiconductor units 190 are tested prior to disposal over carrier 192 to ensure that only know good semiconductor units 190 are incorporated into semiconductor package 282.

FIGS. 8a-8d illustrate, in relation to FIG. 1, a method of making a semiconductor package having an RDL and heat spreader for integration into a PoP semiconductor device. Continuing from the backgrinding operation shown in FIG. 3g, carrier 192 and interface layer 194 are removed and build-up interconnect structure 216 is formed over the footprint of semiconductor unit 190. After forming build-up interconnect structure 216, backgrinding or dicing tape 270 is laminated over insulating layer 212 and bumps 214 of build-up interconnect structure 216, as shown in FIG. 8a.

In FIG. 8b, a thermal interface material (TIM) 284 is deposited over surface 182 of encapsulant 180 and surface 206 of encapsulant 198. TIM 284 is a thermal epoxy, thermal epoxy resin, thermal conductive paste, aluminum oxide, zinc oxide, boron nitride, pulverized silver, or thermal grease. A plurality of heat spreaders or heat sinks 286 is positioned over and mounted to TIM 284. Heat spreader 286 can be Cu, Al, or other material with high thermal conductivity (60 W/m·K or greater). In an alternate embodiment shown in FIG. 8c, TIM 284 is disposed on the surface of heat spreader 286 prior to mounting heat spreader 286. In either case, heat spreaders 286 are mounted to a central area of each individual semiconductor unit 190, over back surface 168 of semiconductor die 164. A footprint of heat spreader 286 is smaller than the footprint of semiconductor unit 190. After mounting heat spreaders 286 to reconstituted wafer 196, TIM 284 is cured to attach heat spreader 286 to TIM 284 and to encapsulant 180.

Continuing from FIG. 8b, FIG. 8d shows heat spreaders 286 attached to TIM 284 and semiconductor units 190. Reconstituted wafer 196 is singulated through encapsulant 198 and TIM 284 into individual packages 290 using a saw blade or laser cutting tool 288. Reconstituted wafer 196 is singulated such that a thin layer of encapsulant 198 remains over side surfaces 222 of semiconductor unit 190. Alternatively, reconstituted wafer 196 is singulated to completely remove encapsulant 198 from side surfaces 222.

Figure 9A:
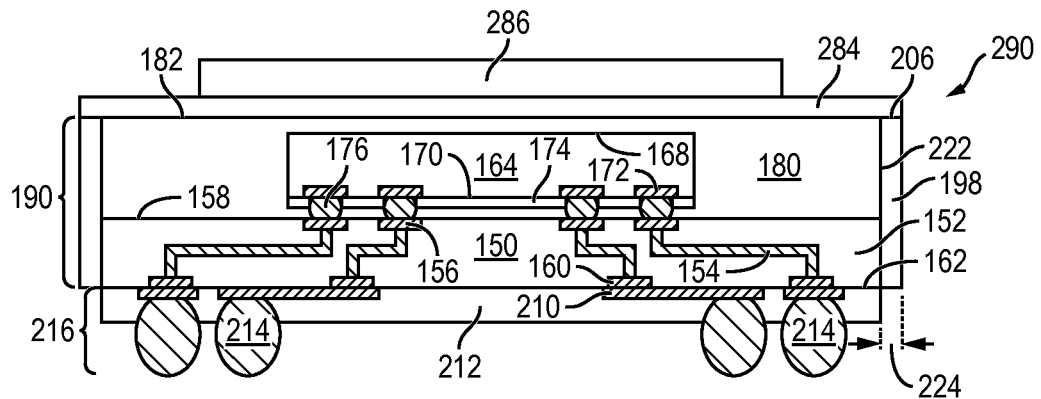
FIGS. 9a-9d illustrate semiconductor packages having an RDL and heat spreader for integration into a PoP semiconductor device.

FIG. 9a shows semiconductor package 290 after singulation. Semiconductor die 164 is electrically connected through bumps 176 and conductive layers 156, 154, 160, and 210 to bumps 214 for external interconnect. Interconnect structure 216 does not extend beyond a footprint of semiconductor unit 190 and thus forms a fan-in package. Encapsulant 198 is completely removed from back surface 182 of semiconductor unit 190 during the grinding operation shown in FIG. 3g. Heat spreader 286 is thermally connected to semiconductor unit 190 via TIM 284. TIM 284 is disposed over reconstituted wafer 196 prior to mounting heat spreader 286, as shown in FIG. 8b. Heat spreader 286 dissipates heat from semiconductor unit 190 to improve the thermal performance and functionality of semiconductor package 290. After the singulation operation shown in FIG. 8d, encapsulant 198 remains over side surfaces 222 of semiconductor unit 190 for mechanical protection and protection from degradation due to exposure to photons from light or other emissions. In one embodiment, a thickness 224 of encapsulant 198 over side surfaces 222 is less than 150 μm. Semiconductor units 190 are tested prior to disposal over carrier 192 to ensure that only know good semiconductor units 190 are incorporated into semiconductor package 290.

Figure 9B:
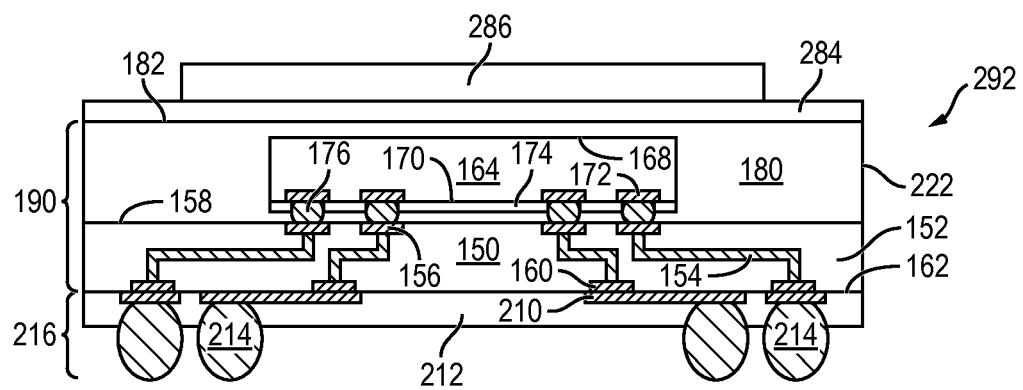

FIG. 9b shows a semiconductor package 292 having exposed side surfaces 222. Semiconductor die 164 is electrically connected through bumps 176 and conductive layers 156, 154, 160, and 210 to bumps 214 for external interconnect. Interconnect structure 216 does not extend beyond a footprint of semiconductor unit 190 and thus forms a fan-in package. Encapsulant 198 is completely removed from back surface 182 of semiconductor unit 190 during the grinding operation shown in FIG. 3g. Heat spreader 286 is thermally connected to semiconductor unit 190 via TIM 284. TIM 284 is disposed over reconstituted wafer 196 prior to mounting heat spreader 286, as shown in FIG. 8b. Heat spreader 286 dissipates heat from semiconductor unit 190 to improve the thermal performance and functionality of semiconductor package 282. After the singulation operation shown in FIG. 8d, encapsulant 198 is removed from side surfaces 222 of semiconductor unit 190. Semiconductor units 190 are tested prior to disposal over carrier 192 to ensure that only know good semiconductor units 190 are incorporated into semiconductor package 292.

Figure 9C:
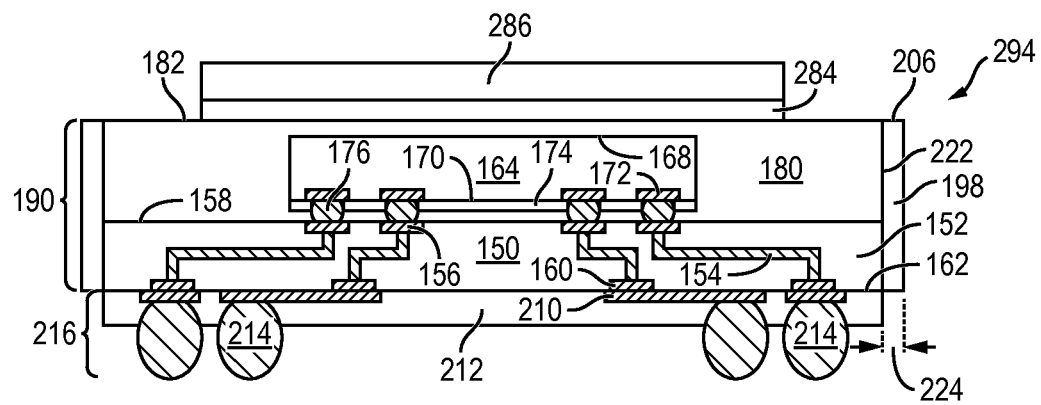

FIG. 9c shows a semiconductor package 294 formed with encapsulated side surfaces 222. Semiconductor die 164 is electrically connected through bumps 176 and conductive layers 156, 154, 160, and 210 to bumps 214 for external interconnect. Interconnect structure 216 does not extend beyond a footprint of semiconductor unit 190 and thus forms a fan-in package. Encapsulant 198 is completely removed from back surface 182 of semiconductor unit 190 during the grinding operation shown in FIG. 3g. Heat spreader 286 is thermally connected to semiconductor unit 190 via TIM 284. TIM 284 is disposed over heat spreader 286 prior to mounting heat spreader 286, as shown in FIG. 8c. Heat spreader 286 dissipates heat from semiconductor unit 190 to improve the thermal performance and functionality of semiconductor package 294. After the singulation operation shown in FIG. 8d, encapsulant 198 remains over side surfaces 222 of semiconductor unit 190 for mechanical protection and protection from degradation due to exposure to photons from light or other emissions. In one embodiment, a thickness 224 of encapsulant 198 over side surfaces 222 is less than 150 µm. Semiconductor units 190 are tested prior to disposal over carrier 192 to ensure that only know good semiconductor units 190 are incorporated into semiconductor package 294.

Figure 9D:
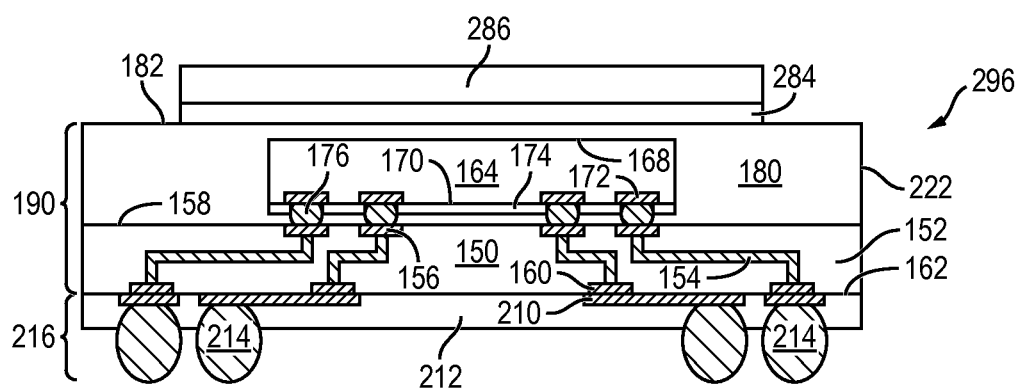

FIG. 9d shows a semiconductor package 296 having a heat spreader 286 and exposed side surfaces 222. Semiconductor die 164 is electrically connected through bumps 176 and conductive layers 156, 154, 160, and 210 to bumps 214 for external interconnect. Interconnect structure 216 does not extend beyond a footprint of semiconductor unit 190 and thus forms a fan-in package. Encapsulant 198 is completely removed from back surface 182 of semiconductor unit 190 during the grinding operation shown in FIG. 3g. Heat spreader 286 is thermally connected to semiconductor unit 190 via TIM 284. TIM 284 is disposed over heat spreader 286 prior to mounting heat spreader 286, as shown in FIG. 8c. Heat spreader 286 dissipates heat from semiconductor unit 190 to improve the thermal performance and functionality of the semiconductor package. After the singulation operation shown in FIG. 8d, encapsulant 198 is removed from side surfaces 222 of semiconductor unit 190. Semiconductor units 190 are tested prior to disposal over carrier 192 to ensure that only know good semiconductor units 190 are incorporated into semiconductor package 296.

FIGS. 10a-10b illustrate, in relation to FIG. 1, a method of prefabricating modular interconnect units from a substrate panel. FIG. 10a shows a cross-sectional view of a portion of a substrate panel 300. Substrate panel 300 includes core substrate 302 having opposing surfaces 304 and 306. Core substrate 302 includes one or more laminated layers of polytetrafluoroethylene pre-impregnated (prepreg), FR-4, FR-1, CEM-1, or CEM-3 with a combination of phenolic cotton paper, epoxy, resin, woven glass, matte glass, polyester, and other reinforcement fibers or fabrics. Alternatively, core substrate 302 may include one or more insulating or passivation layers.

A plurality of through vias is formed through core substrate 302 using laser drilling, mechanical drilling, deep reactive ion etching (DRIE), or other suitable process. The through vias extend completely through core substrate 302 from surface 304 to surface 306. The through vias are filled with Al, Cu, Sn, Ni, Au, Ag, Ti, TiW, W, or other suitable electrically conductive material or combination thereof using PVD, CVD, electrolytic plating, electroless plating process, or other suitable metal deposition process to form z-direction vertical interconnect structures or conductive vias 308. Alternatively, a conductive layer is formed over the sidewalls of the through vias using PVD, CVD, electrolytic plating, electroless plating process, or other suitable metal deposition process, and a center portion of the through vias is filled with a conductive filler material, e.g., Cu paste, or an insulating filler material, e.g., a polymer plug.

A conductive layer 310 is formed over surface 304 of core substrate 302 and over conductive vias 308 using PVD, CVD, electrolytic plating, electroless plating process, or other suitable metal deposition. Conductive layer 310 includes one or more layers of Al, Cu, Sn, Ni, Au, Ag, Ti, TiW, W, or other suitable electrically conductive material or combination thereof. Portions of conductive layer 310 operate as contact pads and are electrically connected to conductive vias 308. Conductive layer 310 also includes portions that are electrically common or electrically isolated depending on the routing design and function of the semiconductor package. In one embodiment, conductive layer 310 operates as an RDL extending electrical connection from conductive vias 308 to areas adjacent to conductive vias 308 to laterally redistribute electrical signals across substrate panel 300.

An insulating or passivation layer 312 is formed over surface 304 of core substrate 302 and conductive layer 310 using PVD, CVD, printing, lamination, spin coating, spray coating, sintering, or thermal oxidation. The insulating layer 312 contains one or more layers of $SiO_2$, $Si_3N_4$, SiON, $Ta_2O_5$, $Al_2O_3$, polymer dielectric resist with or without fillers or fibers, or other material having similar insulating and structural properties. A portion of insulating layer 312 is removed by LDA, etching, or other suitable process to expose portions of conductive layer 310. In one embodiment, insulating layer 312 is a solder resist layer.

A conductive layer 314 is formed over surface 306 of core substrate 302 and conductive vias 308 using PVD, CVD, electrolytic plating, electroless plating process, or other suitable metal deposition. Conductive layer 314 includes one or more layers of Al, Cu, Sn, Ni, Au, Ag, Ti, TiW, W, or other suitable electrically conductive material or combination thereof. Portions of conductive layer 314 operate as contact pads and are electrically connected to conductive vias 308. Conductive layer 314 also may include portions that are electrically common or electrically isolated depending on the routing design and function of the semiconductor package. Alternatively, conductive vias 308 are formed through core substrate 302 after forming conductive layers 310 and 314.

An insulating or passivation layer 316 is formed over surface 306 of core substrate 302 and conductive layer 314 using PVD, CVD, printing, lamination, spin coating, spray coating, sintering, or thermal oxidation. The insulating layer 316 contains one or more layers of $SiO_2$, $Si_3N_4$, SiON, $Ta_2O_5$, $Al_2O_3$, polymer dielectric resist with or without fillers or fibers, or other material having similar insulating and structural properties. A portion of insulating layer 316 is removed by LDA, etching, or other suitable process to expose portions of conductive layer 314. In one embodiment, insulating layer 316 is a solder resist layer.

In FIG. 10b, substrate panel 300 is singulated into individual modular interconnect structures or units 320 using saw blade or laser cutting tool 318. Modular interconnect units 320 are prefabricated from substrate panel 300 and are configured for integration into PoP semiconductor devices. Modular interconnect units 320 may include additional conductive layers or insulating layers formed over surfaces 304 and 306 to provide additional electrical interconnect across the unit according to the design and functionality of the device. In another embodiment, passive devices are formed over surface 304 or surface 306 of modular interconnect units 320. Conductive layers 310 and 314, as well as additional conductive and insulating layers, may contain passive devices formed within the circuit layers.

Figure 11B:
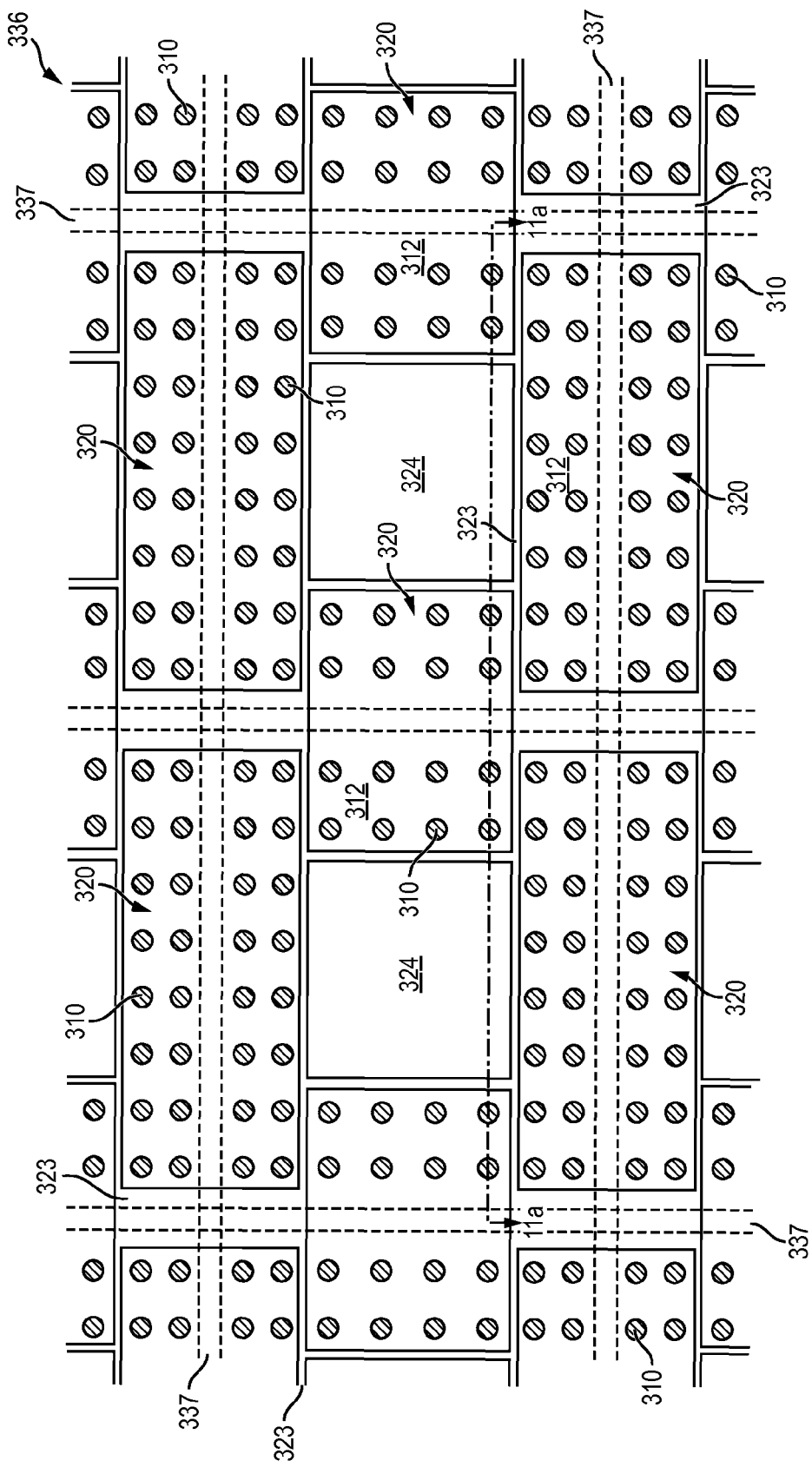

FIGS. 11a-11l illustrate, in relation to FIG. 1, a method of making a PoP semiconductor device with an RDL formed over the top semiconductor package. FIG. 11a shows a cross-sectional view of a portion of a carrier or temporary substrate 322 containing sacrificial base material such as silicon, polymer, beryllium oxide, glass, or other suitable low-cost, rigid material for structural support. An interface layer or double-sided tape 323 is formed over carrier 322 as a temporary adhesive bonding film, etch-stop layer, or thermal release layer.

Carrier 322 can be a round or rectangular panel (greater than 300 mm) with capacity for multiple semiconductor die. Carrier 322 may have a larger surface area than the surface area of semiconductor wafer 120. A larger carrier reduces the manufacturing cost of the semiconductor package as more semiconductor die can be processed on the larger carrier thereby reducing the cost per unit. Semiconductor packaging and processing equipment is designed and configured for the size of the wafer or carrier being processed.

To further reduce manufacturing costs, the size of carrier 322 is selected independent of the size of incoming semiconductor die or the size of semiconductor wafer 120. That is, carrier 322 has a fixed or standardized size, which can accommodate various size semiconductor die singulated from one or more semiconductor wafers. In one embodiment, carrier 322 is circular with a diameter of 330 mm. In another embodiment, carrier 322 is rectangular with a width of 560 mm and length of 600 mm. Semiconductor die having dimensions of 10 mm by 10 mm, can be placed on the standardized carrier 322. Alternatively, semiconductor die having dimensions of 20 mm by 20 mm, can be placed on the same standardized carrier 322. Accordingly, standardized carrier 322 can handle any size semiconductor die, which allows subsequent semiconductor processing equipment to be standardized to a common carrier, i.e., independent of die size or incoming wafer size. Semiconductor packaging equipment can be designed and configured for a standard carrier using a common set of processing tools, equipment, and bill of materials to process any semiconductor die size from any incoming wafer size. The common or standardized carrier 322 lowers manufacturing costs and capital risk by reducing or eliminating the need for specialized semiconductor processing lines based on die size or incoming wafer size. By selecting a predetermined carrier size to use for any size semiconductor die from all semiconductor wafer, a flexible manufacturing line can be implemented.

In FIG. 11a, semiconductor die 324, as singulated from a wafer similar to wafer 120 in FIG. 2a, are mounted to interface layer 323 and over carrier 322 using, for example, a pick and place operation. Semiconductor die 324 are KGD having been tested prior to disposing semiconductor die 324 over carrier 322. Semiconductor die 324 has a back surface 328 and active surface 330 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 330 to implement analog circuits or digital circuits, such as DSP, ASIC, MEMS, memory, or other signal processing circuit. In one embodiment, active surface 330 contains a MEMS, such as an accelerometer, gyroscope, strain gauge, microphone, or other sensor responsive to various external stimuli. Semiconductor die 324 may also contain IPDs, such as inductors, capacitors, and resistors, for RF signal processing.

An electrically conductive layer 332 is formed over active surface 330 using PVD, CVD, electrolytic plating, electroless plating process, or other suitable metal deposition process. Conductive layer 332 can be one or more layers of Al, Cu, Sn, Ni, Au, Ag, Ti, TiW, W, or other suitable electrically conductive material. Conductive layer 332 operates as contact pads electrically connected to the circuits on active surface 330.

An insulating or passivation layer 334 is formed over active surface 330 and conductive layer 332 using PVD, CVD, printing, lamination, spin coating, spray coating, sintering or thermal oxidation. The insulating layer 334 contains one or more layers of SiO2, Si3N4, SiON, Ta2O5, Al2O3, or other material having similar insulating and structural properties. A portion of insulating layer 334 is removed by etching or by LDA to expose conductive layer 332. Semiconductor die 324 are disposed over interface layer 323 and carrier 322 with active surface 330 oriented toward the carrier.

Modular interconnect units 320, from FIG. 10b, are mounted over carrier 322 adjacent to semiconductor die 324 using, for example, a pick and place operation with an optional adhesive. Modular interconnect units 320 are disposed on interface layer 323 in a peripheral region of semiconductor die 324. Modular interconnect units 320 are disposed over carrier 322 at specific predetermined locations around semiconductor die 324 to optimize the space within the semiconductor package. When mounting modular interconnect units 320 adjacent to semiconductor die 324, a gap or space may remain between semiconductor die 324 and modular interconnect units 320. Modular interconnect units 320 provide vertical interconnect and increase flexibility of semiconductor package design. Because modular interconnect units 320 are prefabricated, use of modular interconnect units 320 for vertical interconnections reduces the manufacturing steps for the semiconductor package. In another embodiment, modular interconnect units 320 are mounted to interface layer 323, prior to mounting semiconductor die 324.

Semiconductor die 324 and modular interconnect units 320 mounted to interface layer 323 of carrier 322 form a reconstituted panel or reconfigured wafer 336. Reconstituted wafer 336 is configured according to the specifications of the resulting semiconductor package. The distance between semiconductor die 324 and modular interconnect units 320 on carrier 322 is optimized for manufacturing the semiconductor packages at the lowest unit cost. The larger surface area of carrier 322 accommodates more semiconductor die 324 and lowers manufacturing cost as more semiconductor die 324 are processed per reconstituted wafer 336. The number of semiconductor die 324 mounted to carrier 322 can be greater than the number of semiconductor die singulated from the semiconductor wafer. Carrier 322 and reconstituted wafer 336 provide the flexibility to manufacture many different types of semiconductor packages using different size semiconductor die 324 from different sized semiconductor wafers.

FIG. 11b shows a plan view of reconstituted wafer 336 after mounting semiconductor die 324 and modular interconnect units 320 to interface layer 323. Modular interconnect units 320 are disposed adjacent to one or more sides of semiconductor die 324. In one embodiment, modular interconnect units 320 are disposed along two, three, or four sides of each semiconductor die 324 on reconstituted wafer 336. Modular interconnect units 320 contain multiple rows of conductive vias 308. Conductive layer 310 operates as contact pads or RDLs over conductive vias 308. Modular interconnect units 320 are illustrated in FIG. 11b as including square or rectangular footprints. Alternatively, modular interconnect units 320 include cross-shaped, oval shaped, angled or "L-shaped," or any geometrically shaped footprint. Any number or configuration of modular interconnect units 320 are disposed adjacent to semiconductor die 324 depending on the routing design and function of the device. In one embodiment, modular interconnect units 320 remain in panel form, for example as a 300-325 mm round panel or 470 mm×370 mm rectangular panel, and openings are punched through the modular interconnect unit panel to accommodate semiconductor die 324. A plurality of saw streets 337 are aligned with respect to semiconductor die 324 and extend across modular interconnect units 320 such that when reconstituted wafer 336 is singulated along the saw streets, each semiconductor die 324 has a plurality of vertical interconnect structures, i.e., conductive vias 308, from singulated modular interconnect units 320 disposed around or in a peripheral region of semiconductor die 324.

In FIG. 11c, an encapsulant or molding compound 338 is deposited over semiconductor die 324, modular interconnect units 320, and carrier 322 as an insulating material using a paste printing, compressive molding, transfer molding, liquid encapsulant molding, vacuum lamination, spin coating, or other suitable applicator. In particular, encapsulant 338 covers the side surfaces and back surface 328 of semiconductor die 324. Encapsulant 338 covers modular interconnect units 320 and is deposited between semiconductor die 324 and modular interconnect units 320. Encapsulant 338 includes polymer composite material, such as epoxy resin with filler, epoxy acrylate with filler, or polymer with proper filler. Encapsulant 338 is non-conductive and environmentally protects the semiconductor device from external elements and contaminants.

In FIG. 11d, temporary carrier 322 and optional interface layer 323 are removed by chemical etching, mechanical peel-off, CMP, mechanical grinding, thermal bake, laser scanning, or wet stripping to expose modular interconnect units 320 and semiconductor die 324. Reconstituted wafer 336 is inverted and an insulating or passivation layer 342 is formed over encapsulant 338, modular interconnect units 320, and semiconductor die 324 using PVD, CVD, printing, spin coating, spray coating, screen printing or lamination. Insulating layer 342 can be one or more layers of $SiO_2$, $Si_3N_4$, SiON, $Ta_2O_5$, $Al_2O_3$, low temperature curable polymer dielectric resist (i.e., cures at less than 250° C.), BCB, PBO, epoxy based photosensitive polymer dielectric, or other material having similar insulating and structural properties. A portion of insulating layer 342 is removed by an etching process or by LDA to expose contact pads 332 of semiconductor die 324 and conductive layer 314 of modular interconnect units 320.

An electrically conductive layer 344 is formed over insulating layer 342, contact pads 332, and conductive layer 314 using a patterning and metal deposition process such as PVD, CVD, sputtering, electrolytic plating, and electroless plating. Conductive layer 344 includes one or more layers of Al, Cu, Sn, Ni, Au, Ag, Ti, TiW, W, or other suitable electrically conductive material or combination thereof. One portion of conductive layer 344 is electrically connected to contact pads 332 of semiconductor die 324. One portion of conductive layer 344 is electrically connected to conductive layer 314. Other portions of conductive layer 344 are electrically common or electrically isolated depending on the design and function of the semiconductor device.

An insulating or passivation layer 346 is formed over insulating layer 342 and conductive layer 344 using PVD, CVD, printing, spin coating, spray coating, sintering or thermal oxidation. Insulating layer 346 includes one or more layers of $SiO_2$, $Si_3N_4$, SiON, $Ta_2O_5$, $Al_2O_3$, low temperature curable polymer dielectric resist (i.e., cures at less than 250° C.), BCB, PBO, or epoxy based photosensitive polymer dielectric, or other material having similar insulating and structural properties. A portion of insulating layer 346 is removed by an etching process or by LDA to expose portions of conductive layer 344.

In FIG. 11e, an electrically conductive layer 348 is formed over insulating layer 346 and conductive layer 344 using a patterning and metal deposition process such as PVD, CVD, sputtering, electrolytic plating, and electroless plating. Conductive layer 348 includes one or more layers of Al, Cu, Sn, Ni, Au, Ag, Ti, TiW, W, or other suitable electrically conductive material or combination thereof. One portion of conductive layer 348 is electrically connected to conductive layer 344. Other portions of conductive layer 348 are electrically common or electrically isolated depending on the design and function of the semiconductor device.

An insulating or passivation layer 350 is formed over insulating layer 346 and conductive layer 348 using PVD, CVD, printing, spin coating, spray coating, sintering or thermal oxidation. Insulating layer 350 includes one or more layers of $SiO_2$, $Si_3N_4$, SiON, $Ta_2O_5$, $Al_2O_3$, low temperature curable polymer dielectric resist (i.e., cures at less than 250° C.), BCB, PBO, or epoxy based photosensitive polymer dielectric, or other material having similar insulating and structural properties. A portion of insulating layer 350 is removed by an etching process or by LDA to expose portions of conductive layer 348.

Collectively, insulating layers 342, 346, and 350 and conductive layers 344 and 348 constitute a build-up interconnect structure 352 formed over semiconductor die 324 and modular interconnect units 320. Build-up interconnect structure 352 may include as few as one RDL or conductive layer, such as conductive layer 344, and one insulating layer, such as insulating layer 342. Additional insulating layers and RDLs can be formed over insulating layer 350 to provide additional vertical and horizontal electrical connectivity across the package according to the design and functionality of the semiconductor device.

FIG. 11f shows a thermal resistant backgrinding support tape 354 deposited over reconstituted wafer 336. Backgrinding support tape 354 is in contact with build-up interconnect structure 352. Backgrinding support tape 354 supports reconstituted wafer 336 during subsequent manufacturing steps. An optional carrier or temporary substrate 356 may be disposed over tape 354 to support reconstituted wafer 336 during subsequent manufacturing steps, as shown in FIG. 11g. Carrier 356 contains a sacrificial base material such as silicon, polymer, beryllium oxide, glass, or other suitable low-cost, rigid material for structural support. In embodiments employing optional carrier 356, tape 354 is an interface layer or double-sided tape formed over carrier 356 as a temporary adhesive bonding film, etch-stop layer, or thermal release layer. Subsequent manufacturing can be performed with reconstituted wafer 336 supported solely by support tape 354, as shown in FIG. 11f, or with reconstituted wafer 336 supported by tape 354 and carrier 356, as shown in FIG. 3g.

In FIG. 11h, a portion of encapsulant 338 is removed to form openings 358 over and exposing conductive layer 310 of modular interconnect units 320. Openings 358 are formed by LDA using laser 360, etching, or other suitable process. Encapsulant 338 is also removed from over back surface 328 of semiconductor die 324. In one embodiment, encapsulant 338 is thinned in a backgrinding step prior to forming openings 358. After forming openings 358, openings 358 undergo a desmearing or cleaning process, including a particle and organic residue wet clean, such as a single wafer pressure jetting clean with a suitable solvent, or alkali and carbon dioxide bubbled deionized water, in order to remove any particles or residue from the drilling process. A plasma clean is also performed to clean any contaminants from the exposed conductive layer 310, using reactive ion etching (RIE) or downstream/microwave plasma with O2 and one or more of tetrafluoromethane (CF4), nitrogen (N2), or hydrogen peroxide (H2O2). In one embodiment, a finish such as Cu organic solderability preservative (OSP) is applied to the exposed portions of conductive layer 310 to prevent Cu oxidation.

Figure 11I:
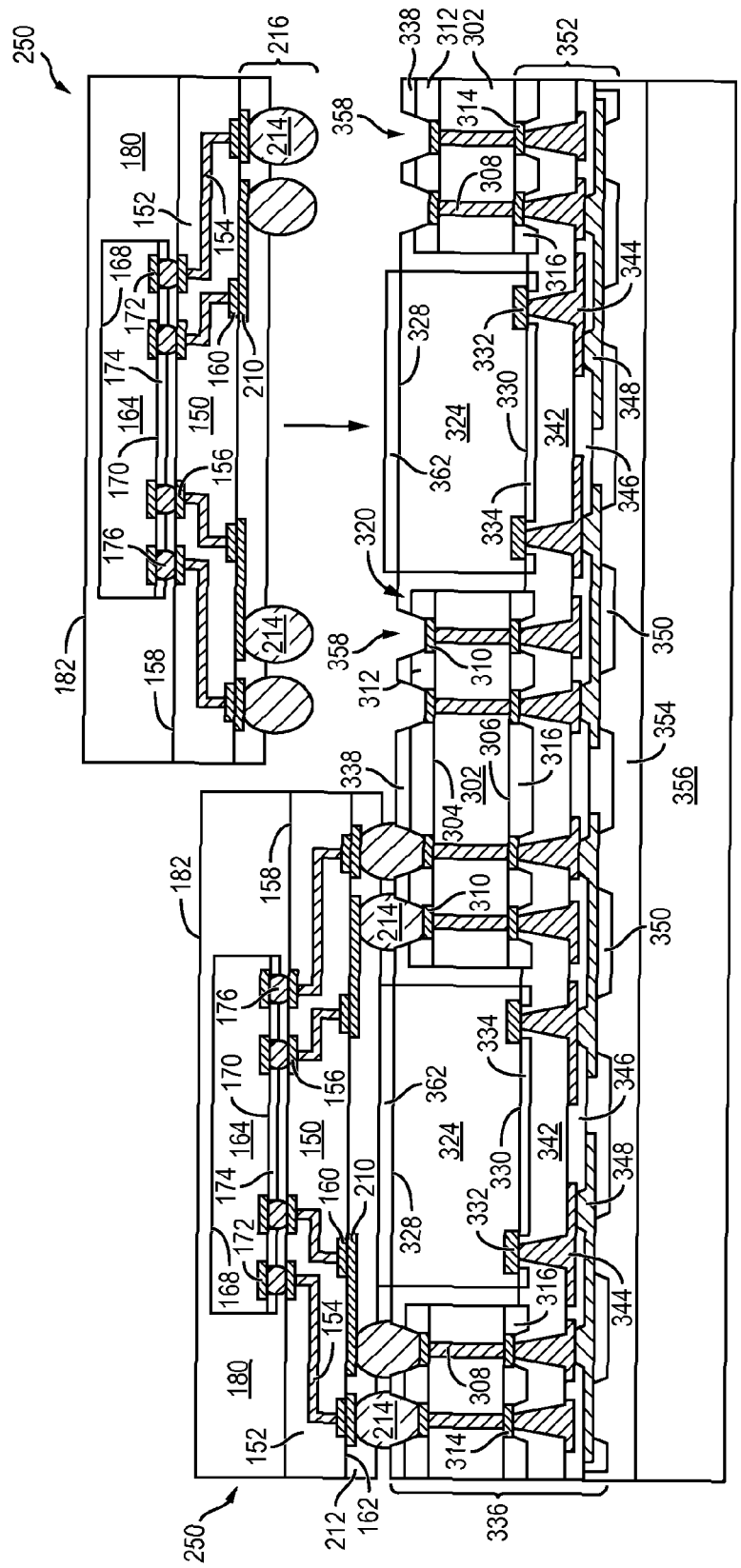

In FIG. 11i, semiconductor packages 250, from FIG. 4d, are disposed over reconstituted wafer 336 using, for example, a pick and place operation with build-up interconnect structure 216 oriented toward reconstituted wafer 336. Semiconductor packages 250 are tested to be known good prior to mounting. Accordingly, only known good semiconductor packages 250 are disposed over reconstituted wafer 336. The functionality of semiconductor die 324, modular interconnect units 320, and build-up interconnect structure 352 is also tested prior to mounting semiconductor packages 250 using, for example, wafer level probing. Accordingly, semiconductor packages 250 are disposed over only known good bottom packages.

Bumps 214 of semiconductor package 250 are oriented toward reconstituted wafer 336 and align with openings 358 and contact pads 310 of modular interconnect units 320. Conductive layer 210 is patterned such that the location and pitch of bumps 214 coincide with the location and pitch of exposed contact pads 310, e.g., the pitch of both bumps 214 and exposed contact pads 310 is 300 µm.

An adhesive 362 is dispensed over surface 328 of semiconductor die 324 prior to mounting semiconductor packages 250. Alternatively, adhesive 362 is applied to semiconductor package 250 prior to mounting. Adhesive 362 can include epoxy resin, thermoplastic resin, acrylate monomer, a hardening accelerator, organic filler, silica filler, or polymer filler. Adhesive 362 facilities and strengthens the attachment of semiconductor packages 250 to semiconductor die 324 of reconstituted wafer 336. In embodiment, adhesive 362 improves the thermal conductivity between top semiconductor package 250 and semiconductor die 324.

Bumps 214 are reflowed to metallurgically and electrically connect to conductive layer 310. In some applications, bumps 214 are reflowed a second time to improve electrical contact to conductive layer 310. Bumps 214 can also be compression bonded or thermocompression bonded to conductive layer 310. Optional carrier 356 provides support and prevents warpage during attachment of semiconductor packages 250. In the present embodiment, semiconductor package 250 is used by way of example. Any of the semiconductor packages or combination of the semiconductor packages from FIGS. 4a-4d, 5a-5d, 7a-7d, 9a-9d, and 20f-20g can be disposed over reconstituted wafer 336.

Figure 11J:
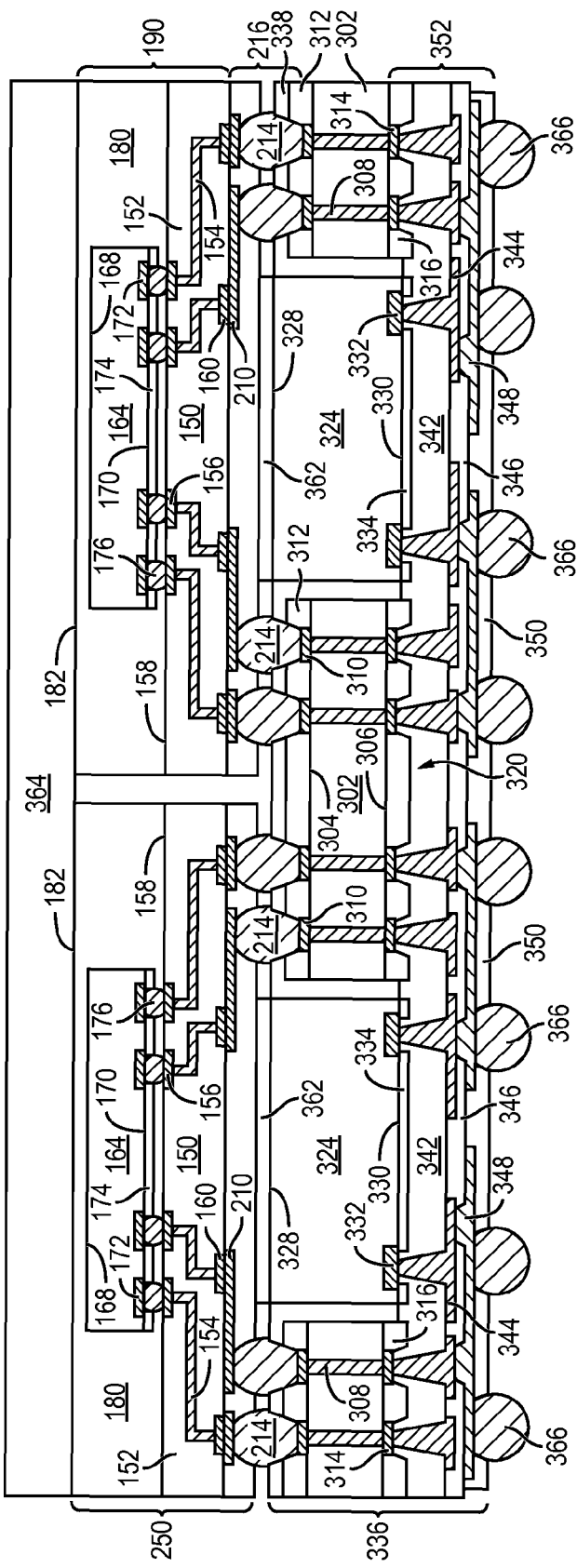

FIG. 11j shows semiconductor packages 250 attached to reconstituted wafer 336. An optional backside thermal resistance tape 364 is disposed over semiconductor packages 250. Optional carrier 356 and interface layer 354 are removed by chemical etching, mechanical peeling, CMP, mechanical grinding, thermal bake, UV light, laser scanning, or wet stripping to expose insulating layer 350 and conductive layer 348 of build-up interconnect structure 352. In one embodiment, the openings in insulating layer 350 that expose conductive layer 348 are formed after the removal of optional carrier 356 and interface layer 354.

An electrically conductive bump material is deposited over conductive layer 348 using an evaporation, electrolytic plating, electroless plating, ball drop, or screen printing process. In one embodiment, the bump material is deposited with a ball drop stencil, i.e., no mask required. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 348 using a suitable attachment or bonding process. In one embodiment, the bump material is reflowed by heating the material above the material's melting point to form balls or bumps 366. In some applications, bumps 366 are reflowed a second time to improve electrical contact to conductive layer 348. Bumps 366 can also be compression bonded or thermocompression bonded to conductive layer 348. In one embodiment, bumps 366 are formed over a UBM layer having a wetting layer, barrier layer, and adhesive layer. Bumps 366 represent one type of interconnect structure that can be formed over conductive layer 348. The interconnect structure can also use bond wires, conductive paste, stud bump, micro bump, or other electrical interconnect. Thermal resistance tape 364 supports reconstituted wafer 336 and semiconductor packages 250 and prevents warpage during formation of bumps 366.

Figure 11K:
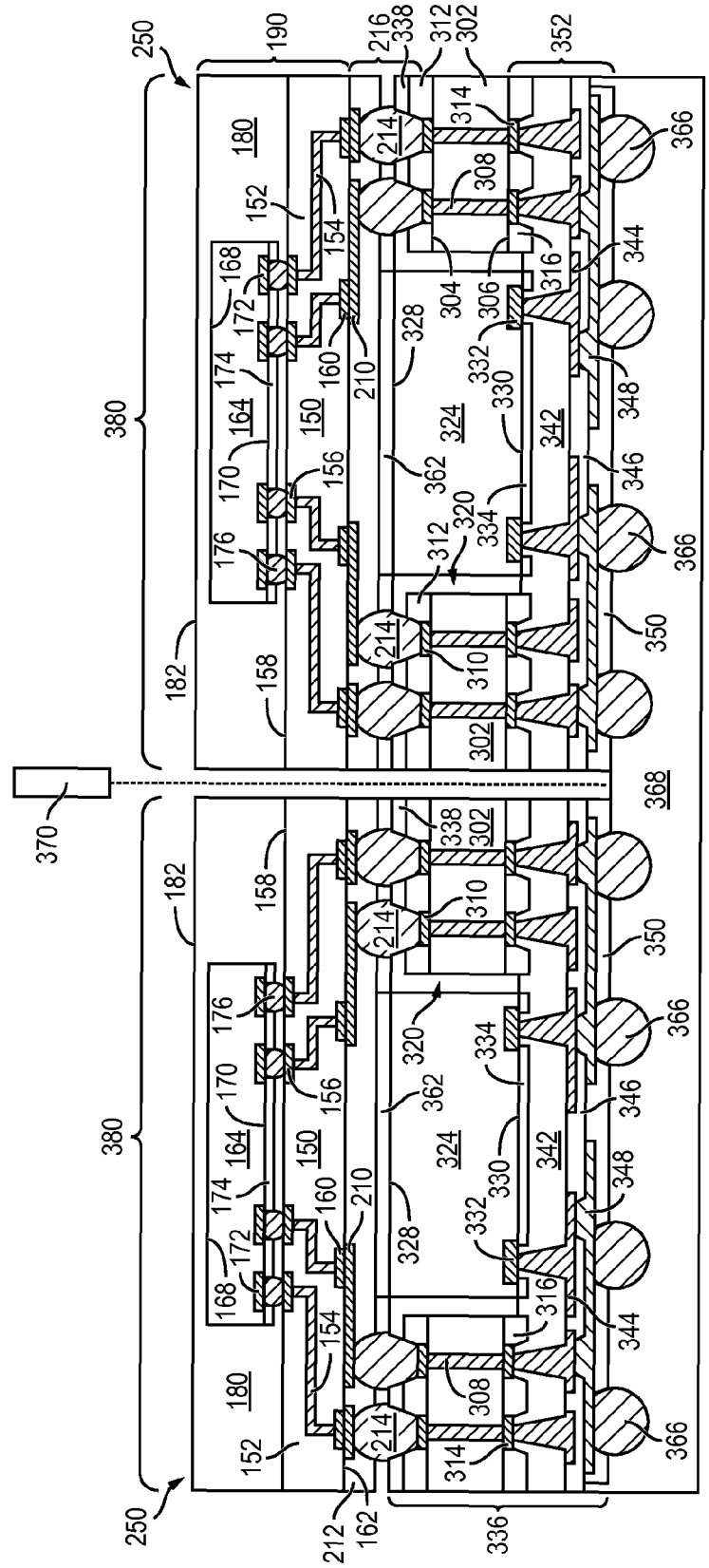
Figure 111:
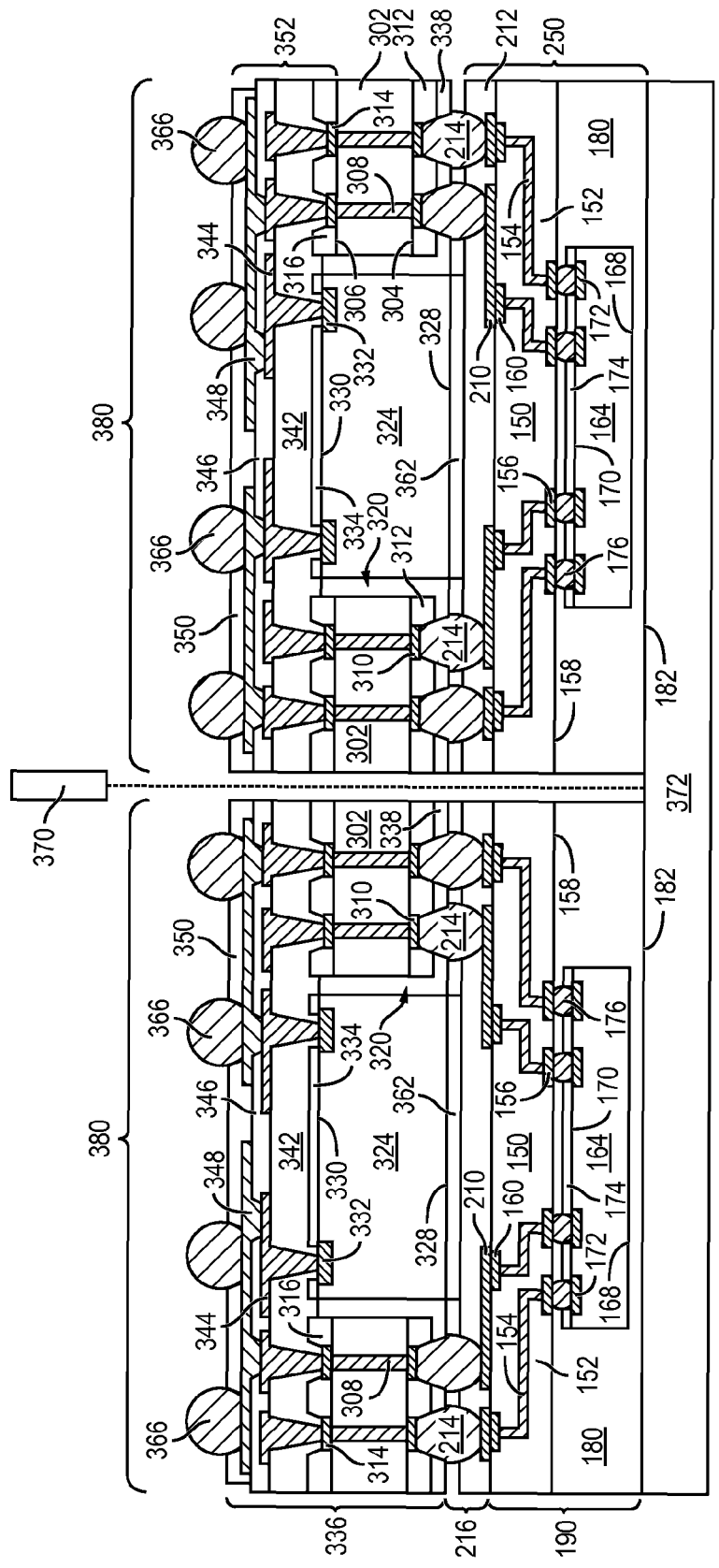

In FIG. 11k, thermal resistance tape 364 is removed and a dicing tape or support carrier 368 is disposed over insulating layer 350 and bumps 366. Reconstituted wafer 336 with attached semiconductor packages 250 is then singulated into individual PoP semiconductor devices 380 using a saw blade or laser cutting tool 370. Individual PoP semiconductor devices 380 each include a top semiconductor package 250 and a bottom semiconductor package comprised of semiconductor die 324, modular interconnect units 320, build-up interconnect structure 352, and bumps 366. Semiconductor packages 250 are oriented toward cutting tool 370 during singulation. Cutting tool 370 cuts through encapsulant 338, modular interconnect units 320, and build-up interconnect structure 352 to singulate PoP semiconductor devices 380. Dicing tape 368 provides support during singulation. Top semiconductor packages 250 are spaced over reconstituted wafer 336 such that there is a gap or opening between adjacent top semiconductor packages 250. The gap or opening allows cutting tool 370 to singulate reconstituted wafer 336 without damaging top semiconductor packages 250. In one embodiment, a distance or width between side surface 222 of top semiconductor package 250 and a side surface of the bottom package after singulation is greater than or equal to 20 µm, i.e., a footprint of the top semiconductor package is smaller than a footprint of the bottom package after singulation.

FIG. 11*l* illustrates an alternative singulation step in which thermal resistance tape 364 is removed and a dicing tape or support carrier 372 is disposed over semiconductor packages 250. Reconstituted wafer 336 with attached semiconductor packages 250 is then singulated with build-up interconnect structure 352 oriented toward cutting tool 370. Cutting tool 370 cuts through build-up interconnect structure 352, modular interconnect units 320, and encapsulant 338 to singulate PoP semiconductor devices 380. Dicing tape 372 provides support during singulation. Top semiconductor packages 250 are spaced over reconstituted wafer 336 such that there is a gap or opening between adjacent top semiconductor packages 250. The gap or opening allows cutting tool 370 to singulate reconstituted wafer 336 without damaging top semiconductor packages 250. In one embodiment, a distance or width between outer side surface 222 of top semiconductor package 250 and a side surface of the bottom package after singulation is greater than or equal to 20 µm, i.e., a footprint of the top semiconductor package is smaller than a footprint of the bottom package after singulation.

Figure 12:
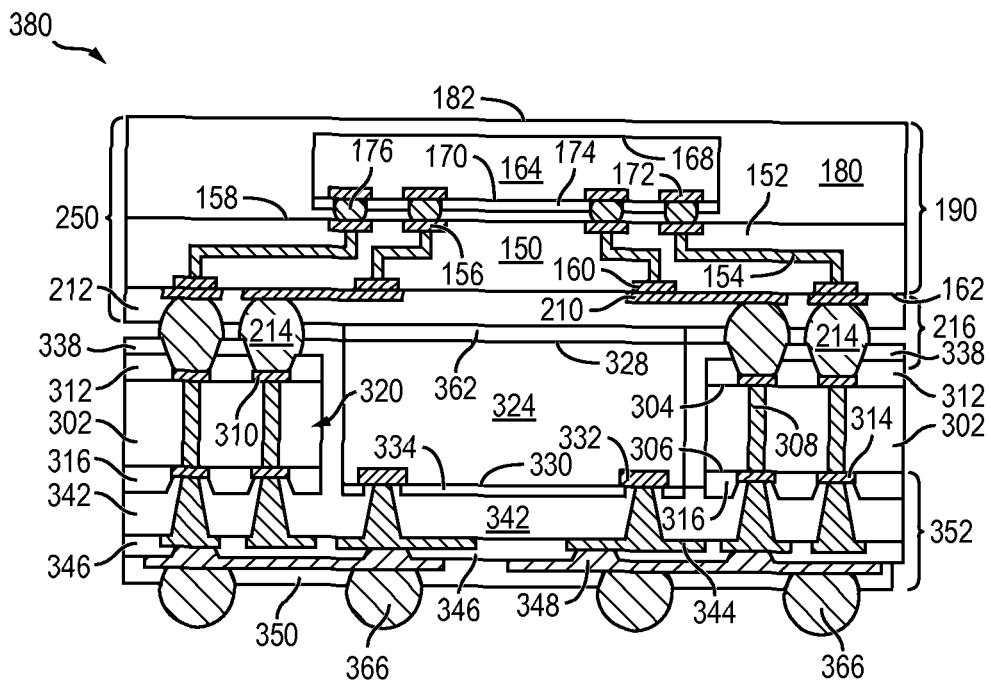
FIG. 12 illustrates a PoP semiconductor device having an RDL formed over the top semiconductor package.

FIG. 12 shows PoP semiconductor device 380 after singulation. PoP semiconductor device 380 includes a top semiconductor package 250 and a bottom semiconductor package comprised of semiconductor die 324, modular interconnect units 320, build-up interconnect structure 352, and bumps 366. Top semiconductor package 250 is electrically connected to semiconductor die 324 through modular interconnect units 320 and build-up interconnect structure 352. Top semiconductor package 250 and semiconductor die 324 are electrically connected through build-up interconnect structure 352 to bumps 366 for connection to external devices, for example a PCB. Top semiconductor package 250 includes semiconductor die 164, substrate 150, and build-up interconnect structure 216. Build-up interconnect structure 216 is formed over substrate 150 of semiconductor unit 190. Semiconductor die 164 is electrically connected through bumps 176 and substrate 150 to build-up interconnect structure 216. Conductive layer 210 of build-up interconnect structure 216 extends horizontally along surface 162 of substrate 150 to laterally redistribute the electrical interconnect to conductive layer 160 of substrate 150. Conductive layer 210 is patterned such that the location and pitch of bumps 214 coincide with the location and pitch of exposed contact pads 310 on modular interconnect units 320. Forming an RDL, e.g., conductive layer 210, over substrate 150 provides greater routing design flexibility and increases the functionality and integration compatibility of top semiconductor package 250 as conductive layer 210 can be patterned to match any bottom package, i.e., conductive layer 210 can patterned so that bumps 214 will align with any bottom package contact pad pattern or pitch.

In addition, elements that would otherwise be included in a backside interconnect structure or RDL formed over the bottom package of PoP semiconductor device 380, i.e., over surface 328 of semiconductor die 324 and conductive layer 310 of modular interconnect units 320, can be integrated as part of build-up interconnect structure 216 to simplify manufacturing and eliminate a need to form both front side and backside interconnects or RDLs over semiconductor die 324. Forming build-up interconnect structure 216 as a component of top semiconductor package 250, as opposed to forming RDL over both sides of semiconductor die 324, reduces the number of manufacturing steps taking place over reconstituted wafer 336. Reducing the number of manufacturing steps, i.e., insulating layer and conductive layer fabrication cycles, performed over reconstituted wafer 336 decreases the amount of thermal stress placed on reconstituted wafer 336 and prevents warpage. Accordingly, forming build-up interconnect structure 216 as a component of top semiconductor package 250 decreases manufacturing time while increasing the design flexibility and reliability of PoP semiconductor device 380.

Semiconductor units 190 are tested prior to mounting semiconductor units 190 to carrier 192. Accordingly, only known good semiconductor units 190 are incorporated into top packages 250. The functionality of top semiconductor package 250 is tested prior to mounting top semiconductor package 250 to reconstituted wafer 336. Thus, only known good top packages 250 are attached to reconstituted wafer 336. Finally, the functionality of semiconductor die 324, modular interconnect units 320, and build-up interconnect structure 352 is tested prior to mounting top packages 250, thus ensuring that top packages 250 are mounted to only known good bottom packages. Using only known good components to fabricate PoP semiconductor device 380 prevents manufacturing time and materials from being wasted fabricating a defective device. Thus, the yield of reliable PoP semiconductor devices 380 is increased and overall cost per unit is reduced.

Figure 13:
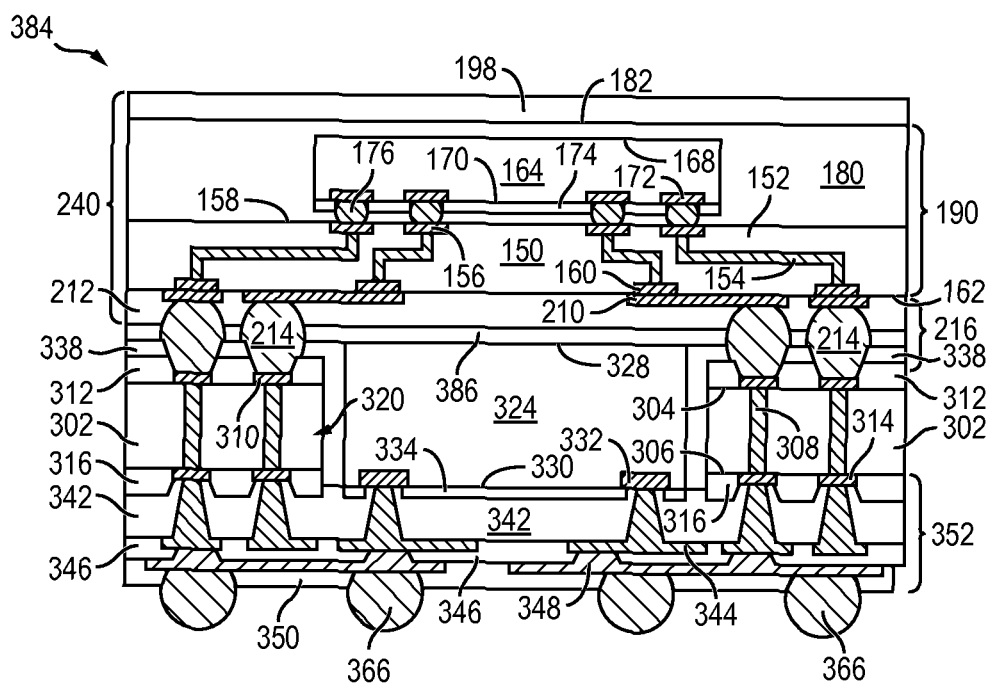
FIG. 13 illustrates a PoP semiconductor device having an underfill material between the top semiconductor package and bottom semiconductor package.

FIG. 13 shows a PoP semiconductor device 384, similar to PoP semiconductor device 380 in FIG. 12, with semiconductor package 240 from FIG. 4*c* as the top semiconductor package. An underfill material is 386 is deposited between semiconductor packages 240 and reconstituted wafer 336 prior to singulation using a paste printing, jet dispense, compressive molding, transfer molding, liquid encapsulant molding, vacuum lamination, spin coating, mold underfill, or other suitable application process. Underfill 386 can be epoxy, epoxy-resin adhesive material, polymeric materials, films, or other non-conductive materials. Underfill 386 is non-conductive and environmentally protects the semiconductor device from external elements and contaminants. Underfill 386 aids in the attachment and securement of top semiconductor package 240. After the deposition of underfill material 386, reconstituted wafer 336 with attached packages 240 is singulated into individual PoP semiconductor devices 384, as shown in either FIG. 11*k* or 11*l*. Individual PoP semiconductor devices 384 each include a top semiconductor package 240 and a bottom semiconductor package comprised of semiconductor die 324, modular interconnect units 320, build-up interconnect structure 352, and bumps 366. In the present embodiment, semiconductor package 240 is used by way of example. PoP semiconductor device 384 may be formed using any of the semiconductor packages shown in FIGS. 4*a*-4*d*, 5*a*-5*d*, 7*a*-7*d*, 9*a*-9*d*, and 20*f*-20*g* as a top semiconductor package.

Top semiconductor package 240 is electrically connected to semiconductor die 324 through modular interconnect units 320 and build-up interconnect structure 352. Top semiconductor package 240 and semiconductor die 324 are electrically connected through build-up interconnect structure 352 to bumps 366 for connection to external devices, for example a PCB. Top semiconductor package 240 includes semiconductor die 164, substrate 150, and build-up interconnect structure 216. Build-up interconnect structure 216 is formed over substrate 150 of semiconductor unit 190. Semiconductor die 164 is electrically connected through bumps 176 and substrate 150 to build-up interconnect structure 216. Conductive layer 210 of build-up interconnect structure 216 extends horizontally along surface 162 of substrate 150 to laterally redistribute the electrical interconnect to conductive layer 160 of substrate 150. Conductive layer 210 is patterned such that the location and pitch of bumps 214 coincide with the location and pitch of exposed contact pads 310 on modular interconnect units 320. Forming an RDL, e.g., conductive layer 210, over substrate 150 provides greater routing design flexibility and increases the functionality and integration compatibility of top semiconductor package 240 as conductive layer 210 can be patterned to match any bottom package, i.e., conductive layer 210 can patterned so that bumps 214 will align with any bottom package contact pad pattern or pitch.

In addition, elements that would otherwise be included in a backside interconnect structure or RDL formed over the bottom package of PoP semiconductor device 384, i.e., over surface 328 of semiconductor die 324 and conductive layer 310 of modular interconnect units 320, can be integrated as part of build-up interconnect structure 216 to simplify manufacturing and eliminate a need to form both front side and backside interconnects or RDLs over semiconductor die 324. Forming build-up interconnect structure 216 as a component of top semiconductor package 240, as opposed to forming RDL over both sides of semiconductor die 324, reduces the number of manufacturing steps taking place over reconstituted wafer 336. Reducing the number of manufacturing steps, i.e., insulating layer and conductive layer fabrication cycles, performed over reconstituted wafer 336 decreases the amount of thermal stress placed on reconstituted wafer 336 and prevents warpage. Accordingly, forming build-up interconnect structure 216 as a component of top semiconductor package 240 decreases manufacturing time while increasing the design flexibility and reliability of PoP semiconductor device 384.

Semiconductor units 190 are tested prior to mounting semiconductor units 190 to carrier 192. Accordingly, only known good semiconductor units 190 are incorporated into top packages 240. The functionality of top semiconductor package 240 is tested prior to mounting top semiconductor package 240 to reconstituted wafer 336. Thus, only known good top packages 240 are attached to reconstituted wafer 336. Finally, the functionality of semiconductor die 324, modular interconnect units 320, and build-up interconnect structure 352 is tested prior to mounting top packages 240 thus ensuring that top packages 240 are mounted to only known good bottom packages. Using only known good components to fabricate PoP semiconductor device 384 prevents manufacturing time and materials from being wasted fabricating a defective device. Thus, the yield of reliable PoP semiconductor devices 384 is increased and overall cost per unit is reduced.

Figure 14C:
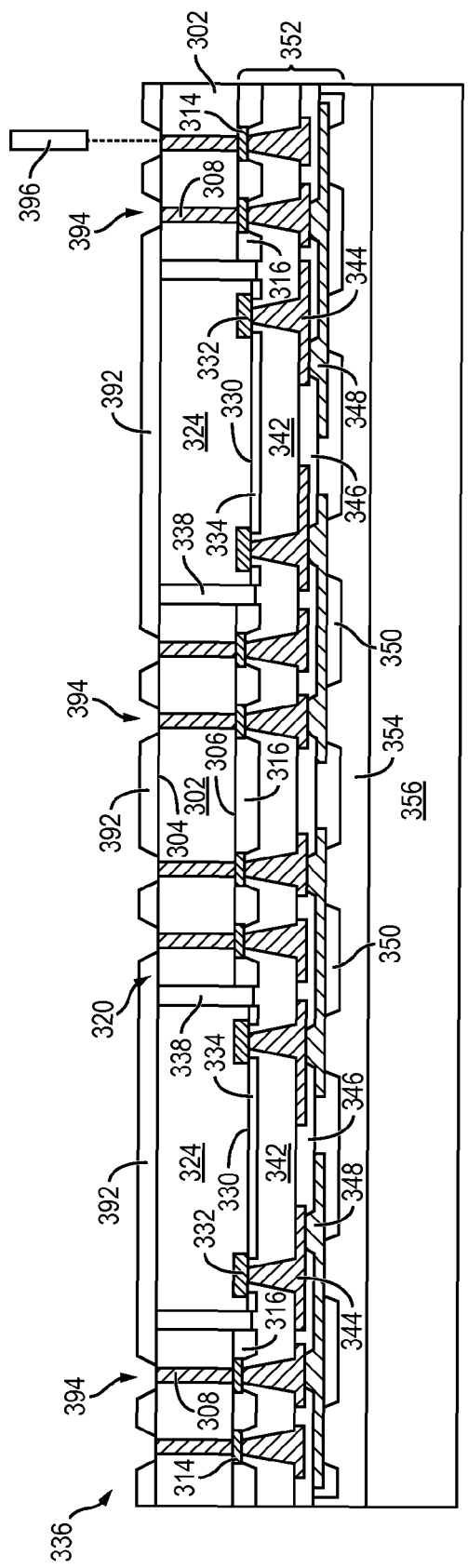

FIGS. 14a-14f illustrate, in relation to FIG. 1, another process of forming a PoP semiconductor device. Continuing from FIG. 11g, FIG. 14a shows reconstituted wafer 336 disposed over interface layer 354 and optional carrier 356. A portion of encapsulant 338 is removed from surface 340 of encapsulant 338 in a backgrinding operation using grinder 390. The grinding operation also removes a portion of semiconductor die 324 from back surface 328 and a portion of vertical interconnect units 320 to expose conductive vias 308.

In FIG. 14b, a backside protection or warpage balance layer 392 is applied over modular interconnect units 320, encapsulant 338, and semiconductor die 324 using PVD, CVD, printing, lamination, spin coating, spray coating, sintering, or thermal oxidation. Warpage balance layer 392 contains one or more layers of SiO2, Si3N4, SiON, Ta2O5, Al2O3, or other material having similar insulating and structural properties. Warpage balance layer 392 protects semiconductor die 324 and provides a warpage tuning capability for reconstituted wafer 336. Warpage balance layer 392 also provides structural support to the package. Warpage balance layer 392 can also act as a heat sink to enhance thermal dissipation from semiconductor die 324. Warpage balance layer 392 can be any suitable balance layer with suitable thermal and structural properties, such as RCC tape. In one embodiment, warpage balance layer 392 contains a snap-cure thermoset adhesive.

In FIG. 14c, a plurality of openings 394 are formed through warpage balance layer 392 by LDA using laser 396. Openings 394 expose conductive vias 308. After openings 394 are formed, reconstituted wafer 336 undergoes a desmearing or cleaning process, including a particle and organic residue wet clean, such as a single wafer pressure jetting clean with a suitable solvent, or alkali and carbon dioxide bubbled deionized water, in order to remove any particles or residue from the drilling process. A plasma clean is also performed to clean any contaminants from the exposed conductive vias 308, using RIE or downstream/microwave plasma with O2 and one or more of CF4, N2, or H2O2. In one embodiment, a finish such as Cu OSP is applied to the exposed portions of conductive vias 308 to prevent Cu oxidation.

Figure 14D:
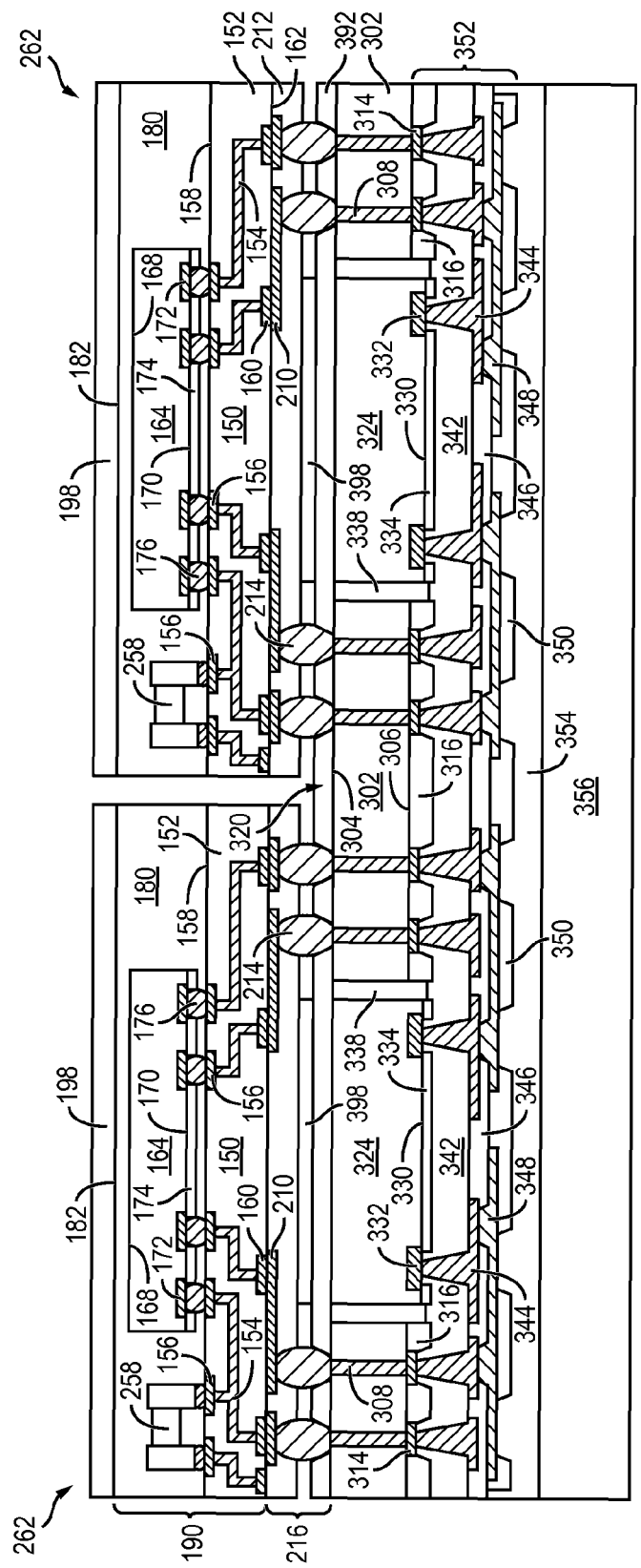

In FIG. 14d, semiconductor packages 262, from FIG. 5c, are disposed over reconstituted wafer 336 using, for example, a pick and place operation. Bumps 214 of semiconductor package 262 are oriented toward reconstituted wafer 336 and are aligned with conductive vias 308 of modular interconnect units 320. Semiconductor package 262 is used by way of example in the present embodiment. Any of the semiconductor packages or combination of the semiconductor packages from FIGS. 4a-4d, 5a-5d, 7a-7d, 9a-9d, and 20f-20g can be disposed over reconstituted wafer 336.

An optional adhesive 398 is dispensed over warpage balance layer 392 or over semiconductor packages 262 prior to mounting semiconductor packages 262. Adhesive 398 can include epoxy resin, thermoplastic resin, acrylate monomer, a hardening accelerator, organic filler, silica filler, or polymer filler. Adhesive 398 facilities and strengthens the attachment of semiconductor packages 262. In one embodiment, adhesive 398 improves thermal conductivity between the top and bottom semiconductor packages, improving the overall reliability of the final PoP semiconductor device. Bumps 214 are reflowed to metallurgically and electrically connect to conductive vias 308. In some applications, bumps 214 are reflowed a second time to improve electrical contact to conductive vias 308. Bumps 214 can also be compression bonded or thermocompression bonded to conductive vias 308. Optional carrier 356 provides support and prevents warpage during attachment of semiconductor packages 262.

Figure 14E:
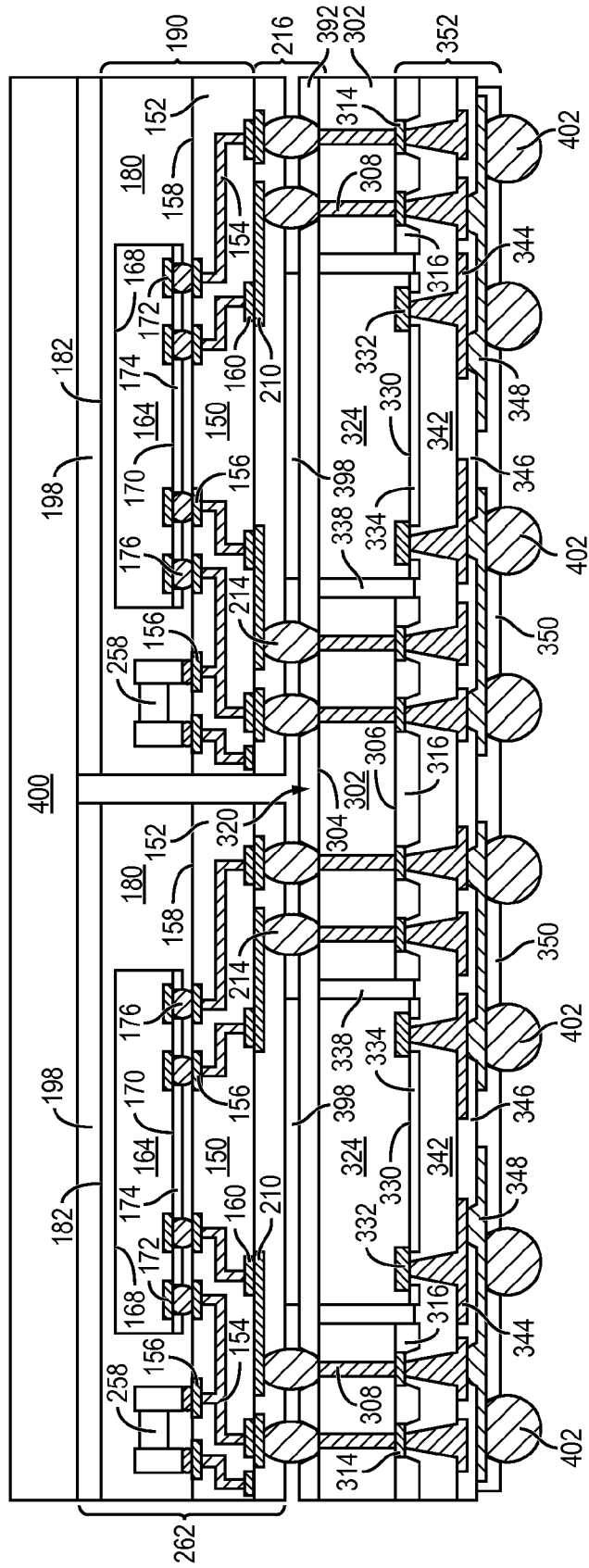

FIG. 14e shows an optional backside thermal resistance tape 400 disposed over semiconductor packages 262. Optional carrier 356 and interface layer 354 are removed by chemical etching, mechanical peeling, CMP, mechanical grinding, thermal bake, UV light, laser scanning, or wet stripping to expose insulating layer 350 and conductive layer 348 of build-up interconnect structure 352. In one embodiment, the openings in insulating layer 350 that expose conductive layer 348 are formed after the removal of optional carrier 356 and interface layer 354.

An electrically conductive bump material is deposited over conductive layer 348 using an evaporation, electrolytic plating, electroless plating, ball drop, or screen printing process. In one embodiment, the bump material is deposited with a ball drop stencil, i.e., no mask required. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 348 using a suitable attachment or bonding process. In one embodiment, the bump material is reflowed by heating the material above the material's melting point to form balls or bumps 402. In some applications, bumps 402 are reflowed a second time to improve electrical contact to conductive layer 348. Bumps 402 can also be compression bonded or thermocompression bonded to conductive layer 348. In one embodiment, bumps 402 are formed over a UBM layer having a wetting layer, barrier layer, and adhesive layer. Bumps 402 represent one type of interconnect structure that can be formed over conductive layer 348. The interconnect structure can also use bond wires, conductive paste, stud bump, micro bump, or other electrical interconnect. Thermal resistance tape 400 supports reconstituted wafer 336 and semiconductor packages 262 and prevents warpage during formation of bumps 402.

Figure 14F:
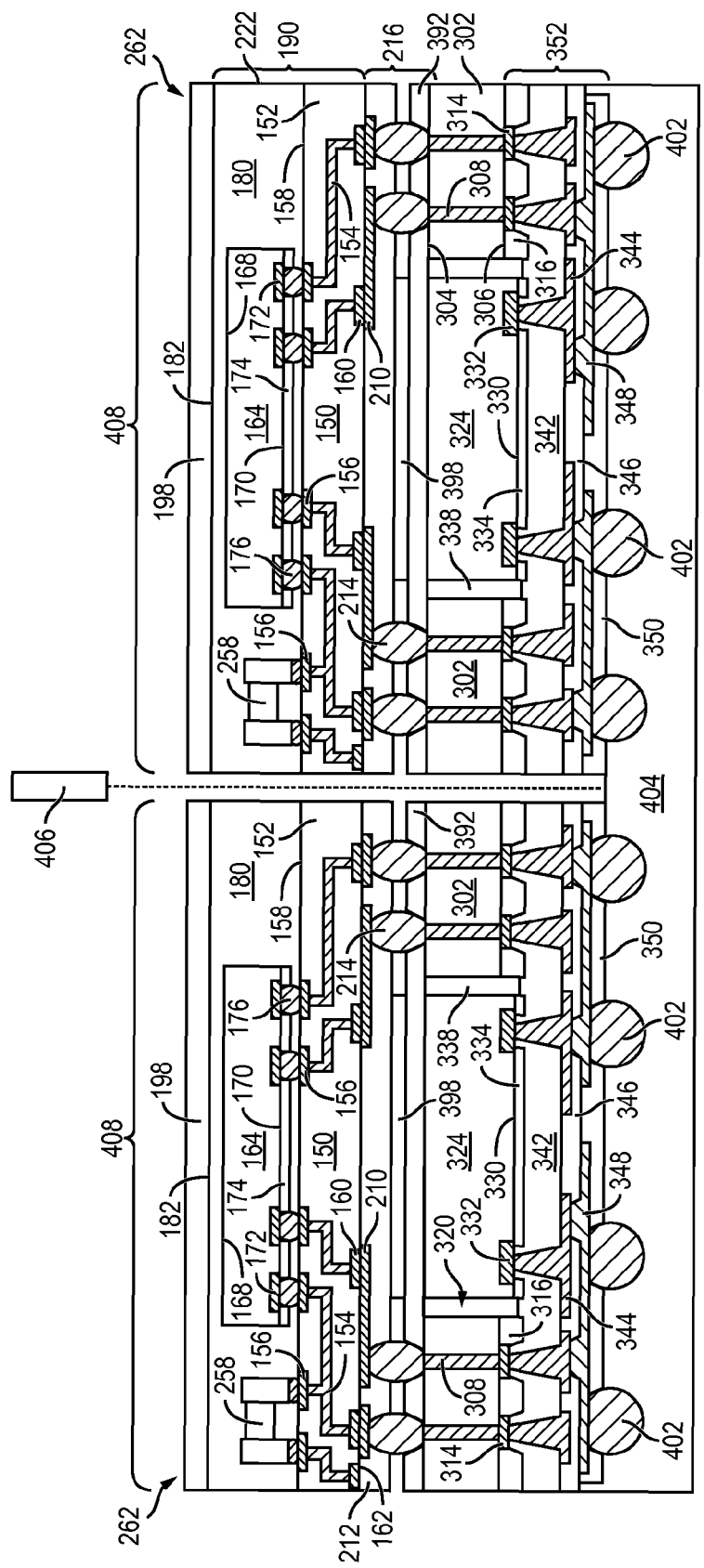

In FIG. 14f, thermal resistance tape 400 is removed and a dicing tape or support carrier 404 is disposed over insulating layer 350 and bumps 366. Reconstituted wafer 336 with attached semiconductor packages 262 is then singulated into individual PoP semiconductor devices 408 using a saw blade or laser cutting tool 406. Individual PoP semiconductor devices 408 each include a top semiconductor package 262 and a bottom semiconductor package comprised of semiconductor die 324, modular interconnect units 320, build-up interconnect structure 352, and bumps 402. Semiconductor packages 262 are oriented toward cutting tool 406 during singulation. Cutting tool 406 cuts through warpage balance layer 392, modular interconnect units 320, and build-up interconnect structure 352 to singulate PoP semiconductor devices 408. Dicing tape 404 provides support during singulation. Alternatively, thermal resistance tape 364 is removed and a dicing tape or support carrier is disposed over semiconductor packages 262, as shown in FIG. 11l. Reconstituted wafer 336 with attached semiconductor packages 262 is then singulated with build-up interconnect structure 352 oriented toward the cutting tool. The cutting tool cuts through build-up interconnect structure 352, modular interconnect units 320, and warpage balance layer 392 to singulate PoP semiconductor devices 408. Top semiconductor packages 262 are spaced over reconstituted wafer 336 such that there is a gap or opening between adjacent top semiconductor packages 262. The gap or opening allows cutting tool 406 to singulate reconstituted wafer 336 without damaging top semiconductor packages 262. In one embodiment, a distance or width between a side surface 222 of top semiconductor package 262 and a side surface of the bottom package after singulation is greater than or equal to 20 μm, i.e., a footprint of top semiconductor package 262 is smaller than a footprint of the bottom package after singulation.

Figure 15:
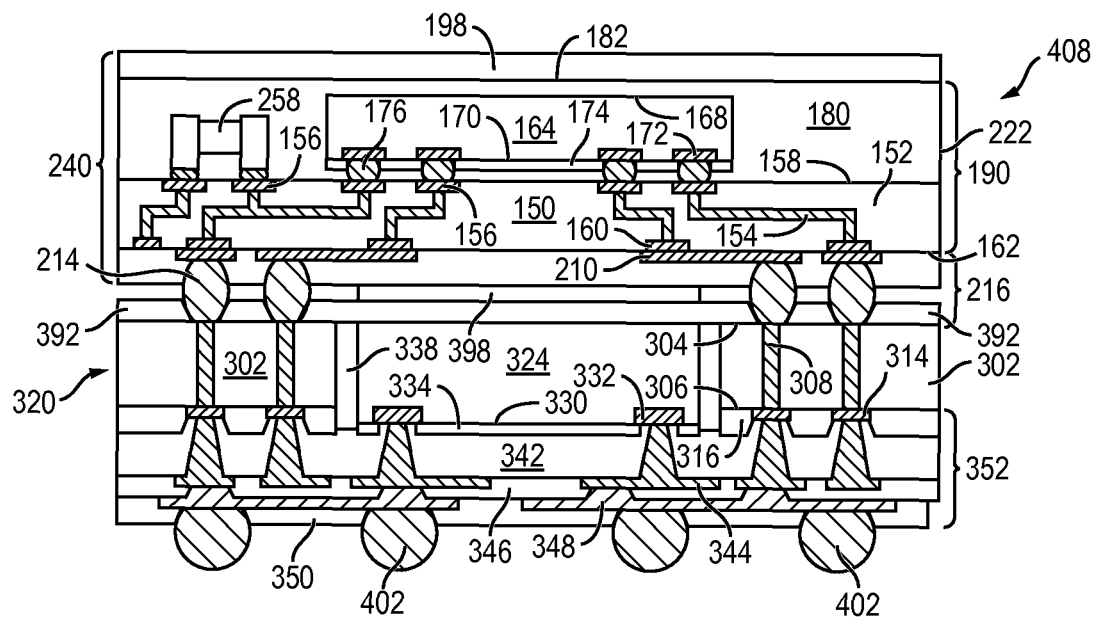
FIG. 15 illustrates a PoP semiconductor device with a warpage balance layer formed over the bottom semiconductor package.

FIG. 15 shows PoP semiconductor device 408 after singulation. Top semiconductor package 262 is electrically connected to semiconductor die 324 through modular interconnect units 320 and build-up interconnect structure 352. Top semiconductor package 262 and semiconductor die 324 are electrically connected through build-up interconnect structure 352 to bumps 402 for connection to external devices, for example a PCB. Top semiconductor package 262 includes semiconductor die 164, discrete device 258, substrate 150, and build-up interconnect structure 216. Build-up interconnect structure 216 is formed over substrate 150 of semiconductor unit 190. Semiconductor die 164 is electrically connected through bumps 176 and substrate 150 to build-up interconnect structure 216. Conductive layer 210 of build-up interconnect structure 216 extends horizontally along surface 162 of substrate 150 to laterally redistribute the electrical interconnect to conductive layer 160 of substrate 150. Conductive layer 210 is patterned such that the location and pitch of bumps 214 coincide with the location and pitch of exposed conductive vias 308 of modular interconnect units 320. Forming an RDL, e.g., conductive layer 210, over substrate 150 provides greater routing design flexibility and increases the functionality and integration compatibility of top semiconductor package 262 as conductive layer 210 can be patterned to match any bottom package, i.e., conductive layer 210 can patterned so that bumps 214 will align with any bottom package conductive via pattern or pitch.

In addition, elements that would otherwise be included in a backside interconnect structure or RDL formed over the bottom package of PoP semiconductor device 408, i.e., over warpage balance layer 392, can be integrated as part of build-up interconnect structure 216 to simplify manufacturing and eliminate a need to form both front side and backside interconnects or RDLs over semiconductor die 324. Forming build-up interconnect structure 216 as a component of top semiconductor package 262, as opposed to forming RDL over both sides of semiconductor die 324, reduces the number of manufacturing steps taking place over reconstituted wafer 336. Reducing the number of manufacturing steps, i.e., insulating layer and conductive layer fabrication cycles, performed over reconstituted wafer 336 decreases the amount of thermal stress placed on reconstituted wafer 336 and prevents warpage. Accordingly, forming build-up interconnect structure 216 as a component of top semiconductor package 262 decreases manufacturing time while increasing the design flexibility and reliability of PoP semiconductor device 408. Warpage balance layer 392 provides warpage-tuning capability for reconstituted wafer 336 and provides structural support between the top and bottom semiconductor packages increasing the reliability of PoP semiconductor device 408.

Semiconductor units 190 are tested prior to mounting semiconductor units 190 to carrier 192. Accordingly, only known good semiconductor units 190 are incorporated into top packages 262. The functionality of top semiconductor package 262 is tested prior to mounting top semiconductor package 262 to reconstituted wafer 336. Thus, only known good top packages 262 are attached to reconstituted wafer 336. Finally, the functionality of semiconductor die 324, modular interconnect units 320, and build-up interconnect structure 352 is tested prior to mounting top packages 262 thus ensuring that top packages 262 are mounted to only known good bottom packages. Using only known good components to fabricate PoP semiconductor device 408 prevents manufacturing time and materials from being wasted fabricating a defective device. Thus, the yield of reliable PoP semiconductor devices 408 is increased and overall cost per unit is reduced.

Figure 16B:
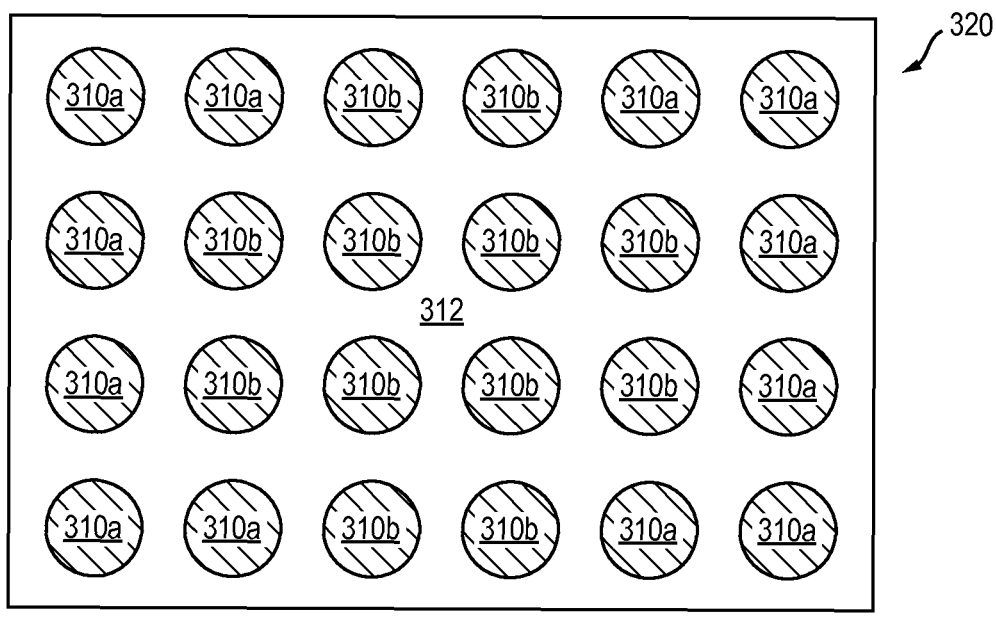
FIGS. 16a-16b illustrate a PoP semiconductor device having dummy bumps formed between the top semiconductor package and bottom semiconductor package.
Figure 16A:
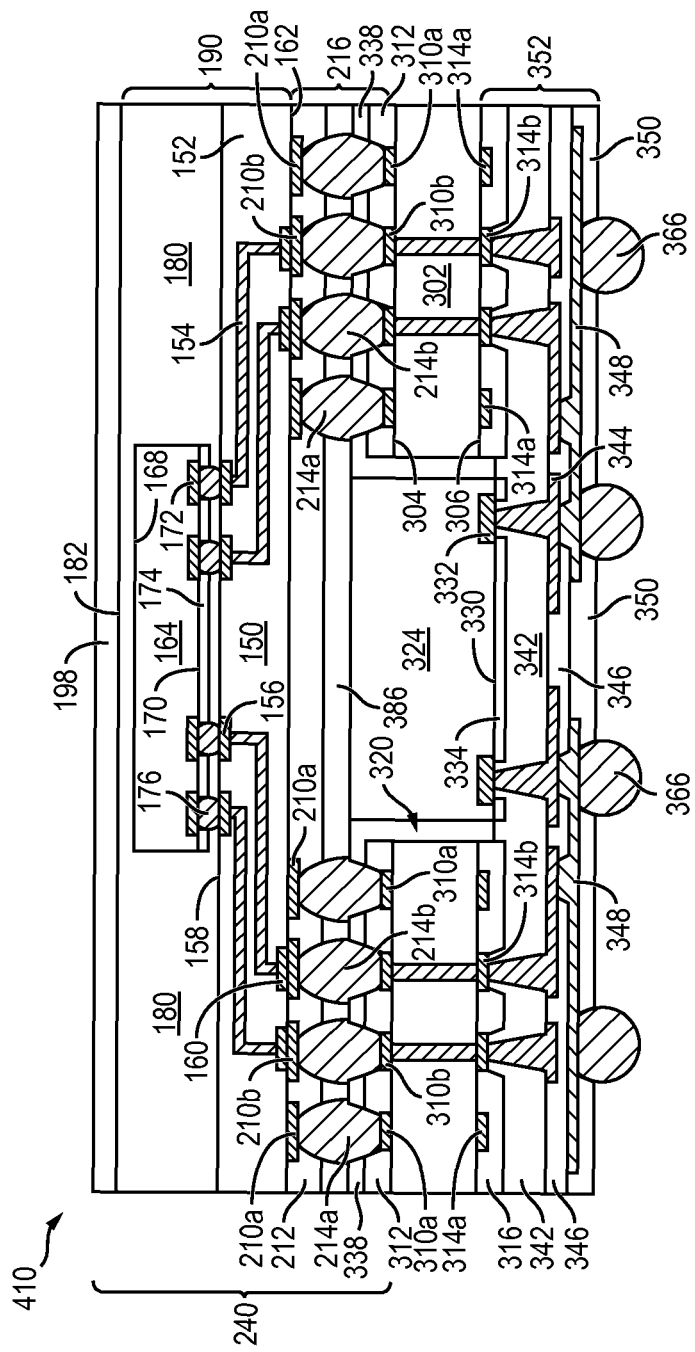

FIG. 16a illustrates, in relation to FIG. 1, a PoP semiconductor device 410, similar to PoP semiconductor device 384 in FIG. 13. PoP semiconductor device 410 includes semiconductor package 240, from FIG. 4c, disposed over semiconductor die 324 and electrically connected to modular interconnect units 320. In PoP semiconductor device 410, conductive layer 210 of build-up interconnect structure 216 is patterned to include a plurality of dummy contact pads 210a and live contact pads 210b. Conductive layer 310 of modular interconnect unit 320 is patterned to include a plurality of dummy contact pads 310a and live contact pads 310b. A plurality of dummy bumps 214a is formed between dummy contact pads 210a and 310a. A plurality of live bumps 214b is formed between live contact pads 210b and 310b. Semiconductor die 164 is electrically connected to conductive vias 308 via live bumps 214b and live contacts pads 210b and 310b. As used herein, the term "dummy" refers to contact pads and bumps formed not for electrical interconnection, but for mechanical interconnection only, and the term "live" refers to contact pads and bumps that provide electrical interconnection. Dummy bumps 214a and dummy contact pads 210a and 310a increase the reliability of PoP semiconductor device 410 by increasing the mechanical bonding strength between top semiconductor package 240 and modular interconnect units 320.

Conductive layer 314 of modular interconnect unit 320 may also be pattered to include a plurality of dummy contact pads 314a in addition to live contact pads 314b. Dummy contact pads 314a are formed such that the surface area of surface 306 covered by dummy contact pads 314a and live contact pads 314b is approximately equal to the surface area of surface 304 covered by dummy contact pads 310a and live contact pads 310b. Balancing the total area of surface 306 covered by dummy pads 314a and live pads 314b and the area of surface 304 covered by dummy pads 310a and live pads 310b reduces warpage of modular interconnect units 320 and increases the reliability of PoP semiconductor device 410.

In one embodiment, dummy contact pads 310a are formed in a row running along the outer edges of modular interconnect units 320, distal to semiconductor die 324 and in a row along the inner edges of modular interconnect units 320, proximate to semiconductor die 324. FIG. 16b shows a plan view of an example contact pad layout of modular interconnect unit 320. Dummy contact pads 310a are formed along the outer edges of modular interconnect unit 320 and are concentrated at the four corners of modular interconnect units 320.

Figure 17:
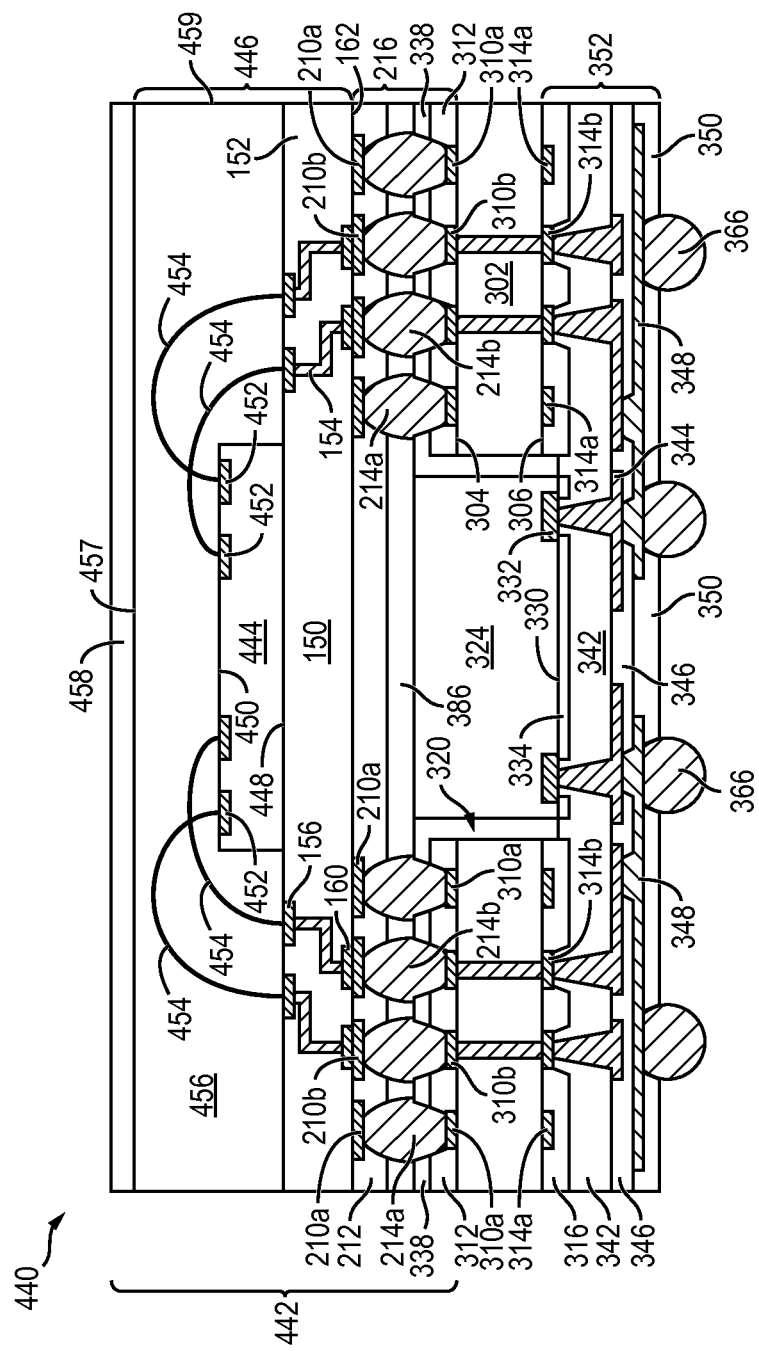
FIG. 17 illustrates a PoP semiconductor device having wire bonds formed between the semiconductor die and substrate in the top semiconductor package.

FIG. 17 illustrates, in relation to FIG. 1, another PoP semiconductor device 440, similar to PoP semiconductor device 410 in FIG. 16a. PoP semiconductor device 440 includes a top semiconductor package 442 and a bottom semiconductor package comprised or semiconductor die 324, modular interconnect units 320, build-up interconnect structure 352, and bumps 366. Top semiconductor package 442 is disposed over semiconductor die 324 and electrically connected to modular interconnect units 320. Top semiconductor package 442 includes a semiconductor die 444 disposed over substrate 150. Semiconductor die 444 has a back or non-active surface 448 and an active surface 450 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 450 to implement analog circuits or digital circuits, such as DSP, ASIC, MEMS, memory, or other signal processing circuit. In one embodiment, active region 450 contains a MEMS, such as an accelerometer, gyroscope, strain gauge, microphone, or other sensor responsive to various external stimuli. Semiconductor die 444 may also contain IPDs, such as inductors, capacitors, and resistors, for RF signal processing.

An electrically conductive layer 452 is formed over active surface 450 using PVD, CVD, electrolytic plating, electroless plating process, or other suitable metal deposition process. Conductive layer 452 includes one or more layers of Al, Cu, Sn, Ni, Au, Ag, Ti, TiW, W, or other suitable electrically conductive material or combination thereof. Conductive layer 452 operates as contact pads electrically connected to the circuits on active surface 450. Conductive layer 452 is formed as contact pads disposed side-by-side a first distance from the edge of semiconductor die 444. Alternatively, conductive layer 452 is formed as contact pads that are offset in multiple rows such that a first row of contact pads is disposed a first distance from the edge of the die, and a second row of contact pads alternating with the first row is disposed a second distance from the edge of the die.

A plurality of wire bonds 454 is formed between contact pads 452 of semiconductor die 444 and conductive layer 156 of substrate 150. Wire bonds 454 electrically connect semiconductor die 444 to conductive layer 156. After forming wire bonds 454, an encapsulant 456 is deposited semiconductor die 444 and substrate 150 to form a reconstituted wafer. The reconstituted wafer is singulated into individual semiconductor units 446.

Semiconductor units 446 are disposed over a carrier and encapsulant 458 is deposited over the semiconductor units and carrier to form a reconstituted wafer, similar to wafer 196. A backgrinding operation is performed to thin the reconstituted wafer and leave a portion of encapsulant 458 over surface 457 of encapsulant 456. Alternatively, encapsulant 458 may be completely removed from over surface 457 of encapsulant 456. Build-up interconnect structure 216 is then formed over a footprint of semiconductor units 446. Conductive layer 210 of build-up interconnect structure 216 is formed to include a plurality of dummy contact pads 210a in addition to live contact pads 210b. After forming build-up interconnect structure 216, the reconstituted wafer is singulated into individual semiconductor packages 442. The singulation process removes encapsulant 458 from over side surfaces 459 of semiconductor units 446. Alternatively, a portion of encapsulant 458 remains over side surfaces 459, similar to encapsulant 198 in FIG. 4a.

Semiconductor packages 442 are then disposed over reconstituted wafer 336, which is formed as shown in FIGS. 11a-11h. Conductive layer 310 of modular interconnect unit 320 includes a plurality of dummy contact pads 310a in addition to live contact pads 310b. A plurality of dummy bumps 214a is formed between dummy contact pads 210a of build-up interconnect structure 216 and dummy contact pads 310a of modular interconnect units 320. A plurality of live bumps 214b are formed between live contact pads 210b of build-up interconnect structure 216 and live contact pads 310b of modular interconnect units 320. Semiconductor die 444 is electrically connected to conductive vias 308 via live bumps 214b and live contacts pads 210b and 310b. Dummy bumps 214a and dummy contact pads 210a and 310a increase the reliability of PoP semiconductor device 440 by increasing the mechanical bonding strength between top semiconductor package 442 and modular interconnect units 320. In one embodiment, dummy contact pads 310a are formed in a row running along the outer edges of modular interconnect units 320 distal to semiconductor die 324, in a row along the inner edges of modular interconnect units 320 proximate to semiconductor die 324, and at the four corners of modular interconnect units 320, similar to the layout shown in FIG. 16b. Conductive layer 314 of modular interconnect unit 320 may be patterned to include a plurality of dummy contact pads 314a, in addition to live contact pads 314b. Dummy contact pads 314a are formed such that the surface area of surface 306 covered by dummy contact pads 314a and live contact pads 314b is approximately equal to the surface area of surface 304 covered by dummy contact pads 310a and live contact pads 310b. Balancing the total surface area covered by dummy pads 314a and live pads 314b and the surface area covered by dummy pads 310a and live pads 310b reduces warpage of modular interconnect units 320 and increases the reliability of PoP semiconductor device 440.

Reconstituted wafer 336 with attached semiconductor packages 442 is then singulated, as shown in either FIG. 11k or 11l, into individual PoP semiconductor devices 440.

FIG. 17 shows PoP semiconductor device 440 after singulation. PoP semiconductor device 440 includes top semiconductor package 442 and a bottom semiconductor package comprised of semiconductor die 324, modular interconnect units 320, build-up interconnect structure 352, and bumps 366. Top semiconductor package 442 is electrically connected to semiconductor die 324 through modular interconnect units 320 and build-up interconnect structure 352. Top semiconductor package 442 and semiconductor die 324 are electrically connected through build-up interconnect structure 352 to bumps 366 for connection to external devices, for example a PCB. Top semiconductor package 442 includes semiconductor die 444, substrate 150, and build-up interconnect structure 216. Build-up interconnect structure 216 is formed over substrate 150 of semiconductor unit 446. Semiconductor die 444 is electrically connected through bond wires 454 and substrate 150 to build-up interconnect structure 216. Conductive layer 210 of build-up interconnect structure 216 extends horizontally along surface 162 of substrate 150 to laterally redistribute the electrical interconnect to conductive layer 160 of substrate 150. Conductive layer 210 is patterned such that the location and pitch of live bumps 214b coincide with the location and pitch of exposed live contact pads 310b, and such that the location and pitch of dummy bumps 214a coincide with the location and pitch of exposed dummy contact pads 310a. Forming an RDL, e.g., conductive layer 210, over substrate 150 provides greater routing design flexibility and increases the functionality and integration compatibility of top semiconductor package 442 as conductive layer 210 can be patterned to match any bottom package, i.e., conductive layer 210 can patterned so that bumps 214 will align with any bottom package contact pad pattern or pitch.

In addition, elements that would otherwise be included in a backside interconnect structure or RDL formed over the bottom package of PoP semiconductor device 440, i.e., over surface 328 of semiconductor die 324 and conductive layer 310 of modular interconnect units 320, can be integrated as part of build-up interconnect structure 216 to simplify manufacturing and eliminate a need to form both front side and backside interconnects or RDLs over semiconductor die 324. Forming build-up interconnect structure 216 as a component of top semiconductor package 442, as opposed to forming RDL over both sides of semiconductor die 324, reduces the number of manufacturing steps taking place over reconstituted wafer 336. Reducing the number of manufacturing steps, i.e., insulating layer and conductive layer fabrication cycles, performed over reconstituted wafer 336 decreases the amount of thermal stress placed on reconstituted wafer 336 and prevents warpage.

Accordingly, forming build-up interconnect structure 216 as a component of top semiconductor package 442 decreases manufacturing time while increasing the design flexibility and reliability of PoP semiconductor device 440.

The functionality of semiconductor unit 446 is tested prior to incorporation into semiconductor package 442 to ensure only known good semiconductor units 446 are used to form top packages 442. Top semiconductor package 442 is tested prior to mounting top semiconductor package 442 to reconstituted wafer 336. Thus, only known good top packages 442 are attached to reconstituted wafer 336. Finally, the functionality of semiconductor die 324, modular interconnect units 320, and build-up interconnect structure 352 is tested prior to mounting top packages 442 thus ensuring that top packages 442 are mounted to only known good bottom packages. Using only known good components to fabricate PoP semiconductor device 440 prevents manufacturing time and materials from being wasted fabricating a defective device. Thus, the yield of reliable PoP semiconductor devices 440 is increased and overall cost per unit is reduced.

Figure 18:
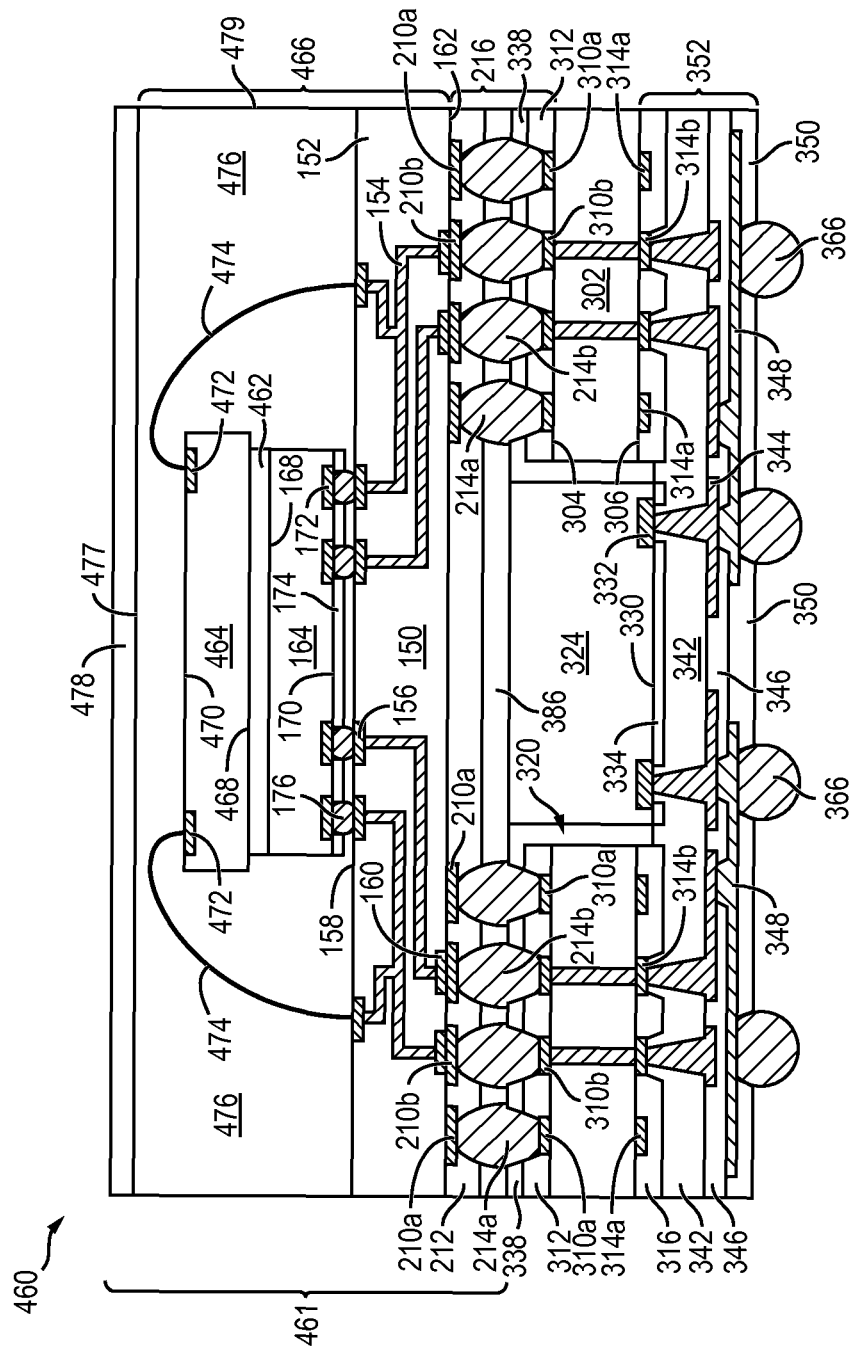
FIG. 18 illustrates a PoP semiconductor device having a top semiconductor package with stacked semiconductor die.

FIG. 18 illustrates, in relation to FIG. 1, a PoP semiconductor device 460, similar to PoP semiconductor device 410 in FIG. 16a. PoP semiconductor device 460 includes a top semiconductor package 461 and a bottom semiconductor package comprised of semiconductor die 324, modular interconnect units 320, build-up interconnect structure 352, and bumps 366. Top semiconductor package 461 is disposed over semiconductor die 324 and electrically connected to modular interconnect units 320. Top semiconductor package 461 includes stacked semiconductor die 164 and 464. Semiconductor die 464 has a back or non-active surface 468 and an active surface 470 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 470 to implement analog circuits or digital circuits, such as DSP, ASIC, MEMS, memory, or other signal processing circuit. In one embodiment, active region 470 contains a MEMS, such as an accelerometer, gyroscope, strain gauge, microphone, or other sensor responsive to various external stimuli. Semiconductor die 464 may also contain IPDs, such as inductors, capacitors, and resistors, for RF signal processing.

An electrically conductive layer 472 is formed over active surface 470 using PVD, CVD, electrolytic plating, electroless plating process, or other suitable metal deposition process. Conductive layer 472 includes one or more layers of Al, Cu, Sn, Ni, Au, Ag, Ti, TiW, W, or other suitable electrically conductive material or combination thereof. Conductive layer 472 operates as contact pads electrically connected to the circuits on active surface 470. Conductive layer 472 is formed as contact pads disposed side-by-side a first distance from the edge of semiconductor die 464. Alternatively, conductive layer 472 is formed as contact pads that are offset in multiple rows such that a first row of contact pads is disposed a first distance from the edge of the die, and a second row of contact pads alternating with the first row is disposed a second distance from the edge of the die. A plurality of wire bonds 474 is formed between contact pads 472 of semiconductor die 464 and conductive layer 156 of substrate 150. Wire bonds 474 electrically connect semiconductor die 464 to conductive layer 156.

Semiconductor die 464 is disposed over semiconductor die 164. A die attach adhesive 462 is deposited over either back surface 168 of semiconductor die 164 or back surface 468 of semiconductor die 464 prior to mounting semiconductor die 464. Adhesive 462 can include epoxy resin, thermoplastic resin, acrylate monomer, a hardening accelerator, organic filler, silica filler, or polymer filler. Adhesive 462 facilities and strengthens the attachment of semiconductor die 464 to semiconductor die 164.

An encapsulant 476 is deposited semiconductor die 464, wire bonds 474, semiconductor die 164, and substrate 150 to form a reconstituted wafer, similar to reconstituted wafer 178. The reconstituted wafer is singulated into individual semiconductor units 466. The semiconductor units 466 are disposed over a carrier and an encapsulant 478 is deposited over the semiconductor units 466 and carrier to form a reconstituted wafer, similar to wafer 196. A backgrinding operation is performed to thin the reconstituted wafer and leave a portion of encapsulant 478 over surface 477 of encapsulant 476. Alternatively, encapsulant 478 may be completely removed from over surface 477 of encapsulant 476. Build-up interconnect structure 216 is then formed over a footprint of semiconductor unit 466. Conductive layer 210 of build-up interconnect structure 216 is formed to include a plurality of dummy contact pads 210a in addition to live contact pads 210b. After forming build-up interconnect structure 216, the reconstituted wafer is singulated into individual semiconductor packages 461. The singulation process removes encapsulant 478 from over side surfaces 479 of semiconductor units 466. Alternatively, a portion of encapsulant 478 remains over side surfaces 479, similar to encapsulant 198 in FIG. 4a.

After singulation, semiconductor packages 461 are disposed over reconstituted wafer 336, which is formed as shown in FIGS. 11a-11h. Conductive layer 310 of modular interconnect unit 320 includes a plurality of dummy contact pads 310a in addition to live contact pads 310b. A plurality of dummy bumps 214a is formed between dummy contact pads 210a and 310a. A plurality of live bumps 214b is formed between live contact pads 210b and 310b. Semiconductor die 164 and 464 are electrically connected to conductive vias 308 via live bumps 214b and live contacts pads 210b and 310b. Dummy bumps 214a and dummy contact pads 210a and 310a increase the reliability of PoP semiconductor device 460 by increasing the mechanical bonding strength between top semiconductor package 461 and modular interconnect units 320. In one embodiment, dummy contact pads 310a are formed in a row running along the outer edges of modular interconnect units 320 distal to semiconductor die 324, in a row along the inner edges of modular interconnect units 320 proximate to semiconductor die 324, and at the four corners of modular interconnect units 320, similar to the layout shown in FIG. 16b. Conductive layer 314 of modular interconnect unit 320 may also be pattered to include a plurality of dummy contact pads 314a in addition to live contact pads 314b. Dummy contact pads 314a are formed such that the surface area of surface 306 covered by dummy contact pads 314a and live contact pads 314b is approximately equal to the surface area of surface 304 covered by dummy contact pads 310a and live contact pads 310b. Balancing the total surface area covered by dummy pads 314a and live pads 314b and the surface area covered by dummy pads 310a and live pads 310b reduces warpage of modular interconnect units 320 and increases the reliability of PoP semiconductor device 460.

Reconstituted wafer 336 with attached semiconductor packages 461 is then singulated, as shown in either FIG. 11k or 11l, into individual PoP semiconductor devices 460.

FIG. 18 shows PoP semiconductor device 460 after singulation. PoP semiconductor device 460 includes top semiconductor package 461 and a bottom semiconductor package comprised of semiconductor die 324, modular interconnect units 320, build-up interconnect structure 352, and bumps 366. Top semiconductor package 461 is electrically connected to semiconductor die 324 through modular interconnect units 320 and build-up interconnect structure 352. Top semiconductor package 461 and semiconductor die 324 are electrically connected through build-up interconnect structure 352 to bumps 366 for connection to external devices, for example a PCB. Top semiconductor package 461 includes semiconductor die 164, semiconductor die 464, substrate 150, and build-up interconnect structure 216. Build-up interconnect structure 216 is formed over substrate 150 of semiconductor unit 466. Semiconductor die 464 is electrically connected through bumps 176 and substrate 150 to build-up interconnect structure 216. Semiconductor die 464 is electrically connected through bond wires 474 and substrate 150 to build-up interconnect structure 216. Conductive layer 210 of build-up interconnect structure 216 extends horizontally along surface 162 of substrate 150 to laterally redistribute the electrical interconnect to conductive layer 160 of substrate 150. Conductive layer 210 is patterned such that the location and pitch of live bumps 214b coincide with the location and pitch of exposed live contact pads 310b, and such that the location and pitch of dummy bumps 214a coincide with the location and pitch of exposed dummy contact pads 310a. Forming an RDL, e.g., conductive layer 210, over substrate 150 provides greater routing design flexibility and increases the functionality and integration compatibility of top semiconductor package 461 as conductive layer 210 can be patterned to match any bottom package, i.e., conductive layer 210 can patterned so that bumps 214 will align with any bottom package contact pad pattern or pitch.

In addition, elements that would otherwise be included in a backside interconnect structure or RDL formed over the bottom package of PoP semiconductor device 460, i.e., over surface 328 of semiconductor die 324 and conductive layer 310 of modular interconnect units 320, can be integrated as part of build-up interconnect structure 216 to simplify manufacturing and eliminate a need to form both front side and backside interconnects or RDLs over semiconductor die 324. Forming build-up interconnect structure 216 as a component of top semiconductor package 461, as opposed to forming RDL over both sides of semiconductor die 324, reduces the number of manufacturing steps taking place over reconstituted wafer 336. Reducing the number of manufacturing steps, i.e., insulating layer and conductive layer fabrication cycles, performed over reconstituted wafer 336 decreases the amount of thermal stress placed on reconstituted wafer 336 and prevents warpage. Accordingly, forming build-up interconnect structure 216 as a component of top semiconductor package 461 decreases manufacturing time while increasing the design flexibility and reliability of PoP semiconductor device 460.

The functionality of semiconductor unit 466 is tested prior to incorporation into top package 461 to ensure that only known good semiconductor units 466 are used to form top packages 461. Top semiconductor package 461 is tested prior to mounting top semiconductor package 461 to reconstituted wafer 336. Thus, only known good top packages 461 are attached to reconstituted wafer 336. Finally, the functionality of semiconductor die 324, modular interconnect units 320, and build-up interconnect structure 352 is tested prior to mounting top packages 461 thus ensuring that top packages 461 are mounted to only known good bottom packages. Using only known good components to fabricate PoP semiconductor device 460 prevents manufacturing time and materials from being wasted fabricating a defective device. Thus, the yield of reliable PoP semiconductor devices 460 is increased and overall cost per unit is reduced.

Figure 19:
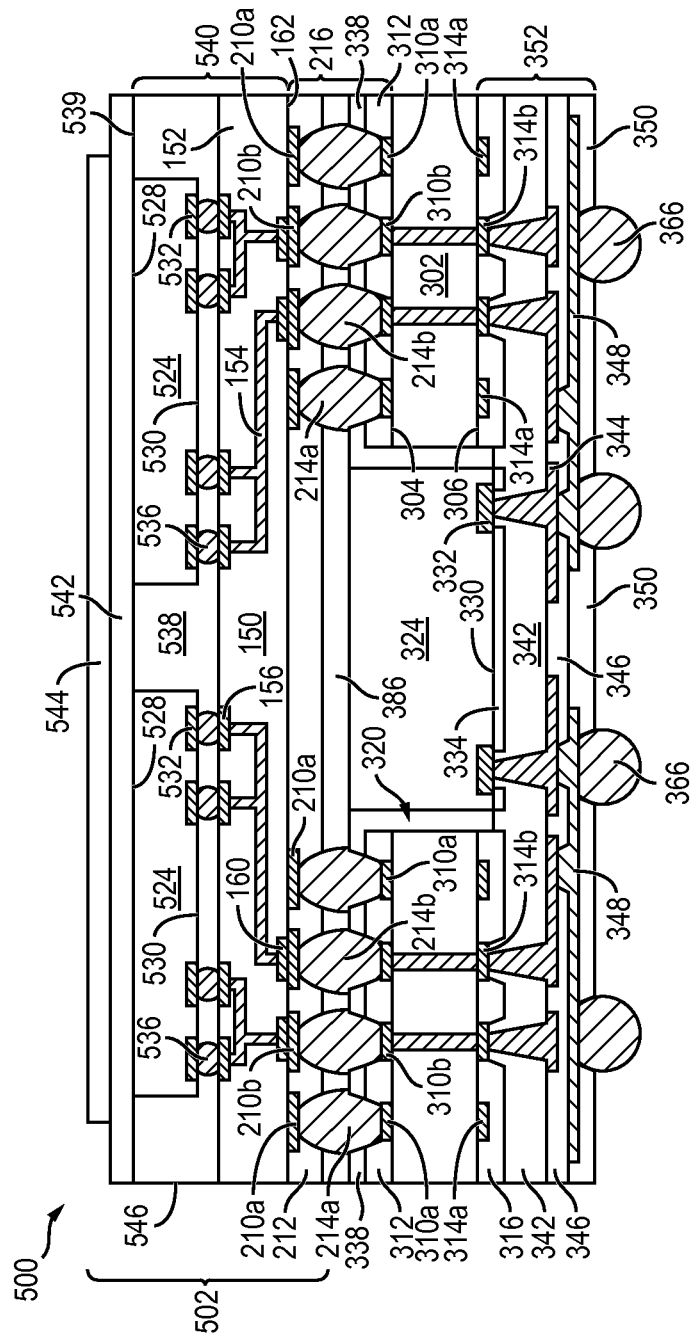
FIG. 19 illustrates a PoP semiconductor device having a top semiconductor package with multiple semiconductor die and a heat spreader.

FIG. 19 illustrates, in relation to FIG. 1, a PoP semiconductor device 500, similar to PoP semiconductor device 410 in FIG. 16a. PoP semiconductor device 500 includes a top semiconductor package 502 and a bottom semiconductor package comprised of semiconductor die 324, modular interconnect units 320, build-up interconnect structure 352, and bumps 366. Top semiconductor package 502 is disposed over semiconductor die 324 and electrically connected to modular interconnect units 320. Top semiconductor package 502 includes two semiconductor die 524. Semiconductor die 524 have a back or non-active surface 528 and an active surface 530 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 530 to implement analog circuits or digital circuits, such as DSP, ASIC, MEMS, memory, or other signal processing circuit. In one embodiment, active region 530 contains a MEMS, such as an accelerometer, gyroscope, strain gauge, microphone, or other sensor responsive to various external stimuli. Semiconductor die 524 may also contain IPDs, such as inductors, capacitors, and resistors, for RF signal processing.

An electrically conductive layer 532 is formed over active surface 530 using PVD, CVD, electrolytic plating, electroless plating process, or other suitable metal deposition process. Conductive layer 532 includes one or more layers of Al, Cu, Sn, Ni, Au, Ag, Ti, TiW, W, or other suitable electrically conductive material or combination thereof. Conductive layer 532 operates as contact pads electrically connected to the circuits on active surface 530. Conductive layer 532 is formed as contact pads disposed side-by-side a first distance from the edge of semiconductor die 524. Alternatively, conductive layer 532 is formed as contact pads that are offset in multiple rows such that a first row of contact pads is disposed a first distance from the edge of the die, and a second row of contact pads alternating with the first row is disposed a second distance from the edge of the die. A plurality of bumps 536 is formed over contact pads 532 on active surface 530. Bumps 536 electrically connect semiconductor die 524 to conductive layer 156 of substrate 150. Bumps 536 represent one type of interconnect structure that can be formed over conductive layer 532. The interconnect structure can also use bond wires, conductive paste, stud bump, micro bump, composite bump, flat eutectic metal bonding pads, or other electrical interconnect. In one embodiment, an optional insulating or protection layer, similar to insulating layer 134, is formed over active surface 530 and contact pads 532, and includes a plurality of openings formed over and exposing contact pads 532.

Semiconductor die 524 are disposed side-by-side or adjacent to one another over substrate 150. In other words, a first semiconductor die 524 is disposed in a peripheral region of a second semiconductor die 524 over substrate 150. An encapsulant 538 is deposited semiconductor die 524 and substrate 150 to form a reconstituted wafer, similar to reconstituted wafer 178. A backgrinding operation is performed to remove encapsulant 538 from over back surface 528 of semiconductor die 524. After backgrinding, a surface 539 of encapsulant 538 is coplanar with back surface 528 of semiconductor die 524. The backgrinding operation may also remove a portion of semiconductor die 524 from back surfaces 528 to further thin the reconstituted wafer. Alternatively, a portion of encapsulant 538 may remain over back surface 328 after backgrinding. The reconstituted wafer is singulated into individual semiconductor units 540. The semiconductor units 540 are disposed over a carrier and an encapsulant, similar to encapsulant 198, is deposited over the semiconductor units 540 and carrier to form a reconstituted wafer, similar to wafer 196. A backgrinding operation is performed to thin the reconstituted wafer and remove the encapsulant from over surface 539 of encapsulant 538 and surface 528 of semiconductor die 524. Alternatively, a portion of the encapsulant may be remain over surface 539 of encapsulant 538 and surface 528 of semiconductor die 524, similar to encapsulant 198 in FIG. 3f. Build-up interconnect structure 216 is then formed over a footprint of semiconductor unit 540. Conductive layer 210 of build-up interconnect structure 216 is formed to include a plurality of dummy contact pads 210a and live contact pads 210b.

A TIM 542 is deposited over surface 539 of encapsulant 538 and surface 528 of semiconductor die 524. TIM 542 is a thermal epoxy, thermal epoxy resin, thermal conductive paste, aluminum oxide, zinc oxide, boron nitride, pulverized silver, or thermal grease. A heat spreader or heat sink 544 is positioned over and mounted to TIM 542. Heat spreader 544 can be Cu, Al, or other material with high thermal conductivity (60 W/m·K or greater). Alternatively, TIM 542 can be disposed on the surface of heat spreader 544 prior to mounting heat spreader 544, as shown in FIG. 8c. Heat spreader 544 is mounted to a central area of semiconductor unit 540, over back surfaces 528 of semiconductor die 524. In one embodiment, a footprint of heat spreader 544 is smaller than the footprint of semiconductor unit 540. After mounting heat spreader 544, TIM 542 is cured to attach heat spreader 544 to TIM 542 and to encapsulant 538 and semiconductor die 524.

The reconstituted wafer is then singulated into individual semiconductor packages 502. The singulation process exposes side surfaces 546 of semiconductor units 540. Alternatively, a portion of the encapsulant deposited over semiconductor units 540 may remain over side surfaces 546, similar to encapsulant 198 in FIG. 4b.

After singulation, semiconductor packages 502 are disposed over reconstituted wafer 336, which is formed as shown in FIGS. 11a-11h. Conductive layer 310 of modular interconnect unit 320 includes a plurality of dummy contact pads 310a and live contact pads 310b. A plurality of dummy bumps 214a is formed between dummy contact pads 210a of build-up interconnect structure 216 and dummy contact pads 310a of modular interconnect units 320. A plurality of live bumps 214b are formed between live contact pads 210b of build-up interconnect structure 216 and live contact pads 310b of modular interconnect units 320. Semiconductor die 524 are electrically connected to conductive vias 308 via live bumps 214b and live contacts pads 210b and 310b. Dummy bumps 214a and dummy contact pads 210a and 310a increase the reliability of PoP semiconductor device 500 by increasing the mechanical bonding strength between top semiconductor package 502 and modular interconnect units 320. In one embodiment, dummy contact pads 310a are formed in a row running along the outer edges of modular interconnect units 320 distal to semiconductor die 324, in a row along the inner edges of modular interconnect units 320 proximate to semiconductor die 324, and at the four corners of modular interconnect units 320, similar to the layout shown in FIG. 16b. Conductive layer 314 of modular interconnect unit 320 may also be patterned to include a plurality of dummy contact pads 314a, in addition to live contact pads 314b. Dummy contact pads 314a are formed such that the surface area of surface 306 covered by dummy contact pads 314a and live contact pads 314b is approximately equal to the surface area of surface 304 covered by dummy contact pads 310a and live contact pads 310b.

Balancing the total surface area covered by dummy pads 314a and live pads 314b and the surface area covered by dummy pads 310a and live pads 310b reduces warpage of modular interconnect units 320 and increases the reliability of PoP semiconductor device 500.

Reconstituted wafer 336 with attached semiconductor packages 502 is then singulated, as shown in either FIG. 11k or 11l, into individual PoP semiconductor devices 500.

FIG. 19 shows PoP semiconductor device 500 after singulation. PoP semiconductor device 500 includes top semiconductor package 502 and a bottom semiconductor package comprised of semiconductor die 324, modular interconnect units 320, build-up interconnect structure 352, and bumps 366. Top semiconductor package 502 is electrically connected to semiconductor die 324 through modular interconnect units 320 and build-up interconnect structure 352. Top semiconductor package 502 and semiconductor die 324 are electrically connected through build-up interconnect structure 352 to bumps 366 for connection to external devices, for example a PCB. Top semiconductor package 502 includes semiconductor die 524, substrate 150, and build-up interconnect structure 216. Build-up interconnect structure 216 is formed over substrate 150 of semiconductor unit 540. Semiconductor die 524 are electrically connected through bumps 536 and substrate 150 to build-up interconnect structure 216. Conductive layer 210 of build-up interconnect structure 216 extends horizontally along surface 162 of substrate 150 to laterally redistribute the electrical interconnect to conductive layer 160 of substrate 150. Conductive layer 210 is patterned such that the location and pitch of live bumps 214b coincide with the location and pitch of exposed live contact pads 310b, and such that the location and pitch of dummy bumps 214a coincide with the location and pitch of exposed dummy contact pads 310a. Forming an RDL, e.g., conductive layer 210, over substrate 150 provides greater routing design flexibility and increases the functionality and integration compatibility of top semiconductor package 502 as conductive layer 210 can be patterned to match any bottom package, i.e., conductive layer 210 can patterned so that bumps 214 will align with any bottom package contact pad pattern or pitch.

In addition, elements that would otherwise be included in a backside interconnect structure or RDL formed over the bottom package of PoP semiconductor device 500, i.e., over surface 328 of semiconductor die 324 and conductive layer 310 of modular interconnect units 320, can be integrated as part of build-up interconnect structure 216 to simplify manufacturing and eliminate a need to form both front side and backside interconnects or RDLs over semiconductor die 324. Forming build-up interconnect structure 216 as a component of top semiconductor package 502, as opposed to forming RDL over both sides of semiconductor die 324, reduces the number of manufacturing steps taking place over reconstituted wafer 336. Reducing the number of manufacturing steps, i.e., insulating layer and conductive layer fabrication cycles, performed over reconstituted wafer 336 decreases the amount of thermal stress placed on reconstituted wafer 336 and prevents warpage. Accordingly, forming build-up interconnect structure 216 as a component of top semiconductor package 502 decreases manufacturing time while increasing the design flexibility and reliability of PoP semiconductor device 500.

Semiconductor units 540 are tested prior to incorporation into top package 502 to ensure only known good semiconductor units 540 are used to form top packages 502. Top semiconductor package 502 is tested prior to mounting top semiconductor package 502 to reconstituted wafer 336. Thus, only known good top packages 502 are attached to reconstituted wafer 336. Finally, the functionality of semiconductor die 324, modular interconnect units 320, and build-up interconnect structure 352 is tested prior to mounting top packages 502 thus ensuring that top packages 502 are mounted to only known good bottom packages. Using only known good components to fabricate PoP semiconductor device 500 prevents manufacturing time and materials from being wasted fabricating a defective device. Thus, the yield of reliable PoP semiconductor devices 500 is increased and overall cost per unit is reduced.

Figure 20E:
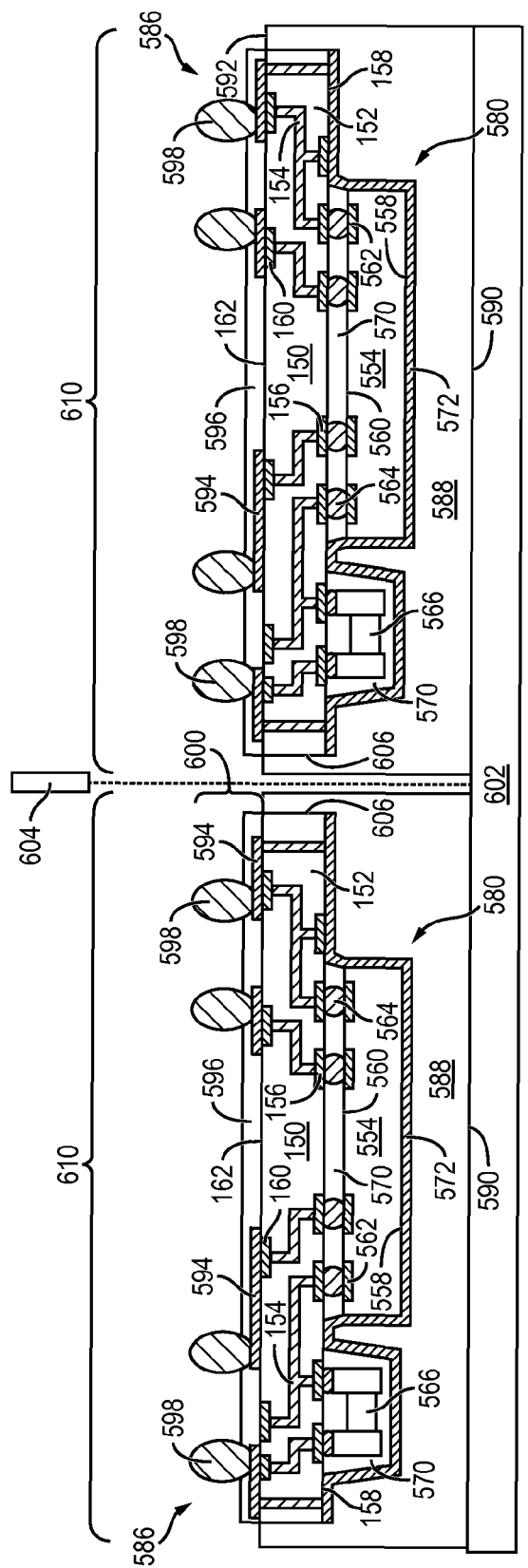

FIGS. 20a-20h illustrate, in relation to FIG. 1, a method of making a PoP semiconductor device having a shielding layer formed over the semiconductor components within the top semiconductor package. FIG. 20a shows a portion of substrate panel 150, from FIG. 3a, with conductive layers 154, 156, and 160 providing vertical and horizontal conduction paths through insulating material 152. In one embodiment, a portion of at least one of the conductive layers 154, 156, or 160 of substrate 150 is designed to function as a grounding layer or ground plane within substrate 150.

Semiconductor die 554, as singulated from a wafer similar to FIG. 2a, are disposed over substrate 150 using, for example, a pick and place operation. Semiconductor die 554 have a back or non-active surface 558 and an active surface 560 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 560 to implement analog circuits or digital circuits, such as DSP, ASIC, MEMS, memory, or other signal processing circuit. In one embodiment, active region 560 contains a MEMS, such as an accelerometer, gyroscope, strain gauge, microphone, or other sensor responsive to various external stimuli. Semiconductor die 554 may also contain IPDs, such as inductors, capacitors, and resistors, for RF signal processing.

An electrically conductive layer 562 is formed over active surface 560 using PVD, CVD, electrolytic plating, electroless plating process, or other suitable metal deposition process. Conductive layer 562 includes one or more layers of Al, Cu, Sn, Ni, Au, Ag, Ti, TiW, W, or other suitable electrically conductive material or combination thereof. Conductive layer 562 operates as contact pads electrically connected to the circuits on active surface 560. Conductive layer 562 is formed as contact pads disposed side-by-side a first distance from the edge of semiconductor die 554. Alternatively, conductive layer 562 is formed as contact pads that are offset in multiple rows such that a first row of contact pads is disposed a first distance from the edge of the die, and a second row of contact pads alternating with the first row is disposed a second distance from the edge of the die. A plurality of bumps 564 is formed over contact pads 562 on active surface 560. Bumps 564 electrically connect semiconductor die 554 to conductive layer 156 of substrate 150. Bumps 564 represent one type of interconnect structure that can be formed over contact pads 562. The interconnect structure can also use bond wires, conductive paste, stud bump, micro bump, composite bump, flat eutectic metal bonding pads, or other electrical interconnect. In one embodiment, an optional insulating or protection layer, similar to insulating layer 134, is formed over active surface 560 and contact pads 562, and includes a plurality of openings exposing contact pads 562 for connection to bumps 564.

A plurality of discrete devices 566 is disposed over substrate 150 in a peripheral region of semiconductor die 554. Discrete device 566 may include a filter, inductor, resistor, capacitor, small signal transistor, or other discrete semiconductor device. Discrete devices 566 are adjacent to semiconductor die 554 and are electrically connected to conductive layer 156 of substrate 150. Discrete devices 566 and semiconductor die 554 mounted to substrate 150 form a reconstituted wafer or panel 568.

An underfill material is 570 is deposited over discrete devices 566 and between discrete devices 566 and surface 158 of substrate 150 and between semiconductor die 554 and surface 158 of substrate 150. Underfill 570 is deposited using a paste printing, jet dispense, compressive molding, transfer molding, liquid encapsulant molding, vacuum lamination, spin coating, mold underfill, or other suitable application process. Underfill 570 can be epoxy, epoxy-resin adhesive material, polymeric materials, films, or other non-conductive materials. Underfill 570 is non-conductive and protects discrete devices 566 and bumps 564 of semiconductor die 554 from electrical shorts and leakage. Underfill 570 also environmentally protects discrete devices 566 and active surface 560 of semiconductor die 554 from external elements and contaminants. Underfill 570 aids in the attachment and securement of discrete devices 566 and semiconductor die 554 to substrate 150. Alternatively, underfill material 570 is deposited between semiconductor die 554 and substrate 150 and an insulating polymer material is dispensed over passive devices 566.

An electrically conductive layer 572 is conformally deposited over discrete devices 566 and semiconductor die 554 using a patterning and metal deposition process such as sputtering, sputtering followed by electroplating, spray coating with sintering, PVD, CVD, or other suitable metal deposition process. Conductive layer 572 operates as a shielding layer to reduce the effects of EMI and RFI. Shielding layer 572 can be one or more layers of Al, Cu, Sn, Ni, Au, Ag, Ti, TiW, W, SS, ferrite or carbonyl iron, nickel silver, low-carbon steel, silicon-iron steel, foil, conductive resin, conductive paste, and other metals and composites capable of blocking or absorbing EMI, RFI, and other inter-device interference. In one embodiment, shielding layer 572 is formed by depositing a Ti/Cu/SS layer over discrete devices 566 and semiconductor die 554. In another embodiment, shielding layer 572 is formed by depositing a Ti/Cu/Ni layer over discrete devices 566 and semiconductor die 554. Shielding layer 572 is electrically connected to conductive layers 156 and 154 of substrate 150. In one embodiment, shielding layer 572 is electrically connected to a ground plane formed within substrate 150.

In FIG. 20b, reconstituted wafer 568 is singulated into individual semiconductor units 580 using a saw blade or laser cutting tool 574. Each semiconductor unit 580 includes at least one semiconductor die 554 and discrete device 566 mounted to substrate 150. The connectivity and functionality of semiconductor units 580 can be tested either before or after singulation.

FIG. 20c shows a cross-sectional view of a portion of a carrier or temporary substrate 582 containing sacrificial base material such as silicon, polymer, beryllium oxide, glass, or other suitable low-cost, rigid material for structural support. An interface layer or double-sided tape 584 is formed over carrier 582 as a temporary adhesive bonding film, etch-stop layer, or thermal release layer.

Semiconductor units 580 are disposed over carrier 582 using, for example, a pick and place operation with substrate 150 oriented toward interface layer 584. Semiconductor units 580 mounted to interface layer 584 of carrier 582 form a reconstituted wafer or panel 586.

An encapsulant or molding compound 588 is deposited over semiconductor units 580 and carrier 582 using a paste printing, transfer molding, liquid encapsulant molding, vacuum lamination, spin coating, or other suitable applicator. Encapsulant 588 can be polymer composite material, such as epoxy resin with filler, epoxy acrylate with filler, or polymer with proper filler. Encapsulant 588 is non-conductive and environmentally protects the semiconductor device from external elements and contaminants. A portion of encapsulant 588 may be removed from surface 590 of encapsulant 588 in an optional backgrinding to thin reconstituted wafer 586.

After depositing encapsulant 588, carrier 582 and interface layer 584 are removed by chemical etching, mechanical peeling, CMP, mechanical grinding, thermal bake, UV light, laser scanning, or wet stripping to expose surface 162 of substrate 150 and a surface 592 of encapsulant 588, as shown in FIG. 20d. Surface 592 of encapsulant 588 is coplanar with surface 162 of substrate 150.

In FIG. 20d, reconstituted wafer 586 is inverted and an electrically conductive layer or RDL 594 is formed over insulating material 152 and conductive layer 160 of substrate 150 using a patterning and metal deposition process such as printing, PVD, CVD, sputtering, electrolytic plating, and electroless plating. Conductive layer 594 can be one or more layers of Al, Cu, Sn, Ni, Au, Ag, Ti, TiW, W, or other suitable electrically conductive material. A portion of conductive layer 594 extends horizontally along surface 162 of insulating material 152 and parallel to active surface 560 of semiconductor die 554 to laterally redistribute the electrical interconnect to conductive layer 160 of substrate 150. Conductive layer 594 is formed over a footprint of substrate 150 and does not extend outside the footprint of substrate 150. In other words, a peripheral region of substrate 150 adjacent to and around substrate 150 is devoid of conductive layer 594 such that surface 592 of encapsulant 588 remains exposed from conductive layer 594. A portion of conductive layer 594 is electrically connected to conductive layer 160. Other portions of conductive layer 594 are electrically common or electrically isolated depending on the design and function of the final semiconductor package.

An insulating or passivation layer 596 is formed over insulating material 152 and conductive layer 594 using PVD, CVD, printing, spin coating, spray coating, screen printing or lamination. Insulating layer 596 can be one or more layers of $SiO_2$, $Si_3N_4$, SiON, $Ta_2O_5$, $Al_2O_3$, or other material having similar insulating and structural properties. In one embodiment, insulating layer 596 is a photosensitive dielectric polymer low-cured at less than 250° C. A portion of insulating layer 596 is removed by an etching process with a patterned photoresist layer or by LDA to form openings over and exposing conductive layer 594. In one embodiment, insulating layer 596 is formed within the footprint of substrate 150 and does not extend beyond the footprint of substrate 150. In other words, a peripheral region of substrate 150 adjacent to and around substrate 150 is devoid of insulating layer 596 such that surface 592 of encapsulant 588 remains exposed from insulating layer 596. In another embodiment, insulating layer 596 is formed continuously over insulating material 152, conductive layer 594, and surface 592 of encapsulant 588 and then a portion of insulating layer 596 over surface 592 of encapsulant 588 is removed by an etching process with a patterned photoresist layer or by LDA to expose surface 592 of encapsulant 588.

An electrically conductive bump material is deposited over conductive layer 594 using an evaporation, electrolytic plating, electroless plating, ball drop, or screen printing process. In one embodiment, the bump material is deposited with a ball drop stencil, i.e., no mask required. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 594 using a suitable attachment or bonding process. In one embodiment, the bump material is reflowed by heating the material above the material's melting point to form balls or bumps 598. In some applications, bumps 598 are reflowed a second time to improve electrical contact to conductive layer 594. In one embodiment, bumps 598 are formed over a UBM layer having a wetting layer, barrier layer, and adhesive layer. Bumps 598 can also be compression bonded or thermocompression bonded to conductive layer 594. Bumps 598 represent one type of interconnect structure that can be formed over conductive layer 594. The interconnect structure can also use bond wires, conductive paste, stud bump, micro bump, or other electrical interconnect. Laser marking can be performed before or after bump formation, or after removal of carrier 582.

Collectively, conductive layer 594, insulating layer 596, and bumps 598 constitute a build-up interconnect structure 600 formed over semiconductor unit 580. Build-up interconnect structure 600 is disposed over and within a footprint of substrate 150 such that a peripheral region around semiconductor unit 580 is devoid of interconnect structure 600, and surface 592 of encapsulant 588 remains exposed from interconnect structure 600. Build-up interconnect structure 600 may include as few as one RDL or conductive layer, such as conductive layer 594, and one insulating layer, such as insulating layer 596. Additional insulating layers and RDLs can be formed over insulating layer 596 prior to forming bumps 598, to provide additional vertical and horizontal electrical connectivity across the package according to the design and functionality of semiconductor die 554 and the final semiconductor package.

FIG. 20e shows a support carrier or dicing tape 602 disposed over surface 590 of encapsulant 588. Reconstituted wafer 586 is singulated into individual semiconductor packages 610 using a saw blade or laser cutting tool 604. Forming build-up interconnect structure 600 over the footprint of semiconductor unit 580 allows reconstituted wafer 586 to be singulated by cutting through only encapsulant 588, thereby eliminating a need to cut through build-up interconnect structure 600 and reducing a risk of damaging the layers of build-up interconnect structure 600 during singulation. Reconstituted wafer 586 is singulated such that a thin layer of encapsulant 588 remains over side surfaces 606 of semiconductor unit 580. Alternatively, reconstituted wafer 586 is singulated to completely remove encapsulant 588 from side surfaces 606.

Figure 20F:
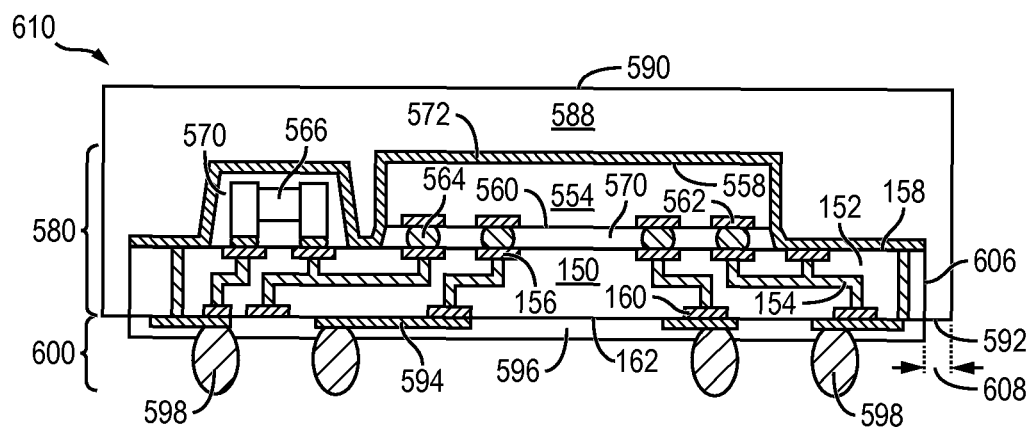

FIG. 20f shows semiconductor package 610 after singulation. Semiconductor die 554 is electrically connected through bumps 564 and conductive layers 156, 154, 160, and 594 to bumps 598 for external interconnect. Underfill material 570 provides electrical isolation and protection for discrete device 566 and semiconductor die 554. Shielding layer 572 is formed over discrete device 566 and semiconductor die 554 and electrically connected to a ground plane of substrate 150 to reduce EMI and RFI. Semiconductor units 580 are tested prior to disposal over carrier 582 to ensure that only know good semiconductor units 580 are incorporated into semiconductor package 610. Interconnect structure 600 is formed over the footprint of semiconductor unit 580 and thus forms a fan-in package. After singulation of reconstituted wafer 586, encapsulant 588 remains over side surfaces 606 of semiconductor unit 580. Encapsulant 588 provides mechanical protection and protection from degradation due to exposure to photons from light or other emissions. In one embodiment, a thickness 608 of encapsulant 588 over side surfaces 606 is less than 150 µm.

Figure 20G:
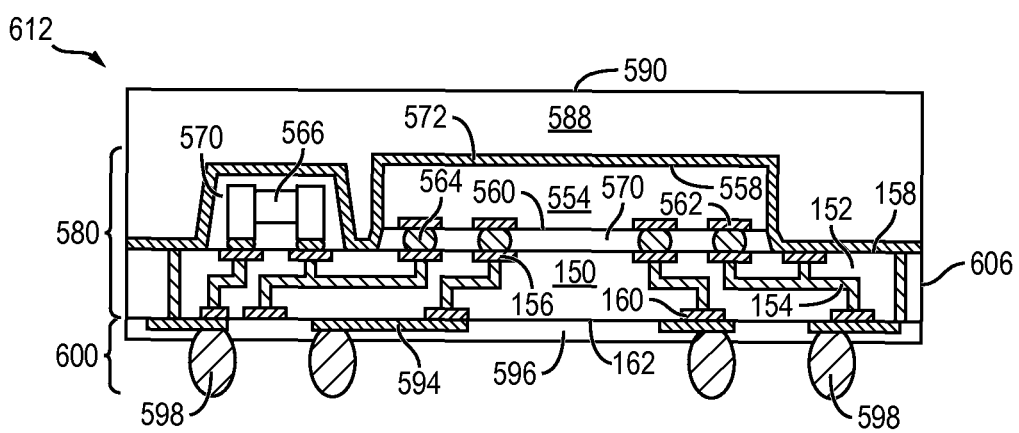

FIG. 20g shows an alternative semiconductor package 612 with exposed side surfaces 606. Encapsulant 588 is completely removed from side surfaces 606 of semiconductor unit 580 during singulation to expose surfaces 606 such that the length and width of semiconductor package 612 is the same as the length and width of semiconductor unit 580.

Figure 20H:
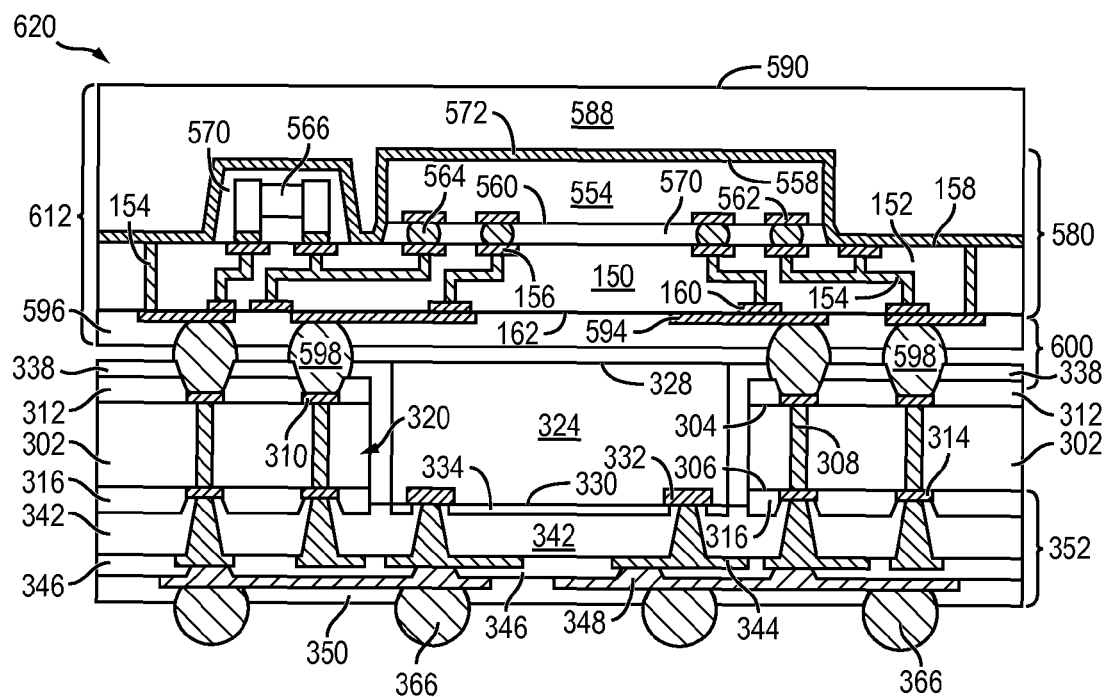

FIG. 20h shows semiconductor package 612, from FIG. 20g, disposed over a bottom semiconductor package comprised of semiconductor die 324, modular interconnect units 320, build-up interconnect structure 352, and bumps 366 to form a PoP semiconductor device 620. PoP semiconductor device 620 is formed by mounting semiconductor packages 612 to reconstituted wafer 336 with build-up interconnect structure 600 oriented toward reconstituted wafer 336. Semiconductor packages 612 are tested to be known good prior to mounting. Accordingly, only known good semiconductor packages 612 are disposed over reconstituted wafer 336. The functionality of semiconductor die 324, modular interconnect units 320, and build-up interconnect structure 352 is also tested prior to mounting semiconductor packages 612 using, for example, wafer level probing. Accordingly, semiconductor packages 612 are disposed over only known good bottom packages.

Bumps 598 of semiconductor package 612 are aligned with openings 358 and exposed contact pads 310 of modular interconnect units 320. Conductive layer 594 is patterned such that the location and pitch of bumps 598 coincide with the location and pitch of exposed contact pads 310, e.g., the pitch of both bumps 598 and exposed contact pads 310 is 300 µm. An adhesive, similar to adhesive 362 may be dispensed over surface 328 of semiconductor die 324 or over semiconductor package 612 prior to mounting semiconductor package 612.

Bumps 598 are reflowed to metallurgically and electrically connect to conductive layer 310. In some applications, bumps 598 are reflowed a second time to improve electrical contact to conductive layer 310. Bumps 598 can also be compression bonded or thermocompression bonded to conductive layer 310.

Bumps 366 are formed over conductive layer 348, as shown in FIG. 11j. Reconstituted wafer 336 with attached semiconductor packages 612 is then singulated, as shown in either FIG. 11k or FIG. 11l, into individual PoP semiconductor devices 620.

FIG. 20h shows PoP semiconductor device 620 after singulation. PoP semiconductor device 620 includes top semiconductor package 612 and a bottom semiconductor package comprised of semiconductor die 324, modular interconnect units 320, build-up interconnect structure 352, and bumps 366. Top semiconductor package 612 is electrically connected to semiconductor die 324 through modular interconnect units 320 and build-up interconnect structure 352. Top semiconductor package 612 and semiconductor die 324 are electrically connected through build-up interconnect structure 352 to bumps 366 for connection to external devices, for example a PCB.

Top semiconductor package 612 includes semiconductor unit 580 and build-up interconnect structure 600. Shielding layer 572 of semiconductor unit 580 is formed over discrete device 566 and semiconductor die 554 and electrically connected to a ground plane of substrate 150 to reduce EMI and RFI. Build-up interconnect structure 600 is formed over substrate 150 of semiconductor unit 580. Semiconductor die 554 is electrically connected through bumps 598 and substrate 150 to build-up interconnect structure 600. Conductive layer 594 of build-up interconnect structure 600 extends horizontally along surface 162 of substrate 150 to laterally redistribute the electrical interconnect to conductive layers 154 and 160 of substrate 150. Conductive layer 594 is patterned such that the location and pitch of bumps 598 coincide with the location and pitch of exposed contact pads 310. Forming an RDL, e.g., conductive layer 594, over substrate 150 provides greater routing design flexibility and increases the functionality and integration compatibility of top semiconductor package 612 as conductive layer 594 can be patterned to match any bottom package, i.e., conductive layer 594 can patterned so that bumps 598 will align with any bottom package contact pad pattern or pitch.

In addition, elements that would otherwise be included in a backside interconnect structure or RDL formed over the bottom package of PoP semiconductor device 620, i.e., over surface 328 of semiconductor die 324 and conductive layer 310 of modular interconnect units 320, can be integrated as part of build-up interconnect structure 600 to simplify manufacturing and eliminate a need to form both front side and backside interconnects or RDLs over semiconductor die 324. Forming build-up interconnect structure 600 as a component of top semiconductor package 612, as opposed to forming RDL over both sides of semiconductor die 324, reduces the number of manufacturing steps taking place over reconstituted wafer 336. Reducing the number of manufacturing steps, i.e., insulating layer and conductive layer fabrication cycles, performed over reconstituted wafer 336 decreases the amount of thermal stress placed on reconstituted wafer 336 and prevents warpage. Accordingly, forming build-up interconnect structure 600 as a component of top semiconductor package 612 decreases manufacturing time while increasing the design flexibility and reliability of PoP semiconductor device 620.

Semiconductor units 580 are tested prior to being disposed over carrier 582 to ensure that only known good semiconductor units 580 are incorporated into top packages 612. Top semiconductor package 612 is tested prior to mounting top semiconductor package 612 to reconstituted wafer 336. Thus, only known good top packages 612 are attached to reconstituted wafer 336. Finally, the functionality of semiconductor die 324, modular interconnect units 320, and build-up interconnect structure 352 is tested prior to mounting top packages 612, thus ensuring that top packages 612 are mounted to only known good bottom packages. Using only known good components to fabricate PoP semiconductor device 620 prevents manufacturing time and materials from being wasted fabricating a defective device. Thus, the yield of reliable PoP semiconductor devices 620 is increased and overall cost per unit is reduced.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    forming a first semiconductor package by,
        providing an interposer,
        disposing a first semiconductor die over the interposer;
        depositing a first encapsulant over the first semiconductor die and interposer,
        depositing a second encapsulant over the first semiconductor die and contacting a surface of the interposer and a surface of the first encapsulant, wherein the second encapsulant covers an entirety of the surface of the first encapsulant and an entirety of the surface of the interposer, and
        forming a first interconnect structure over the interposer opposite the first semiconductor die;
    forming a second semiconductor package by,
        providing a second semiconductor die,
        disposing a modular interconnect unit completely outside a footprint of the second semiconductor die,
        depositing a third encapsulant over the second semiconductor die and modular interconnect unit, and
        forming a build-up interconnect structure over the second semiconductor die, modular interconnect unit, and third encapsulant; and
    disposing the first semiconductor package over the second semiconductor package opposite the build-up interconnect structure, wherein the first interconnect structure of the first semiconductor package extends to the modular interconnect unit of the second semiconductor package.

2. The method of claim 1, further including removing the second encapsulant from a top surface of the first encapsulant opposite the interposer.

3. The method of claim 1, further including removing the second encapsulant from a side surface of the first encapsulant.

4. The method of claim 1, further including disposing a vertical interconnect structure adjacent to the second semiconductor die.

5. The method of claim 1, wherein forming the first semiconductor package further includes disposing a third semiconductor die over the interposer.

6. A semiconductor device, comprising:
    a first semiconductor package including,
        an interposer including a top surface, a bottom surface opposite the top surface, and a side surface of the interposer that extends from the top surface to the bottom surface,
        a first semiconductor die disposed on the top surface of the interposer,
        a first encapsulant deposited over the first semiconductor die and interposer, wherein a side surface of the first encapsulant is coplanar with the side surface of the interposer,
        a second encapsulant deposited over the first semiconductor die, interposer, and first encapsulant, wherein the second encapsulant is in direct physical contact with the side surface of the first encapsulant and the side surface of the interposer, and a bottom surface of the second encapsulant is coplanar with the bottom surface of the interposer, and
        a first interconnect structure formed on the bottom surface of the interposer; and
    a second semiconductor package including,
        a second semiconductor die,
        a modular interconnect unit disposed within a height of the second semiconductor die, wherein the modular interconnect unit and second semiconductor die are disposed side-by-side,
        a third encapsulant deposited over the second semiconductor die and modular interconnect unit, wherein the third encapsulant extends between a side surface of the second semiconductor die and a side surface of the modular interconnect unit, and a build-up interconnect structure formed on the second semiconductor die, modular interconnect unit, and third encapsulant, wherein a conductive layer of the build-up interconnect structure contacts the modular interconnect unit and the second semiconductor die;

wherein the first semiconductor package is disposed over the interposer opposite the first semiconductor die and the first interconnect structure extends from the interposer to the modular interconnect unit to electrically connect the first semiconductor die to the second semiconductor die through the modular interconnect unit and build-up interconnect structure.

7. The semiconductor device of claim 6, further including a second interconnect structure formed over the build-up interconnect structure opposite the first semiconductor package.

8. The semiconductor device of claim 6, wherein the first interconnect structure includes a plurality of dummy bumps that are electrically isolated from the first semiconductor die.

9. The semiconductor device of claim 6, further including a shielding layer formed over the first semiconductor die and first encapsulant, wherein the second encapsulant is deposited over the shielding layer.

10. The semiconductor device of claim 6, wherein the second encapsulant directly physically contacts the first encapsulant.

11. The semiconductor device of claim 6, wherein the modular interconnect unit includes a core substrate and a conductive via extending through the core substrate.

12. The semiconductor device of claim 6, wherein the third encapsulant extends between the modular interconnect unit and the interposer.

13. The semiconductor device of claim 12, wherein the first interconnect structure extends into an opening of the third encapsulant to contact the modular interconnect unit.

14. The semiconductor device of claim 6, wherein the side surface of the second semiconductor die and the side surface of the modular interconnect unit are substantially parallel and face each other.

15. The semiconductor device of claim 6, wherein the modular interconnect unit is completely outside a footprint of the second semiconductor die.

16. A semiconductor device, comprising:
a first semiconductor die;
a first encapsulant deposited over the first semiconductor die;
a second encapsulant deposited over the first semiconductor die and first encapsulant, wherein the second encapsulant is in direct physical contact with the first encapsulant;
an interconnect structure formed over the first semiconductor die, first encapsulant, and second encapsulant, wherein the interconnect structure includes a plurality of dummy bumps electrically isolated from the first semiconductor die and second semiconductor die; and
a second semiconductor die disposed over the interconnect structure opposite the first semiconductor die.

17. The semiconductor device of claim 16, further including a discrete device disposed in the first encapsulant.

18. The semiconductor device of claim 16, further including a modular interconnect unit disposed adjacent to the second semiconductor die, wherein the second semiconductor die is electrically connected to the first semiconductor die through the interconnect structure and modular interconnect unit.

19. A semiconductor device, comprising:
a first semiconductor package including,
an interposer,
a first semiconductor die disposed over the interposer,
a first encapsulant deposited over the interposer and first semiconductor die,
a second encapsulant deposited over the first semiconductor die and contacting a surface of the first encapsulant and a surface of the interposer, wherein the second encapsulant covers an entirety of the surface of the first encapsulant and an entirety of the surface of the interposer, and
an interconnect structure formed over the interposer opposite the first semiconductor die; and
a second semiconductor package including,
a second semiconductor die,
a first modular interconnect unit disposed completely outside a footprint of the second semiconductor die, wherein the interconnect structure extends to the first modular interconnect unit,
a third encapsulant deposited over the second semiconductor die and first modular interconnect unit, and
a build-up interconnect structure formed over the second semiconductor die, first modular interconnect unit, and third encapsulant opposite the first semiconductor package.

20. The semiconductor device of claim 19, wherein the first semiconductor package further includes a discrete component disposed over the interposer adjacent the first semiconductor die.

21. The semiconductor device of claim 19, wherein the first semiconductor package further includes a third semiconductor die disposed in the first encapsulant.

22. The semiconductor device of claim 21, wherein the second semiconductor package further includes a second modular interconnect unit, wherein the first semiconductor die is coupled to the build-up interconnect structure through the interconnect structure and first modular interconnect unit and the third semiconductor die is coupled to the build-up interconnect structure through the interconnect structure and second modular interconnect unit.

23. The semiconductor device of claim 19, wherein the interconnect structure includes a plurality of dummy bumps that are electrically isolated from the first semiconductor die.

24. The semiconductor device of claim 19, wherein the build-up interconnect structure physically contacts the second semiconductor die, first modular interconnect unit, and third encapsulant.

25. The semiconductor device of claim 19, wherein a surface of the first modular interconnect unit oriented toward the first semiconductor package is coplanar with a surface of the second semiconductor die oriented toward the first semiconductor package.

* * * * *